(12) United States Patent
Kashiwaya et al.

(10) Patent No.: US 7,587,545 B2
(45) Date of Patent: Sep. 8, 2009

(54) SHARED MEMORY DEVICE

(75) Inventors: Motofumi Kashiwaya, Tokyo (JP); Takeshi Yamazaki, Kanagawa (JP); Hiroshi Hayashi, Kanagawa (JP)

(73) Assignees: Sony Corporation, Tokyo (JP); Sony Computer Entertainment Inc., Tokyo (JP)

( * ) Notice: Subject to any disclaimer, the term of this patent is extended or adjusted under 35 U.S.C. 154(b) by 148 days.

(21) Appl. No.: 11/514,202

(22) Filed: Sep. 1, 2006

(65) Prior Publication Data
US 2007/0067579 A1 Mar. 22, 2007

(30) Foreign Application Priority Data
Sep. 5, 2005 (JP) ............................. 2005-257074

(51) Int. Cl.
*G06F 13/00* (2006.01)
(52) U.S. Cl. ........................ 710/317; 711/5; 711/106; 365/230.03
(58) Field of Classification Search ................. 710/317; 711/106, 5; 365/201, 30.03–230.062
See application file for complete search history.

(56) References Cited

U.S. PATENT DOCUMENTS

| | | | | |
|---|---|---|---|---|
| 4,600,986 A | * | 7/1986 | Scheuneman et al. | 711/169 |
| 4,633,434 A | * | 12/1986 | Scheuneman | 713/400 |
| 4,722,052 A | * | 1/1988 | Scheuneman | 710/305 |
| 4,725,987 A | * | 2/1988 | Cates | 365/220 |
| 5,243,208 A | | 9/1993 | Isomura et al. | |
| 5,835,925 A | * | 11/1998 | Kessler et al. | 711/2 |
| 5,838,931 A | * | 11/1998 | Regenold et al. | 710/306 |
| 5,956,288 A | * | 9/1999 | Bermingham et al. | 365/230.06 |
| 6,058,451 A | * | 5/2000 | Bermingham et al. | 711/106 |
| 6,134,178 A | | 10/2000 | Yamazaki et al. | |
| 6,215,497 B1 | * | 4/2001 | Leung | 345/419 |
| 6,704,238 B2 | * | 3/2004 | Izutsu et al. | 365/230.03 |
| 7,260,019 B1 | * | 8/2007 | Akaogi | 365/230.06 |
| 2002/0054519 A1 | | 5/2002 | Murai et al. | |

FOREIGN PATENT DOCUMENTS

JP 2003-524323 8/2003

OTHER PUBLICATIONS

Kushida et al. DFT Techniques for Memory Macro with Built-in ECC. Proceedings of the 2005 IEEE International Workshop on Memory Technology, Design, and Testing. IEEE. 2005.*
Aziz et al. A Near Optimal Scheduler for Switch-Memory-Switch Routers. The University of Texas at Austin. Feb. 5, 2003.*
Elling, Richard. Tales from the Trenches: The Case of the RAM Starved Cluster. Sun BluePrints(tm) OnLine. Apr. 2000.*
Extended European Search Report dated Feb. 16, 2009 for corresponding European Application No. 06 12 0150.

* cited by examiner

*Primary Examiner*—Mark Rinehart
*Assistant Examiner*—Matthew D Spittle
(74) *Attorney, Agent, or Firm*—Rader Fishman & Grauer PLLC; Christopher M. Tobin

(57) ABSTRACT

A shared memory device able to simplify interconnects up to memories, able to prevent a reduction of performance due to an increase of area and longer interconnects, and able to speed up memory access, wherein an input/output port of a processing module, memory interfaces, and memory banks are connected by connection interconnects arranged in a matrix in a first direction and a second direction above an arrangement region of a plurality of memory macros.

27 Claims, 54 Drawing Sheets

READ PRIVATE

READ PUBLIC

WRITE PRIVATE

WRITE PUBLIC

COMMON DOWN

COMMON UP

WRITE DATA BUS INTERCONNECT DIAGRAM
(HORIZONTAL INTERCONNECT AND VERTICAL INTERCONNECT JUST BENEATH PM)

READ DATA BUS
(PRIVATE VERTICAL INTERCONNECT-JUST BENEATH PM)

FIG. 36    I/F CONFIGURATION (MULTIPLE BUFFER CONFIGURATION)

ADDRESS (COMMAND)
BUS VERTICAL INTERCONNECT
(BASIC CONFIGURATION)

ADDRESS (COMMAND)
BUS VERTICAL INTERCONNECT
(MULTIPLE ISSUANCE CONFIGURATION)

WRITE DATA BUS AND SWITCHING OF HORIZONTAL TRANSFER MODE (PARTIAL)

EXAMPLE OF USE OF PARTIAL MST

SHARED MEMORY DEVICE

CROSS REFERENCE TO RELATED APPLICATION

The present invention contains subject matter related to Japanese Patent Application No. 2005-257074 filed in the Japan Patent Office on Sep. 5, 2005, the entire contents of which being incorporated herein by reference.

BACKGROUND OF THE INVENTION

1. Field of Invention

The present invention relates to a shared memory device having a plurality of memory systems including processors or other processing devices mounted thereon and sharing memories of the systems.

2. Description of the Related Art

In a system mounting a plurality of memory systems, when an architecture stressing parallel processing is employed, for example, a configuration as shown in FIG. 1 is exhibited. In the configuration of FIG. 1, since priority is given to parallel processing, logic circuits (processors) 1-1 to 1-4 and memory macros 2-1 to 2-4 are connected in one-to-one correspondence. In the configuration of FIG. 1, while logic circuits 1 and memory macros 2 are connected in one-to-one correspondence since priority is given to parallel processing, in order for logic circuits 1 to refer to data of the adjacent logics, it is necessary to use a path going through a higher device.

Therefore, in general, a configuration of directly connecting logic circuits 1 to the adjacent memories by cross bars (Xbar) 3 as shown in FIG. 2 is employed.

SUMMARY OF THE INVENTION

In the configuration of FIG. 1, as explained above, while logic circuits 1 and memory macros 2 are connected in one-to-one correspondence since priority is given to parallel processing, since the logic circuits 1 go through a higher device in order to refer to the data of the adjacent logic circuits 1, actual access is difficult.

Further, in the configuration of FIG. 2, the logic circuits 1 can refer to the data of the adjacent logic circuits 1 without going through a higher device, but there are the disadvantages that the interconnects from the logic circuits 1 to the memories 2 become very complex and a reduction of performance (reduction of frequency etc.) due to the increased area and longer interconnect is induced.

Further, as shown in FIG. 3, when a plurality of logic circuits (processors) simultaneously access the same memory, even when the memory macros do not compete, competition of memory interfaces and buses in the memories occurs, therefore simultaneous access is usually not possible.

If increasing the numbers of the memory interfaces and the buses in the memories to enable simultaneous access in order to overcome this, a reduction of performance (reduction of frequency) due to the further increased area and the increase of interconnect length along with this is induced.

It is therefore desirable in the present invention to provide a shared memory device able to simplify interconnects up to memories, able to prevent a reduction of performance due to the increase of area and the longer interconnects, and able to achieve an increase speed of the memory access.

According to an embodiment of the present invention, there is provided a shared memory device having: at least one processing module including at least one input/output port; and a plurality of memory systems accessible by the processing module; wherein each memory system includes a memory macro including a plurality of memory banks, and a memory interface connected to the processing module and each memory bank; the memory interface is arranged such that the memory interface faces the processing module while sandwiching the region of the memory macro therebetween; memory macros of the plurality of memory systems are connected in parallel in a second direction, the second direction substantially perpendicularly intersecting a first direction, the first direction being a direction connecting the processing module and the memory interface a; and the input/output port of the processing module, each memory interface, and each memory bank are connected by connection interconnects, the interconnect being arranged in the first direction and the second direction so as to shape in a matrix form in the region of the memory macros.

According to an embodiment of the present invention, there is provided a shared memory device having: a plurality of access clusters, wherein each access cluster includes at least one processing module including at least one input/output port; and a plurality of memory systems accessible by the processing module; each memory system includes a memory macro including a plurality of memory banks, and a memory interface connected to the processing module and each memory bank; the memory interface is arranged such that the memory interface faces the processing module while sandwiching the region of the memory macro therebetween; memory macros of the plurality of memory systems are connected in parallel in a second direction, the second direction substantially perpendicularly intersecting a first direction, the first direction being a direction connecting the processing module and the memory interface; the input/output port of the processing module, each memory interface, and each memory bank are connected by connection interconnects, the interconnect being arranged in the first direction and the second direction so as to shape a matrix form in the region of the memory macros, the plurality of access clusters are arranged in parallel in the second direction, and memory banks corresponding to the matrix arrangement of the plurality of memory macros are connected to each other by buses arranged in the second direction.

Preferably, the connection interconnects include command information interconnects and data interconnects laid in multiple layers.

Preferably, the data interconnects include write data interconnects and read data interconnects laid in multiple layers.

Preferably, the device further includes a sub processing module arranged at least one side of the region of the plurality of memory macros in the second direction, the sub processing module being able to selectively access at least one of predetermined memory bank of the plurality of memory macros in the second direction.

According to an embodiment of the present invention, there is provided a shared memory device having: a plurality of access clusters, wherein each access cluster includes at least one processing module including at least one input/output port; and a plurality of memory systems accessible by the processing module; each memory system includes a memory macro including a plurality of memory banks, and a memory interface connected to the processing module and each memory bank; the memory interface is arranged such that the memory interface faces the processing module while sandwiching the region of the memory macro therebetween; memory macros of the plurality of memory systems are connected in parallel in a second direction, the second direction substantially perpendicularly intersecting a first direction, the first direction being a direction connecting the processing module and the memory interface; the input/output port of the processing module, each memory interface, and each memory bank are connected by connection interconnects, the interconnect being arranged in the first direction and the second direction so as to shape a matrix form in the region of the memory macros, the plurality of access clusters are symmetrically arranged in the first direction via the interface, and memory interfaces arranged at corresponding positions are connected to each other.

Preferably, the memory systems of the plurality of access clusters share the memory interfaces.

Preferably, the shared memory interfaces include an arbitration portion for arbitrating access to another memory system.

According to an embodiment of the present invention, there is provided a shared memory device having: a plurality of access clusters, wherein each access cluster includes at least one processing module including at least one input/output port; and a plurality of memory systems accessible by the processing module; each memory system includes a memory macro including a plurality of memory banks, and a memory interface connected to the processing module and each memory bank; the memory interface is arranged such that the memory interface faces the processing module while sandwiching the region of the memory macro therebetween; memory macros of the plurality of memory systems are connected in parallel in a second direction, the second direction substantially perpendicularly intersecting a first direction, the first direction being a direction connecting the processing module and the memory interface; the input/output port of the processing module, each memory interface, and each memory bank are connected by connection interconnects, the interconnect being arranged in the first direction and the second direction so as to shape a matrix form in the region of the memory macros, the plurality of access clusters are symmetrically arranged in the first direction via the interfaces, memory interfaces arranged at corresponding positions are connected to each other, remaining access clusters are arranged in parallel in the second direction, and memory banks corresponding to the matrix arrangement of the plurality of memory macros are connected to each other by buses arranged in the second direction.

Preferably, the memory systems of the plurality of symmetrically arranged access clusters share the memory interfaces.

Further, the shared memory interfaces include an arbitration portion for arbitrating access to another memory system.

According to an embodiment of the present invention, there is provided a shared memory device having: a plurality of access cluster groups each including a plurality of access clusters; wherein the plurality of access cluster groups are connected via network interconnects, each access cluster of the plurality of access cluster groups includes at least one processing module including at least one input/output port; and a plurality of memory systems accessible by the processing module; each memory system includes a memory macro including a plurality of memory banks and a memory interface connected to the processing module and each memory bank; the memory interface is arranged such that the memory interface faces the processing module while sandwiching the region of the memory macro therebetween; memory macros of the plurality of memory systems are connected in parallel in a second direction, the second direction substantially perpendicularly intersecting a first direction, the first direction being a direction connecting the processing module and the memory interface; the input/output port of the processing module, each memory interface, and each memory bank are connected by connection interconnects, the interconnect being arranged in the first direction and the second direction so as to shape a matrix form in the region of the memory macros, the plurality of access clusters are arranged in parallel in the second direction, and memory banks corresponding to the matrix arrangement of the plurality of memory macros are connected to each other by buses arranged in the second direction.

According to an embodiment of the present invention, there is provided a shared memory device having: a plurality of access cluster groups each including a plurality of access clusters, wherein the plurality of access cluster groups are connected via network interconnects, each access cluster of the plurality of access cluster groups includes at least one processing module including at least one input/output port; and a plurality of memory systems accessible by the processing module; each memory system includes a memory macro including a plurality of memory banks, and a memory interface connected to the processing module and each memory bank; the memory interface is arranged such that the memory interface faces the processing module while sandwiching the region of the memory macro therebetween; memory macros of the plurality of memory systems are connected in parallel in a second direction, the second direction substantially perpendicularly intersecting a first direction, the first direction being a direction connecting the processing module and the memory interface; the input/output port of the processing module, each memory interface, and each memory bank are connected by connection interconnects, the interconnect being arranged in the first direction and the second direction so as to shape a matrix form in the region of the memory macros, the plurality of access clusters are symmetrically arranged in the first direction via the interface, and memory interfaces arranged at corresponding positions are connected to each other.

According to an embodiment of the present invention, there is provided a shared memory device having: a plurality of access cluster groups each including a plurality of access clusters, wherein the plurality of access cluster groups are connected via network interconnects, each access cluster of the plurality of access cluster groups includes at least one processing module including at least one input/output port; and a plurality of memory systems accessible by the processing module; each memory system includes a memory macro including a plurality of memory banks, and a memory interface connected to the processing module and each memory bank; the memory interface is arranged such that the memory interface faces the processing module while sandwiching the region of the memory macro therebetween; memory macros of the plurality of memory systems are connected in parallel in a second direction, the second direction substantially perpendicularly intersecting a first direction, the first direction being a direction connecting the processing module and the memory interface; the input/output port of the processing module, each memory interface, and each memory bank are connected by connection interconnects, the interconnect being arranged in the first direction and the second direction so as to shape in a matrix form in the region of the memory macros, the plurality of access clusters are symmetrically arranged in the first direction via the interface, memory interfaces arranged at corresponding positions are connected to each other, remaining access clusters are arranged in parallel in the second direction, and memory banks corresponding to the matrix arrangement of the plurality of memory macros are connected to each other by buses arranged in the second direction.

Preferably, each access cluster group includes a sub processing module arranged at least one side of the region of the plurality of memory macros in the second direction, the sub processing module being able to selectively access at lease one of predetermined memory bank of the plurality of memory macros in the second direction, the sub processing modules of each access cluster group are connected by network connecting.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, preferred embodiments of the present invention will be explained with reference to the drawings.

Figure 4:
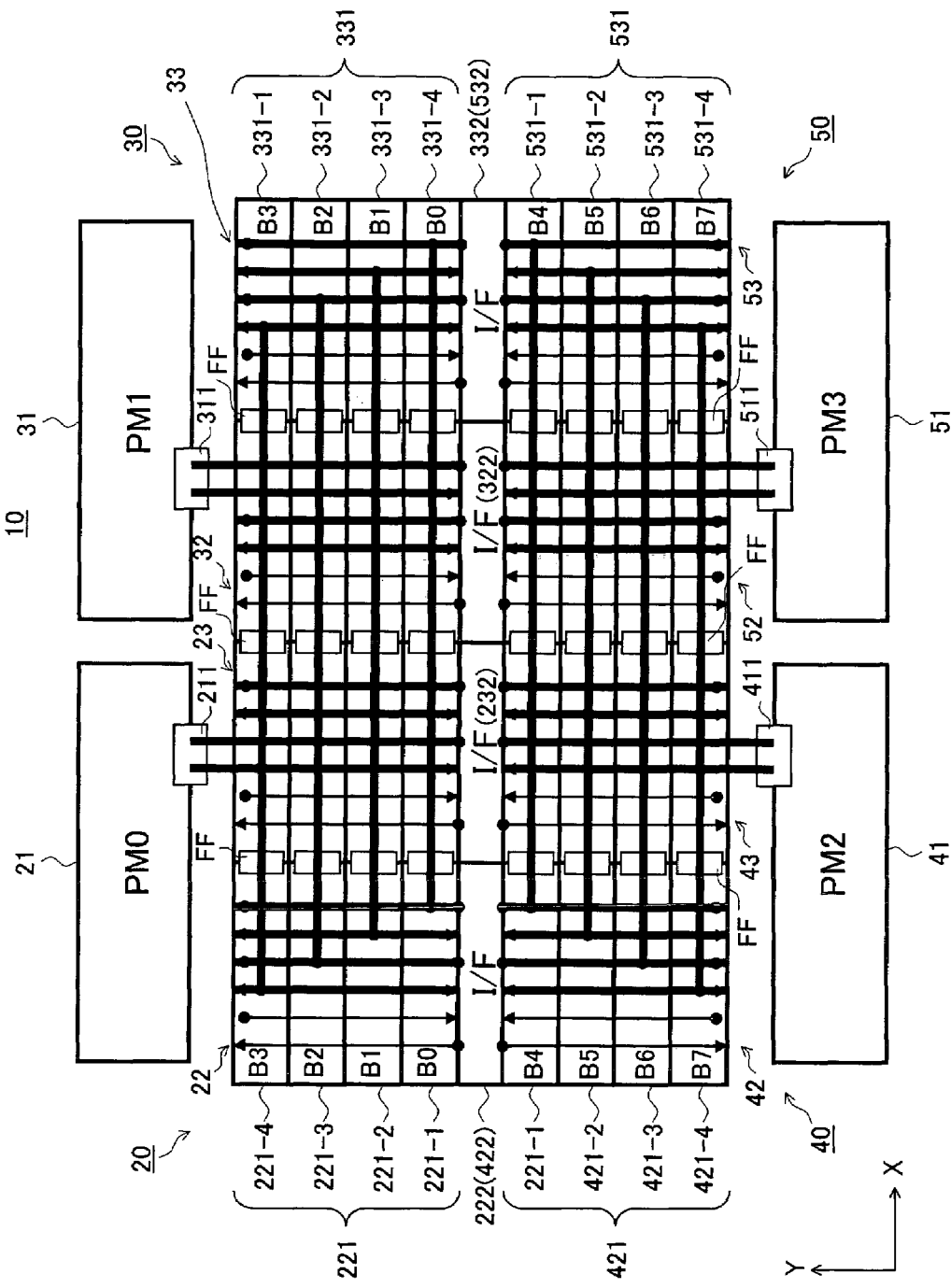
FIG. 4 is a diagram of a system configuration of a shared memory device according to a first embodiment of the present invention.

FIG. 4 is a diagram of the system configuration of a shared memory device according to a first embodiment of the present invention.

A common memory system 10 of FIG. 4 has a plurality of (four in FIG. 4) access clusters 20, 30, 40, and 50 as principal components.

The access cluster 20 has a processing module (PM0) 21 having one input/output port 211 and a plurality of (two in FIG. 4) memory systems 22 and 23 such as DRAMs or SRAMs which can be accessed by the processing module 21.

The memory system 22 is provided with a memory macro 221 including a plurality of banks 221-1 to 221-n (n=4 in the present example) arranged in one column in the Y-direction (first direction) of a Rectangular coordinate system set in FIG. 4 and a memory interface (I/F) 222 for interfacing data transfer between the banks 221-1 to 221-n of the memory macro 221 and the processing module 21 and for access control etc. to the banks 221-1 to 221-n. The memory interface 222 is arranged at a position facing the position of arrangement of the processing module 21 while sandwiching the arrangement region of the memory macro 221 therebetween.

The memory system 23 is arranged in parallel to the memory system 22 in the X-direction (second direction) of the Rectangular coordinate system set in FIG. 4. The memory system 23 is provided with a memory macro 231 including a plurality of banks 231-1 to 231-n (n=4 in the present example) arranged in one column in the Y-direction (first direction) and a memory interface (I/F) 232 for interfacing data transfer between the banks 231-1 to 231-n of the memory macro 231 and the processing module 21 and for access control etc. to the banks 231-1 to 231-n. Note that, in the figure, the notations of banks etc. of the memory macro 231 are omitted in order to avoid complication. The memory interface 232 is arranged at a position facing the position of arrangement of the processing module 21 while sandwiching the arrangement region of the memory macro 231 therebetween.

The memory macros 221 and 231 of the plurality of (two in the present example) memory systems 22 and 23 are arranged in parallel in the X-direction (second direction) substantially perpendicular to the Y-direction (first direction) constituted by the connection direction of the processing module 21 and the memory interfaces 222 and 232 arranged so as to face the position of arrangement of the input/output port 211. The banks 221-1 to 221-n of the memory macro 221 and the banks 231-1 to 231-n of the memory macro 231 are arranged in the X-direction in parallel while making the two-dimensional heights in the Y-direction the same. The connection interconnects between the banks 221-1 to 221-n of the memory macro 221 and the banks 231-1 to 231-n of the memory macro 231 arranged in parallel in the X-direction are provided with flip-flops FF as buffers.

The input/output port 211 of the processing module 21, the memory interfaces 222 and 232, and the memory banks 221-1 to 221-n and 231-1 to 231-n are connected by connection interconnects arranged in a matrix (lattice state) in the Y-direction (first direction) and the X-direction above the arrangement region of the plurality of memory macros 221 and 231.

In the example of FIG. 4, the input/output port 211 of the processing module 21 and the memory interface 232 of the memory system 23 are connected straight by a connection interconnect in the Y-direction (first direction). As connection interconnects, command information interconnects (command address interconnects) and data interconnects (write data interconnects and read data interconnects or common interconnects) are arranged in multiple layers. The connection interconnects will be explained in detail later.

The access cluster 30 has a processing module (PM1) 31 having one input/output port 311 and a plurality of (two in FIG. 4) memory systems 32 and 33 such as DRAMs or SRAMs which can be accessed by the processing module 31.

The memory system 32 is provided with a memory macro 321 including a plurality of banks 321-1 to 321-n (n=4 in the present example) arranged in one column in the Y-direction (first direction) of a Rectangular coordinate system set in FIG. 4 and a memory interface (I/F) 322 for interfacing data transfer between the banks 321-1 to 321-n of the memory macro 321 and the processing module 31 and for access control etc. to the banks 321-1 to 321-n. Note that, in the figure, notations of banks etc. of the memory macro 321 are omitted in order to avoid complication. The memory interface 322 is arranged at a position facing the position of arrangement of the processing module 31 while sandwiching the arrangement region of the memory macro 321 therebetween.

The memory system 33 is arranged in parallel to the memory system 32 in the X-direction (second direction) of the Rectangular coordinate system set in FIG. 4. The memory system 33 is provided with a memory macro 331 including a plurality of banks 331-1 to 331-n (n=4 in the present example) arranged in one column in the Y-direction (first direction) and a memory interface (I/F) 332 for interfacing data transfer between the banks 331-1 to 331-n of the memory macro 331 and the processing module 31 and for access control etc. to the banks 331-1 to 331-n. The memory interface 332 is arranged at a position facing the position of arrangement of the processing module 31 while sandwiching the arrangement region of the memory macro 331 therebetween.

The memory macros 321 and 331 of the plurality of (two in the present example) memory systems 32 and 33 are arranged in parallel in the X-direction (second direction) substantially perpendicular to the Y-direction (first direction) constituted by the connection direction of the processing module 31 and the memory interfaces 322 and 332 arranged so as to face the position of arrangement of the input/output port 311. The banks 321-1 to 321-n of the memory macro 321 and the banks 331-1 to 331-n of the memory macro 331 are arranged in the X-direction in parallel by making the two-dimensional heights in the Y-direction the same. The connection interconnects between the banks 321-1 to 321-n of the memory macro 321 and the banks 331-1 to 331-n of the memory macro 331 arranged in parallel in the X-direction are provided with flip-flops FF as buffers.

The input/output port 311 of the processing module 31, the memory interfaces 322 and 332, and the memory banks 321-1 to 321-n and 331-1 to 331-n are connected by connection interconnects arranged in a matrix state (lattice state) in the Y-direction (first direction) and the X-direction (second direction) above the arrangement region of the plurality of memory macros 321 and 331. In the example of FIG. 4, the input/output port 311 of the processing module 31 and the memory interface 322 of the memory system 32 are connected straight by a connection interconnect in the Y-direction (first direction). As connection interconnects, command information interconnects (command address interconnects) and data interconnects (write data interconnects and read data interconnects or common interconnects) are arranged in multiple layers. The connection interconnects will be explained in detail later. The access cluster 30 is arranged in parallel with the access cluster 20 in the X-direction (second direction). Memory banks corresponding to the matrix arrangement of the plurality of memory macros are connected by buses arranged in the X-direction (second direction).

Further, the banks 321-1 to 321-n of the memory macro 321 of the access cluster 30 and banks 231-1 to 231-n of the memory macro 231 of the access cluster 20 are arranged in parallel in the X-direction by making the two-dimensional heights in the Y-direction the same as each other. The connection interconnects between the banks 321-1 to 321-n of the memory macro 321 and the banks 231-1 to 231-n of the memory macro 231 arranged in parallel in the X-direction are provided with flip-flops FF as buffers.

The access cluster 40 has a processing module (PM2) 41 having one input/output port 411 and a plurality of (two in FIG. 4) memory systems 42 and 43 such as DRAMs or SRAMs which can be accessed by the processing module 41.

The memory system 42 is provided with a memory macro 421 including a plurality of banks 421-1 to 421-n (n=4 in the present example) arranged in one column in the Y-direction (first direction) of the Rectangular coordinate system set in FIG. 4 and a memory interface (I/F) 422 for interfacing data transfer between the banks 421-1 to 421-n of the memory macro 421 and the processing module 21 and for access control etc. to the banks 421-1 to 421-n. The memory interface 422 is arranged at a position facing the position of arrangement of the processing module 41 while sandwiching the arrangement region of the memory macro 421 therebetween.

The memory system 43 is arranged in parallel to the memory system 42 in the X-direction (second direction) of the Rectangular coordinate system set in FIG. 4. The memory system 43 is provided with a memory macro 431 including a plurality of banks 431-1 to 431-n (n=4 in the present example) arranged in one column in the Y-direction (first direction) and a memory interface (I/F) 432 for interfacing data transfer between the banks 431-1 to 431-n of the memory macro 431 and the processing module 41 and for access control etc. to the banks 431-1 to 2431-n. Note that, in the figure, notations of banks etc. of the memory macro 432 are omitted in order to avoid complication. The memory interface 432 is arranged at a position facing the position of arrangement of the processing module 41 while sandwiching the arrangement region of the memory macro 431 therebetween.

The memory macros 421 and 431 of the plurality of (two in the present example) memory systems 42 and 43 are arranged in parallel in the X-direction (second direction) substantially perpendicular to the Y-direction (first direction) constituted by the connection direction of the processing module 41 and the memory interfaces 422 and 432 arranged so as to face the position of arrangement of the input/output port 411. The banks 421-1 to 421-n of the memory macro 421 and the banks 431-1 to 431-n of the memory macro 431 are arranged in the X-direction in parallel by making the two-dimensional heights in the Y-direction the same. The connection interconnects between the banks 421-1 to 421-n of the memory macro 421 and the banks 431-1 to 431-n of the memory macro 431 arranged in parallel in the X-direction are provided with flip-flops FF as buffers.

The input/output port 411 of the processing module 41, the memory interfaces 422 and 432, and the memory banks 421-1 to 421-n and 431-1 to 431-n are connected by connection interconnects arranged in a matrix state (lattice state) in the Y-direction (first direction) and the X-direction (second direction) above the arrangement region of the plurality of memory macros 421 and 431. In the example of FIG. 4, the input/output port 411 of the processing module 41 and the memory interface 432 of the memory system 43 are connected straight by a connection interconnect in the Y-direction (first direction). As connection interconnects, command information interconnects (command address interconnects) and data interconnects (write data interconnects and read data interconnects or common interconnects) are arranged in multiple layers. The connection interconnects will be explained in detail later.

Then, the access cluster 20 and the access cluster 40 are symmetrically arranged via the interface in the Y-direction (first direction). Memory interfaces 222 and 422 and memory interfaces 232 and 432 arranged at positions corresponding to each other are connected. In the present embodiment, the memory systems of the symmetrically arranged plurality of access clusters 20 and 40 share memory interfaces. Specifically, the memory interface 222 of the memory system 22 and the memory interface 422 of the memory system 42 are shared with each other. In the same way, the memory interface 232 of the memory system 23 and the memory interface 432 of the memory system 43 are shared with each other. These shared memory interfaces include arbitration portions for arbitrating accesses to the other memory systems. The arbitration portions will be explained later.

The access cluster 50 has a processing module (PM3) 51 having one input/output port 511 and a plurality of (two in FIG. 4) memory systems 52 and 53 such as DRAMs or SRAMs which can be accessed by the processing module 51.

The memory system 52 is provided with a memory macro 521 including a plurality of banks 521-1 to 521-n (n=4 in the present example) arranged in one column in the Y-direction (first direction) of the Rectangular coordinate system set in FIG. 4 and a memory interface (I/F) 522 for interfacing data transfer between the banks 521-1 to 521-n of the memory macro 521 and the processing module 51 and for access control etc. to the banks 521-1 to 521-n. Note that, in the figure, notations of banks etc. of the memory macro 521 are omitted in order to avoid complication. The memory interface 522 is arranged at a position facing the position of arrangement of the processing module 51 while sandwiching the arrangement region of the memory macro 521 therebetween.

The memory system 53 is arranged in parallel to the memory system 52 in the X-direction (second direction) of the Rectangular coordinate system set in FIG. 4. The memory system 53 is provided with a memory macro 531 including a plurality of (in FIG. 4) banks 531-1 to 531-n (n=4 in the present example) arranged in one column in the Y-direction (first direction) and a memory interface (I/F) 532 for interfacing data transfer between the banks 531-1 to 531-n of the memory macro 531 and the processing module 51 and for access control etc. to the banks 531-1 to 531-n. The memory interface 532 is arranged at a position facing the position of arrangement of the processing module 51 while sandwiching the arrangement region of the memory macro 531 therebetween.

The memory macros 521 and 531 of a plurality of (two in the present example) memory systems 52 and 53 are arranged in parallel in the X-direction (second direction) substantially perpendicular to the Y-direction (first direction) constituted by the connection direction of the processing module 51 and the memory interfaces 522 and 532 arranged so as to face the position of arrangement of the input/output port 511. The banks 521-1 to 521-n of the memory macro 521 and the banks 531-1 to 531-n of the memory macro 531 are arranged in the X-direction in parallel by making two-dimensional heights in the Y-direction the same. The connection interconnects between the banks 521-1 to 521-n of the memory macro 521 and the banks 531-1 to 531-n of the memory macro 531 arranged in parallel in the X-direction are provided with flip-flops FF as buffers.

The input/output port 511 of the processing module 51, the memory interfaces 522 and 532, and the memory banks 521-1 to 521-n and 531-1 to 531-n are connected by connection interconnects arranged in a matrix state (lattice state) in the Y-direction (first direction) and the X-direction (second direction) above the arrangement region of the plurality of memory macros 521 and 531. In the example of FIG. 4, the input/output port 511 of the processing module 51 and the memory interface 522 of the memory system 52 are connected straight by a connection interconnect in the Y-direction (first direction). As connection interconnects, command information interconnects (command address interconnects) and data interconnects (write data interconnects and read data interconnects or common interconnects) are arranged in multiple layers. The connection interconnects will be explained in detail later.

The access cluster 50 is arranged in parallel with the access cluster 40 in the X-direction (second direction). Memory banks corresponding to the matrix arrangement of the plurality of memory macros are connected by buses arranged in the X-direction (second direction). Further, the banks 521-1 to 521-n of the memory macro 521 of the access cluster.50 and banks 431-1 to 431-n of the memory macro 431 of the access cluster 40 are arranged in parallel in the X-direction by making the two-dimensional heights in the Y-direction the same as each other. The connection interconnects between the banks 521-1 to 521-n of the memory macro 521 and the banks 431-1 to 431-n of the memory macro 431 arranged in parallel in the X-direction are provided with flip-flops FF as buffers. The access cluster 30 and the access cluster 50 are symmetrically arranged via the interface in the Y-direction (first direction). Memory interfaces 322 and 522 and memory interfaces 332 and 532 arranged at positions corresponding to each other are connected. In the present embodiment, the memory systems of the symmetrically arranged plurality of access clusters 30 and 50 share memory interfaces. Specifically, the memory interface 322 of the memory system 32 and the memory interface 522 of the memory system 52 are shared with each other. In the same way, the memory interface 332 of the memory system 33 and the memory interface 532 of the memory system 53 are shared with each other. These common memory interfaces include arbitration portions for arbitrating accesses to other memory systems. The arbitration portions will be explained later.

The shared memory device 10 of the present embodiment explained above is configured with the following characterizing features.

The shared memory device 10 maps a bus system by general cross bars (X-bars) on the memory as shown in FIG. 4 by utilizing the fact that the memories and logics are mounted together. In recent production technology, the number of interconnect layers has been increasing due to the increase of the size of logic circuits, but in memory circuits, even when the size increases, the number of interconnect layers does not increase much at all. For this reason, the upper interconnect layers on memories are left unused in many cases. By passing the interconnects of a bus system on a memory system by utilizing this, a bus system can be constructed with almost no increase of the area of the memory.

In the present embodiment, in order to avoid the reduction of the frequency due to the increase of the interconnect length, the buses forming the connection interconnects are formed as pipelines. Further, in order to avoid the increase of the interconnect area, the interconnects between processing modules and memory systems are not connected in one-to-one correspondence, but are made common interconnects.

The memory interface I/F of each memory system is arranged at the center in the layout in the Y-direction (first direction). This is so as to make the distance between each processing module and each memory interface I/F equal and the shortest and to thereby reduce the amount of interconnects. By arranging the memory interfaces I/F at the centers of the layouts, the internal memory resources can be effectively utilized double. This is because the internal memory resources are divided into two at the memory interfaces I/F in the Y-direction (first direction) and X-direction (second direction) configuration of the plurality of access clusters 20, 30, 40, and 50 of FIG. 4, therefore even when the same memory is achieved to be simultaneously accessed by a plurality of requests, simultaneous access is possible if to different directions from the memory interfaces I/F.

Figure 5:
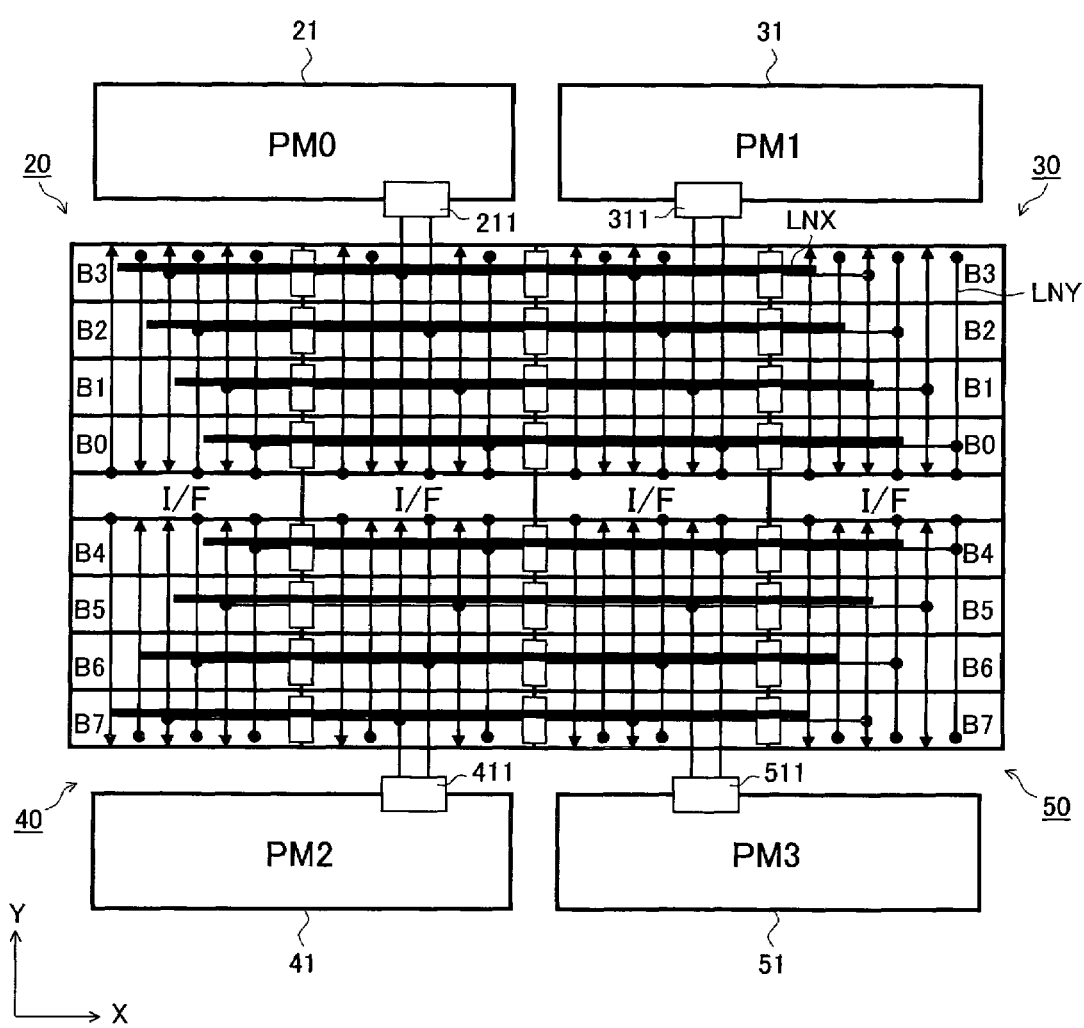
FIG. 5 is a diagram showing an example of X-direction (second direction) memory-memory transfer utilizing connection interconnects in the X-direction (second direction or horizontal direction) in FIG. 4.

In FIG. 4, the X-direction (second direction or horizontal direction) connection interconnects run vertically in the X-direction (second direction) starting from the processing modules PM (0 to 3) so as to enable access to all memory systems. Utilizing the interconnects, as indicated by the interconnects LNX in FIG. 5, it is possible to transfer data between one memory and another memory in the X-direction (second direction). The same interconnects in the X-direction (second direction) are just switched between the connection format of FIG. 4 and the connection format of FIG. 5 by the setting of the mode, therefore high speed memory-memory transfer can be achieved with almost no increase of the area. This X-direction transfer mode (horizontal transfer mode) can be deleted for applications not requiring it.

Figure 6:
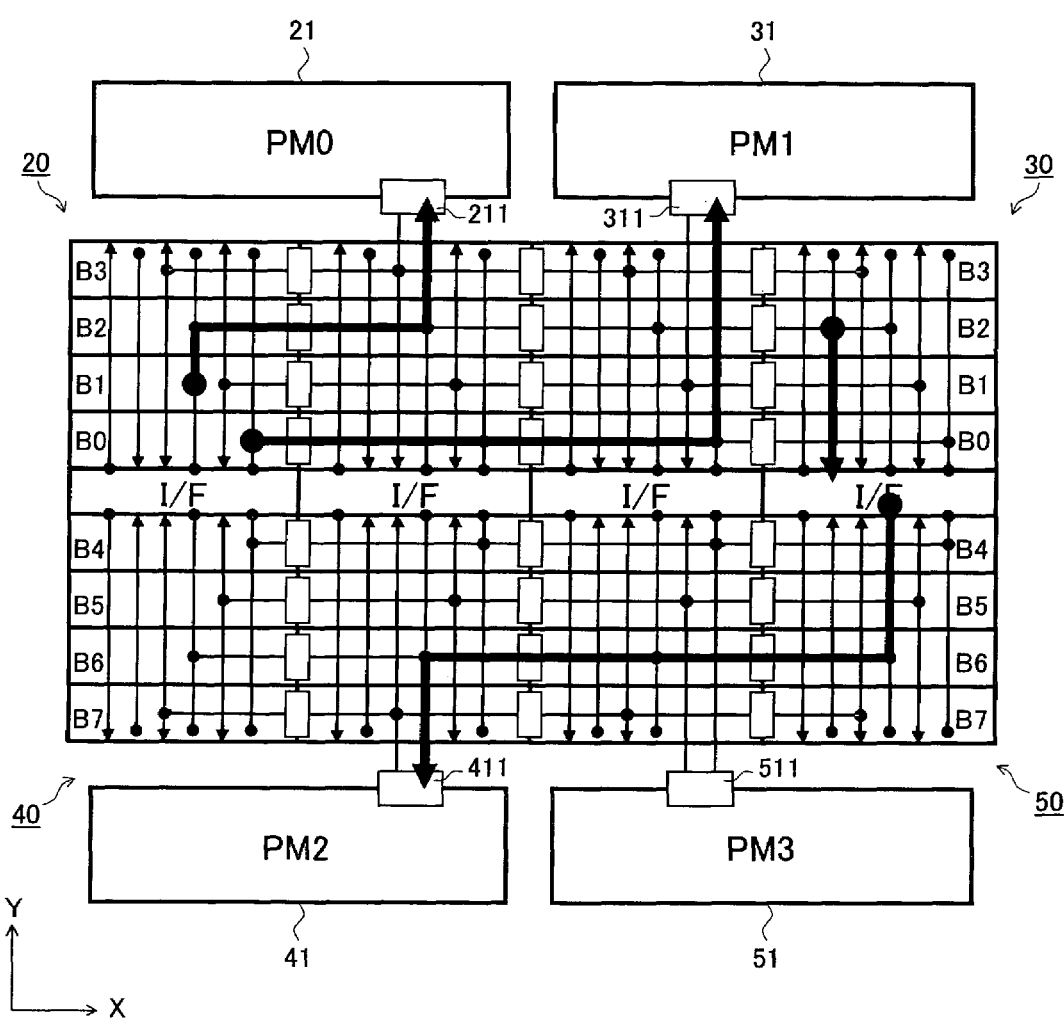
FIG. 6 is a diagram for explaining that a direct access can be made in the shared memory device of FIG. 4 so far as there is an access destination bank between a data bus and a memory interface I/F.
Figure 7:
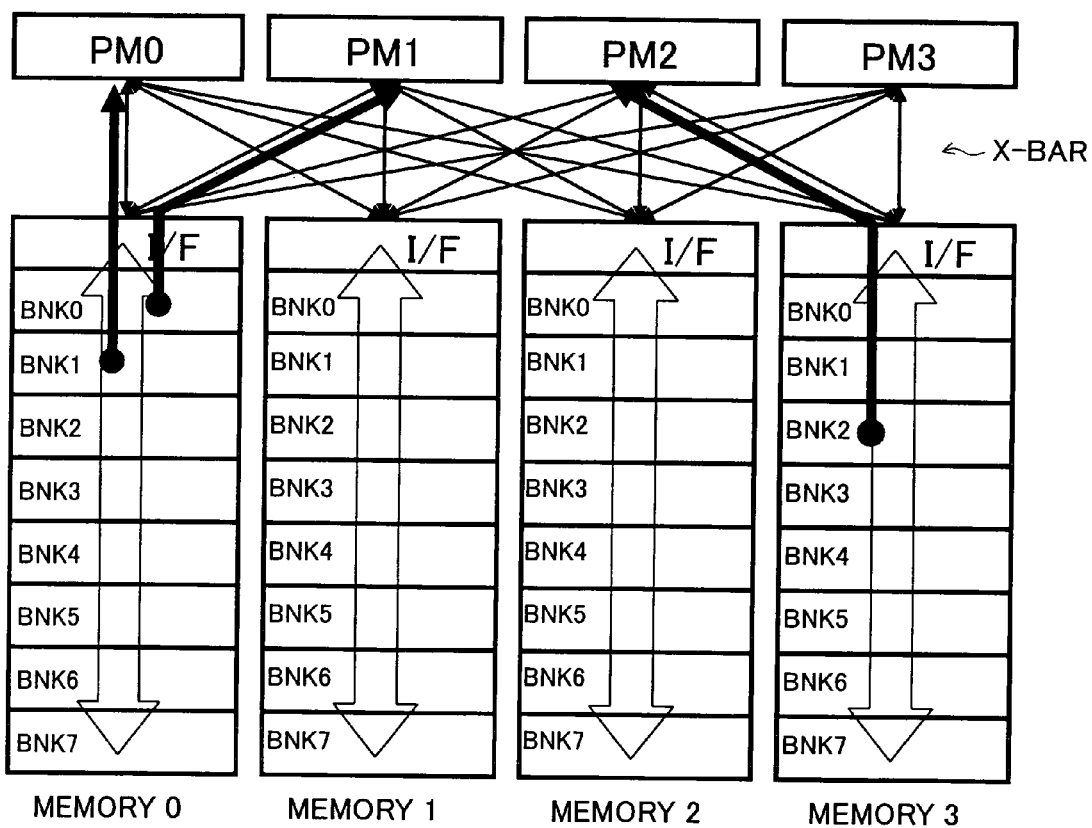
FIG. 7 is a diagram showing that access skipping the memory interface I/F in a usual X-bar system different from the access of FIG. 6.

The shared memory device 10 maps the bus system on the memory systems, therefore, as shown in FIG. 6, any access destination bank between a data bus and a memory interface I/F can be directly accessed. In the example of FIG. 6, the processing module 21 (PM0) of the access cluster 20 is accessing the bank 221-2 of the memory macro 221 at the left end, and the processing module 31 (PM1) of the access cluster 30 is accessing the bank 221-1 of the same memory macro 221. In the usual X-bar system, as shown in FIG. 7, these become accesses skipping the memory interfaces I/F. As a result, shortening of access latency can be achieved.

Figure 1:
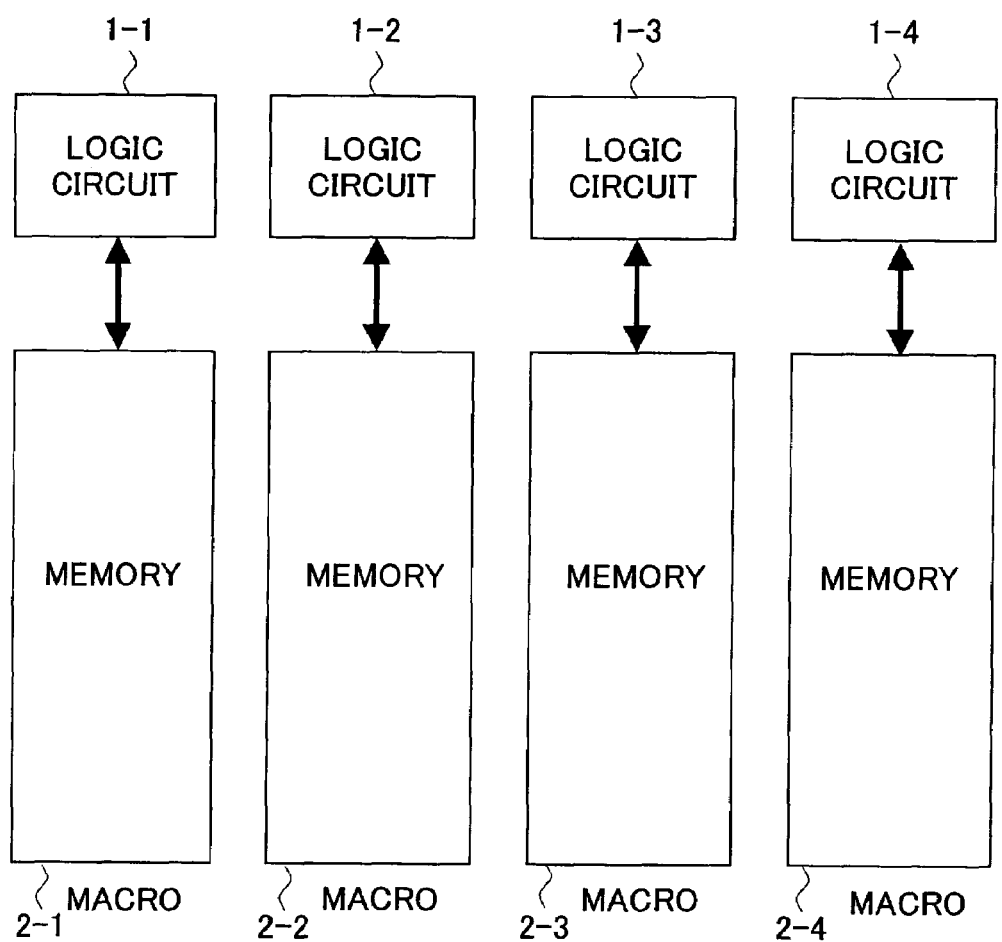
FIG. 1 is a diagram showing the general architecture of a multi-processor.
Figure 2:
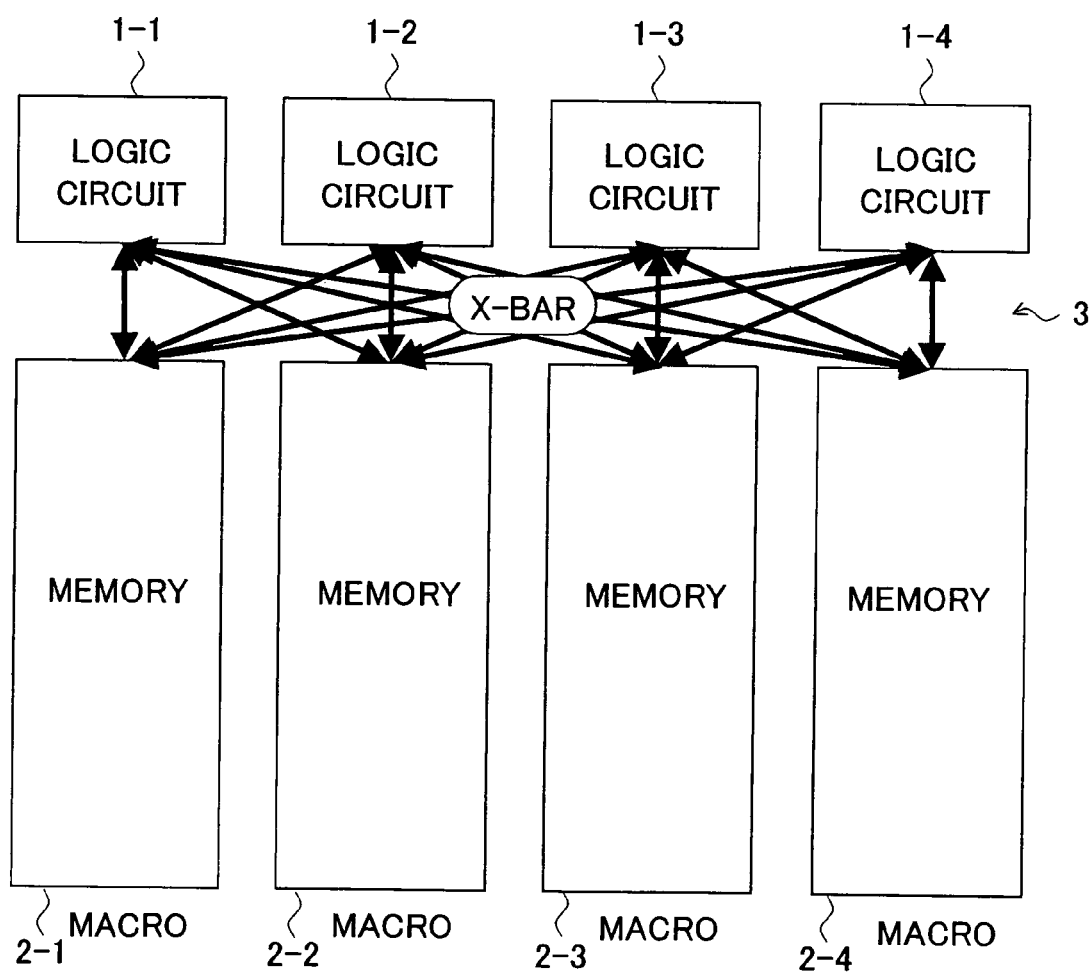
FIG. 2 is a diagram showing an architecture using cross bars.
Figure 3:
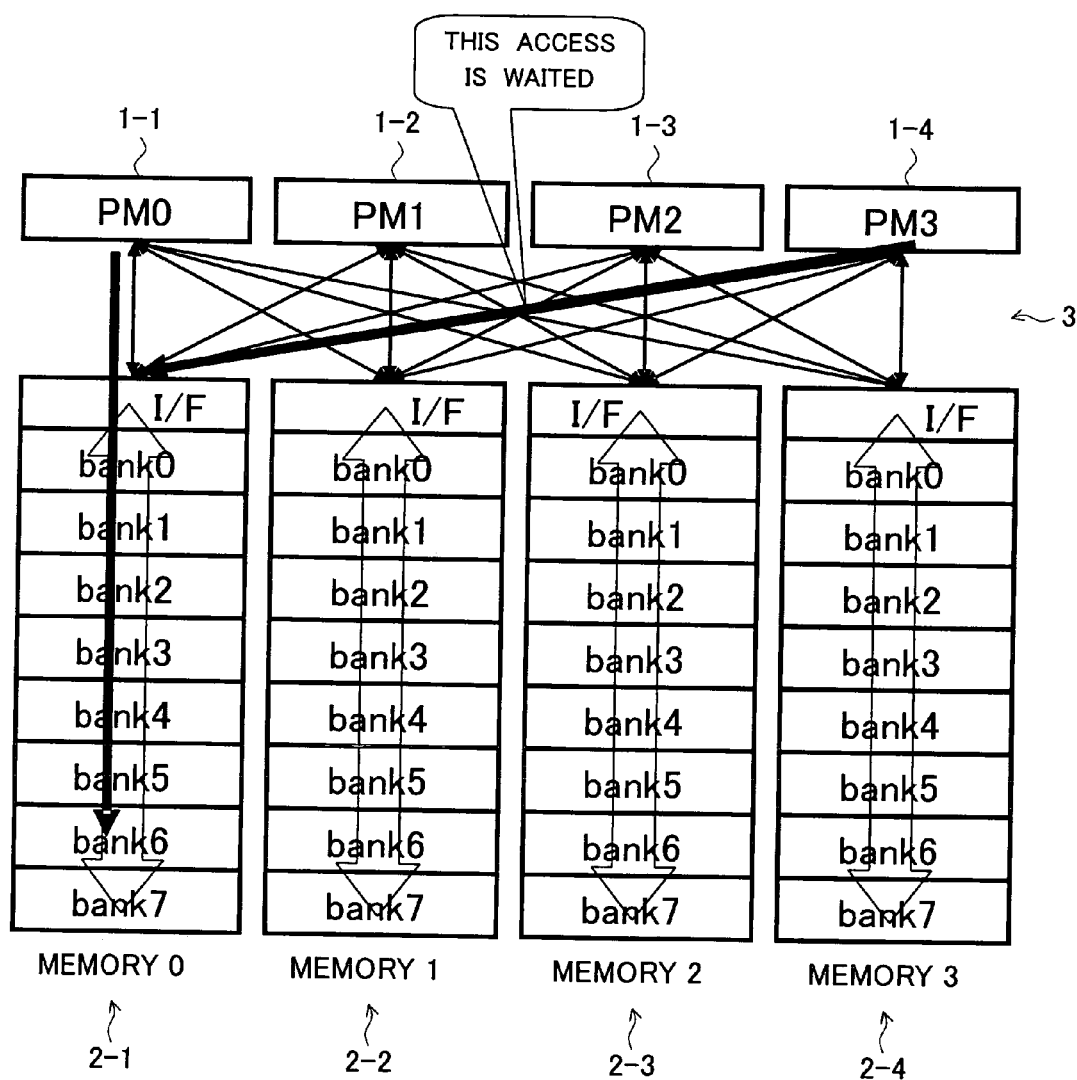
FIG. 3 is a diagram for explaining a disadvantage of a system of FIG. 2.
Figure 8:
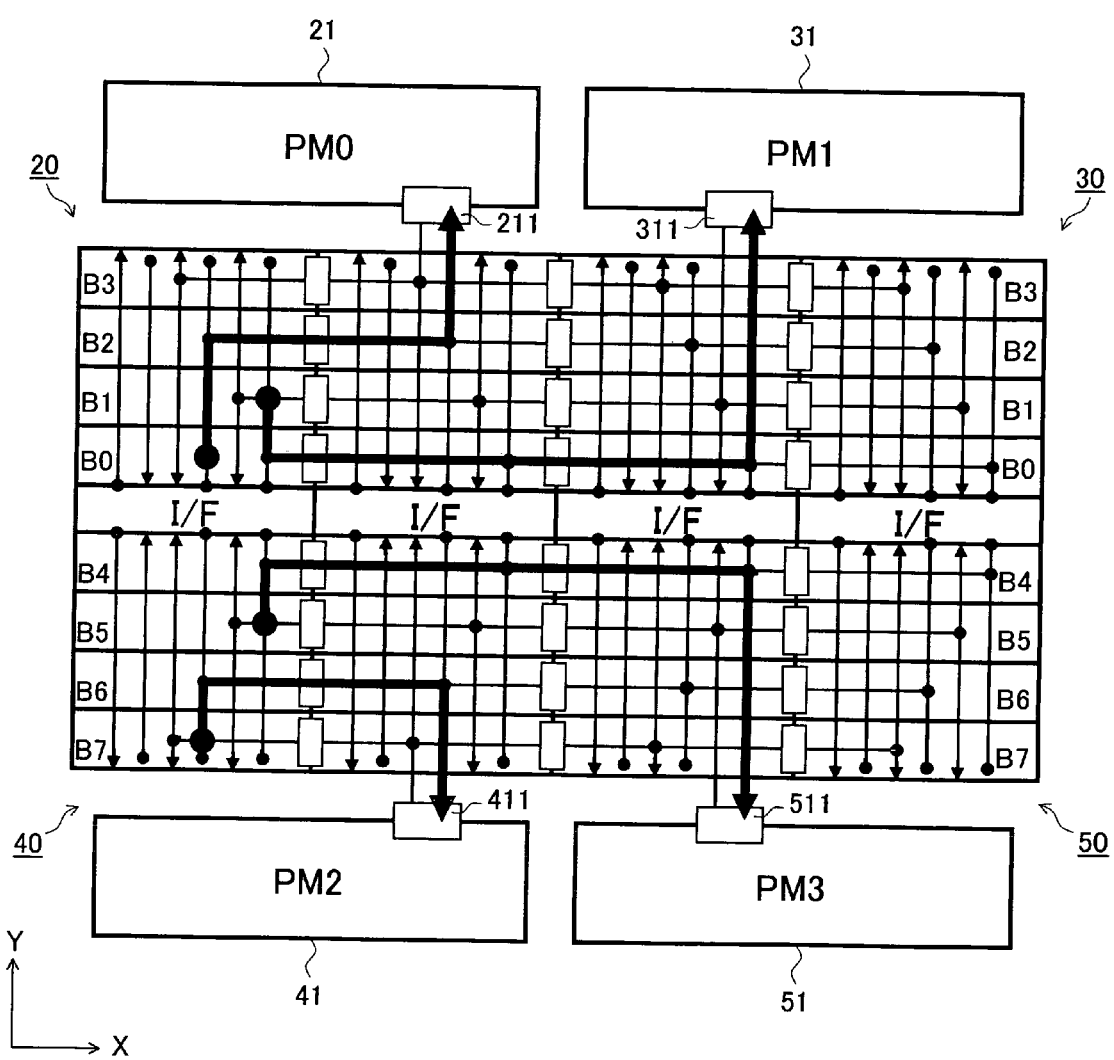
FIG. 8 is a diagram for explaining that the shared memory device of the present embodiment can improve throughput without increasing the area in comparison with simple mapping of the X-bars.
Figure 9:
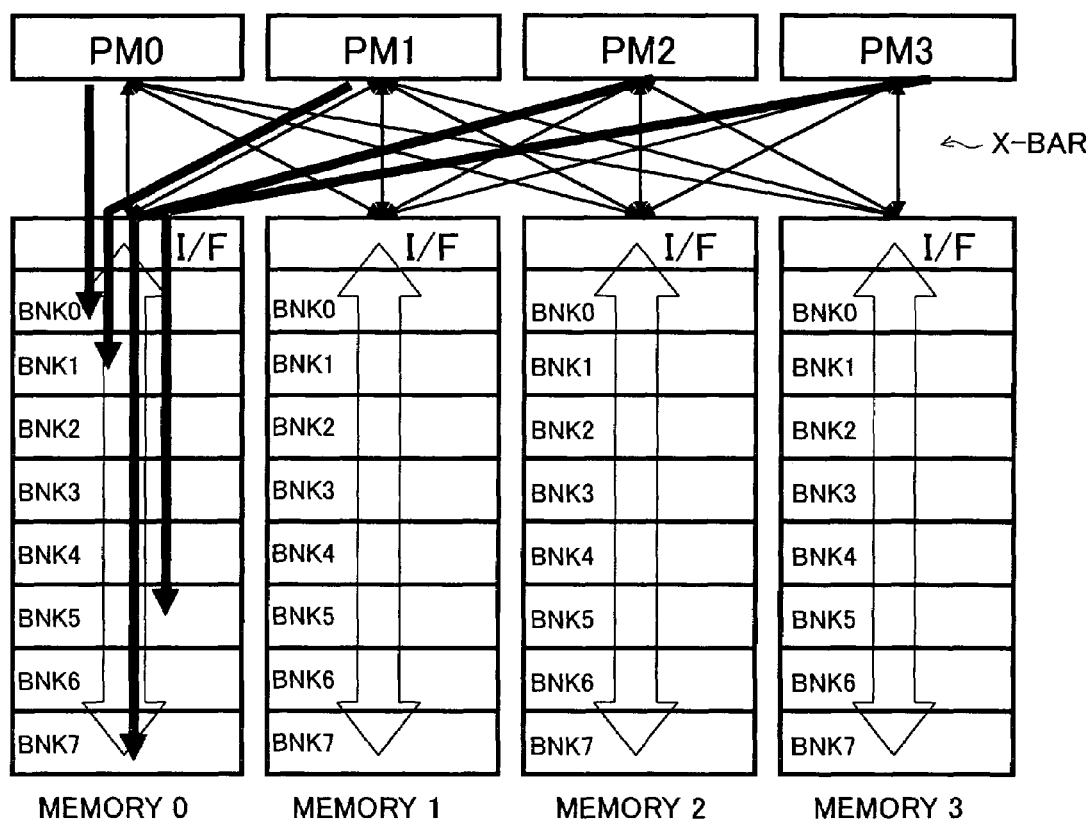
FIG. 9 is a diagram showing that, in the usual X-bars, it may be impossible to simultaneous accesses when there is only one system of interconnect resources in the Y-direction (second direction or vertical direction)

In the shared memory device 10 of the present embodiment, if there is an access destination in the middle of the route, even with simultaneous accesses belonging to the same memory, if the banks are different and the interconnects LNY in the Y-direction (first direction or vertical direction) do not compete, simultaneous access becomes possible. Due to this, as shown in FIG. 6 and FIG. 8, in comparison with simple mapping of X-bars, the throughput can be improved without increasing the area. As explained above, in the example of FIG. 6, the processing module 21 (PM0) of the access cluster 20 is accessing the bank 221-2 of the memory macro 221 existing on the left end, and the processing module 31 (PM1) of the access cluster 30 is accessing the bank 221-1 of the same memory macro 221. With the usual X-bars, as shown in FIG. 3 and FIG. 9, simultaneous accesses are not possible when there is only one system of interconnect resources in the Y-direction (first direction or vertical direction). Contrary to this, in the present embodiment, as shown in FIG. 8, simultaneous accesses can be achieved with same degree of area, and shortening of the latency can be achieved.

Further, the interconnects in the X-direction (second direction or horizontal direction) have to be individually (privately) provided to the processing modules PM, but the interconnects in the Y-direction (first direction or vertical direction) may be provided according to the needed performance and permitted resources (area), as shown in FIGS. 10A to 10C and FIGS. 11A to 11C, in three modes of private interconnects PRL, public interconnects PBL, and common interconnects CML.

Figure 10A:
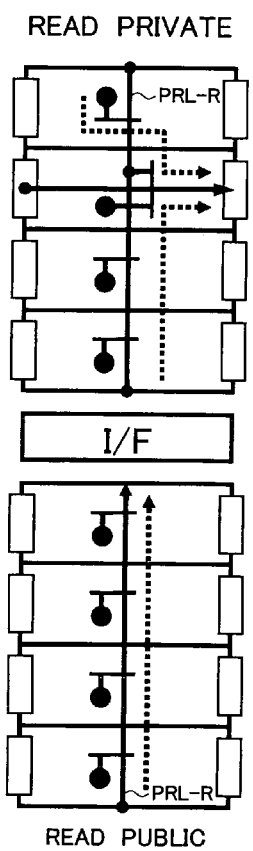
FIGS. 10A to 10C are diagrams showing three modes of private interconnects PRL, public interconnects PBL, and common interconnects CML as connection interconnects of the present embodiment.
Figure 10B:
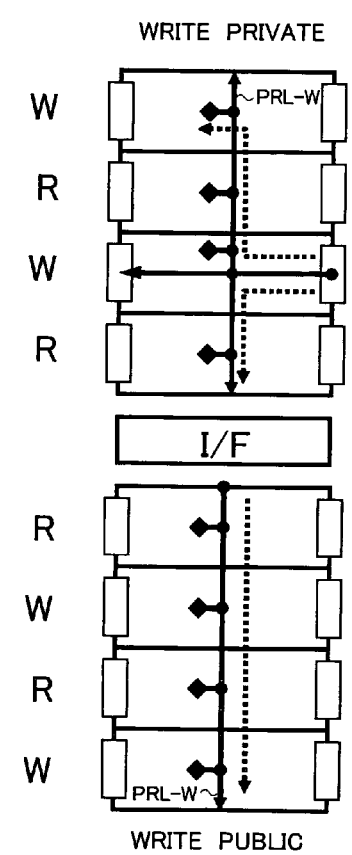

In the case of private interconnects, as shown in FIGS. 10A and 10B, individual (dedicated) interconnects are laid to the processing modules PM, so the performance becomes the highest, but the needed interconnect resources (area) becomes the largest.

In the case of public interconnects, when accessing a region beyond the memory interface I/F, the read data interconnects and the write data interconnects of the processing modules PM can be shared. For example, when accessing a region below the processing modules 21 and 31 (PM0, PM1) of the upper side access clusters 20 and 30 in the figure, the interconnects can be shared by bundling the ones for read and write operations together. When simultaneous accesses occur, accesses can be carried out by only the number of public systems, but the area can be suppressed.

Figure 10C:
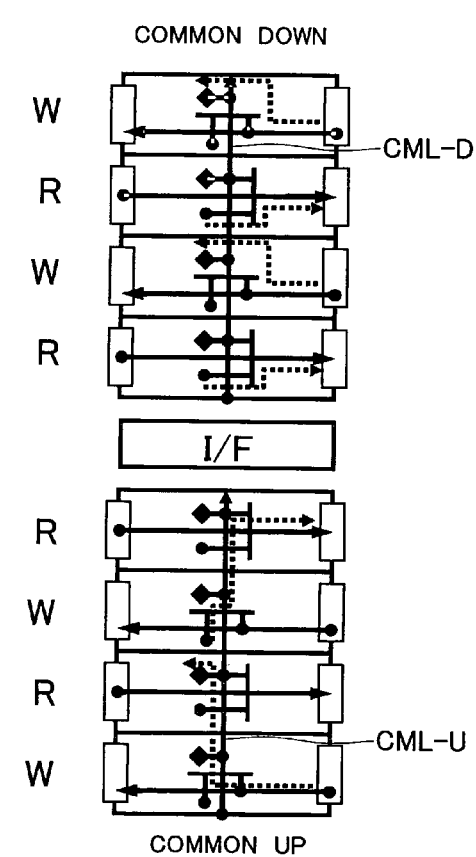

In the case of common interconnects, the interconnect are shared in the direction going toward the memory interface I/F (up) and the direction moving away from that (down). Whether they are for read or write operations is not important. As shown in FIG. 10C, so far as the directions coincide, resources can be shared among all processing modules PM.

Figure 11A:
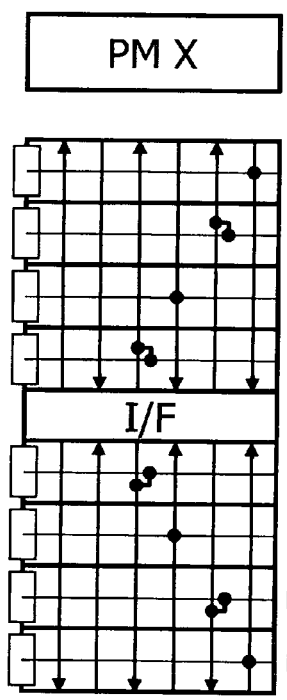
FIGS. 11A to 11C are diagrams showing embodiments of the private interconnects PRL, public interconnects PBL, and common interconnects CML.
Figure 11B:
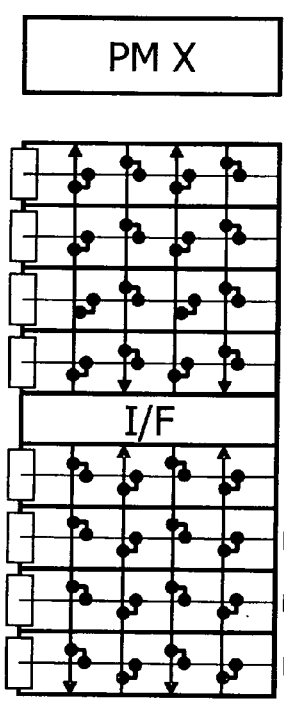
Figure 11C:
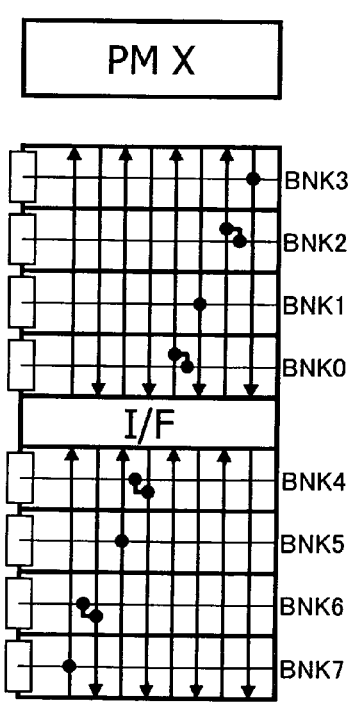

Embodiments using the private interconnects, public interconnects, and common interconnects shown in FIGS. 10A to 10C are shown in FIGS. 11A to 11C.

The shared memory device 10 shown in FIG. 4 shows a case where processing modules 21, 31, 41, and 51 of the access clusters have input/output ports 211, 311, 411, and 511 as an example, but it is also possible to provide a plurality of input/output ports in the processing modules 21, 31, 41, and 51.

Figure 12:
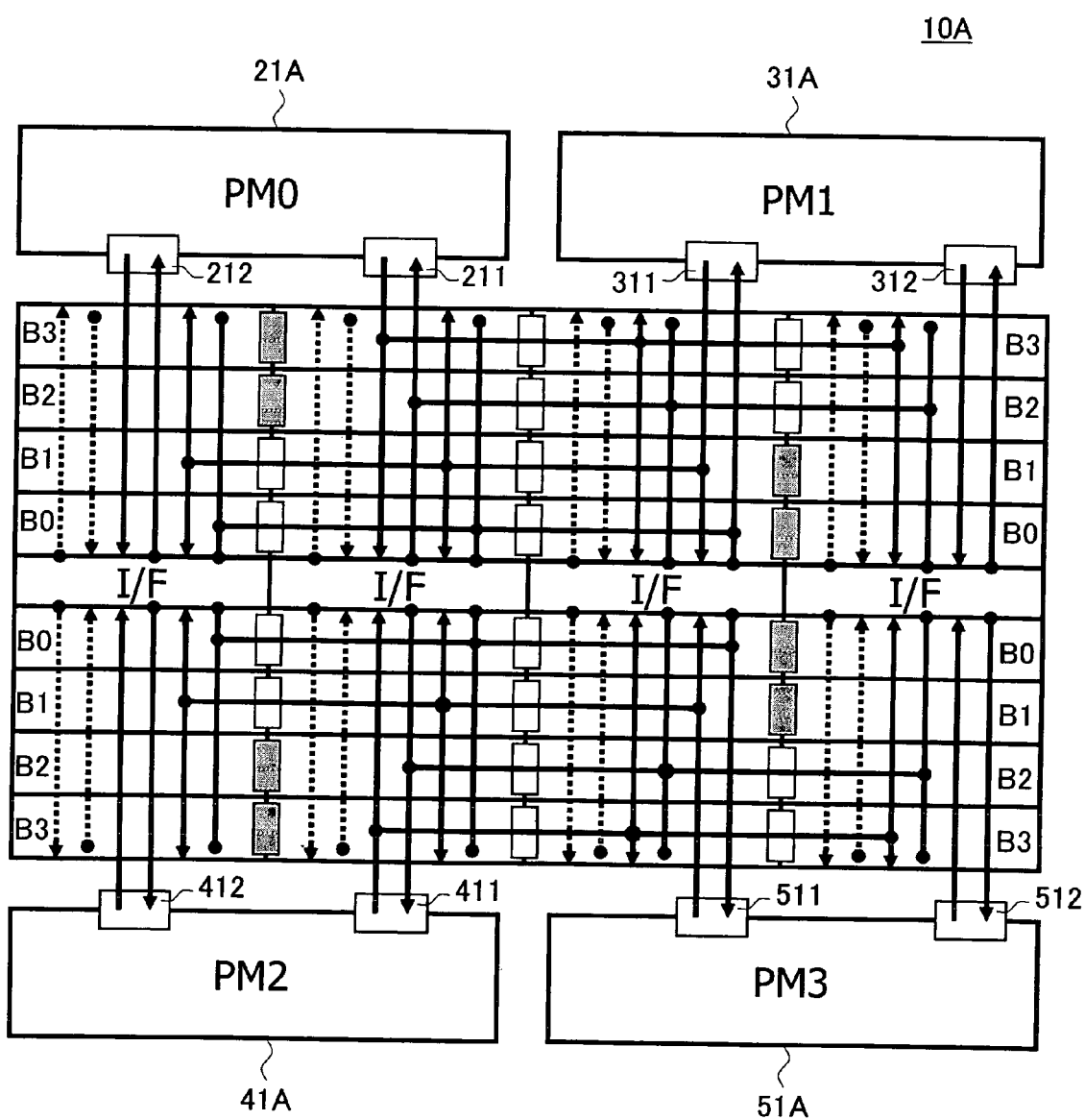
FIG. 12 is a diagram showing an example of the configuration of a shared memory device in which each processing module has a plurality of input/output ports.

FIG. 12 is a diagram showing an example of the configuration of a shared memory device in which each processing module has a plurality of input/output ports. In a shared memory device 10A of FIG. 12, processing modules 21A, 31A, 41A, and 51A of access clusters 20A, 30A, 40A, and 50A have two input/outputs ports 211 and 212, 311 and 312, 411 and 412, and 511 and 512, respectively.

By providing a plurality of ports in each processing module PM in this way, the throughput can be further improved. In this case, as shown in FIG. 12, there is almost no increase in area since only the regions of the access destinations are divided.

Further, the shared memory device 10 of FIG. 4 shows a configuration including four access clusters as an example, but it is also possible to employ a configuration including one, two, six, or more access clusters.

Figure 13:
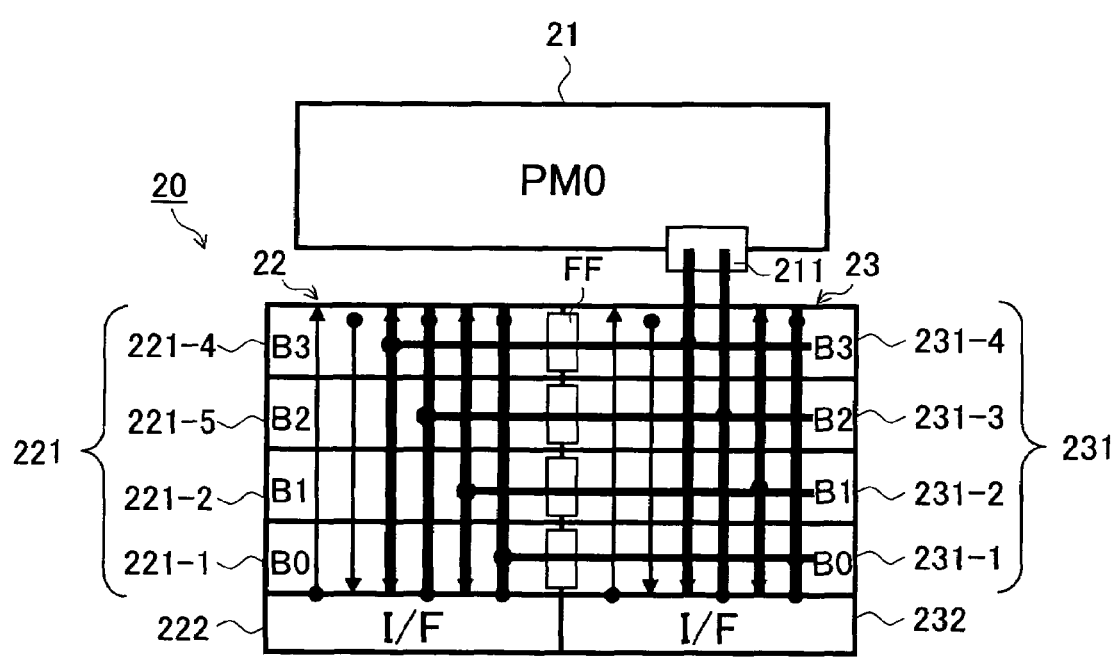
FIG. 13 is a diagram showing an example of the configuration of a shared memory device including one access cluster.
Figure 14:
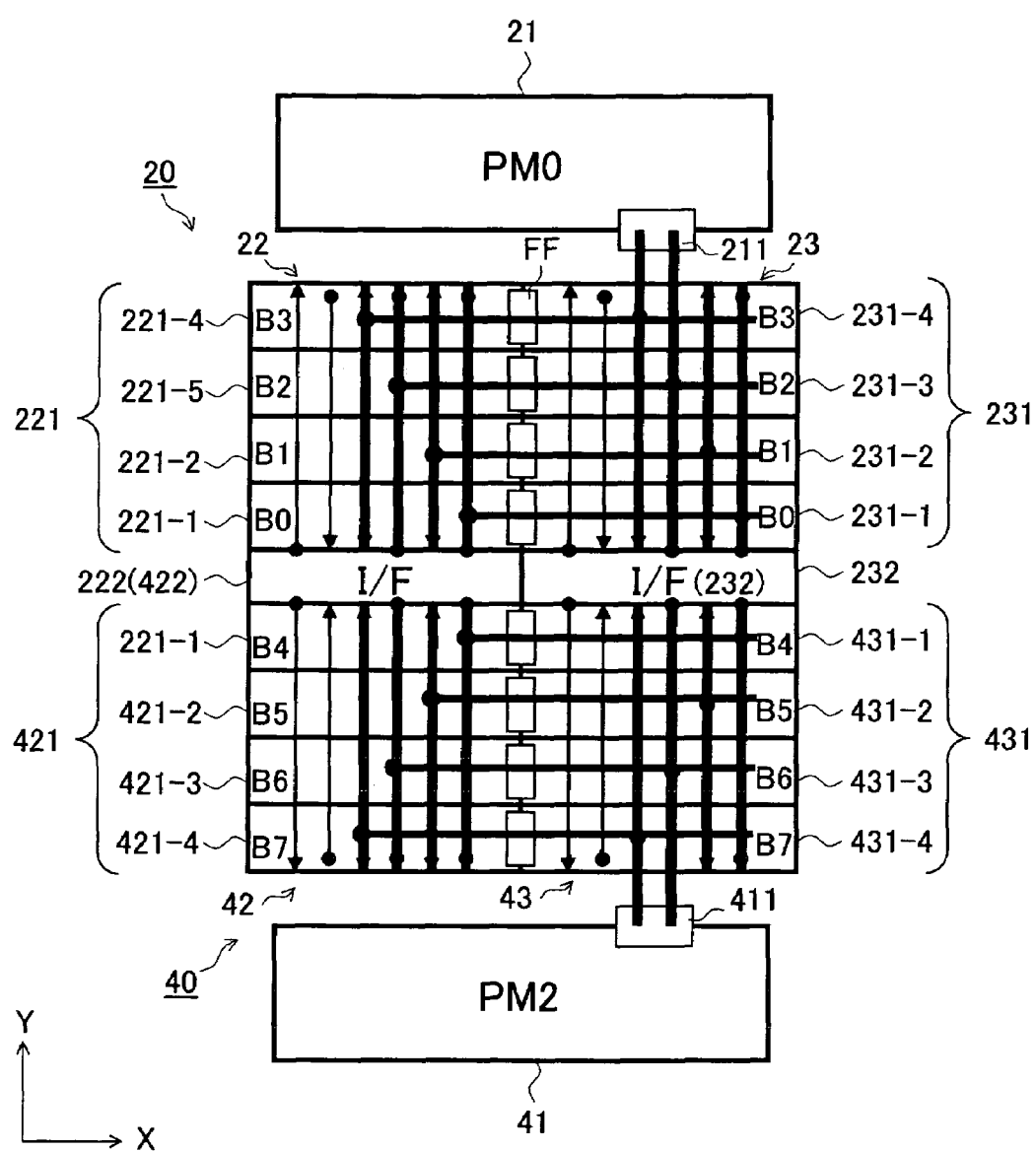
FIG. 14 is a diagram showing an example of the configuration of a shared memory device including two access clusters.
Figure 15:
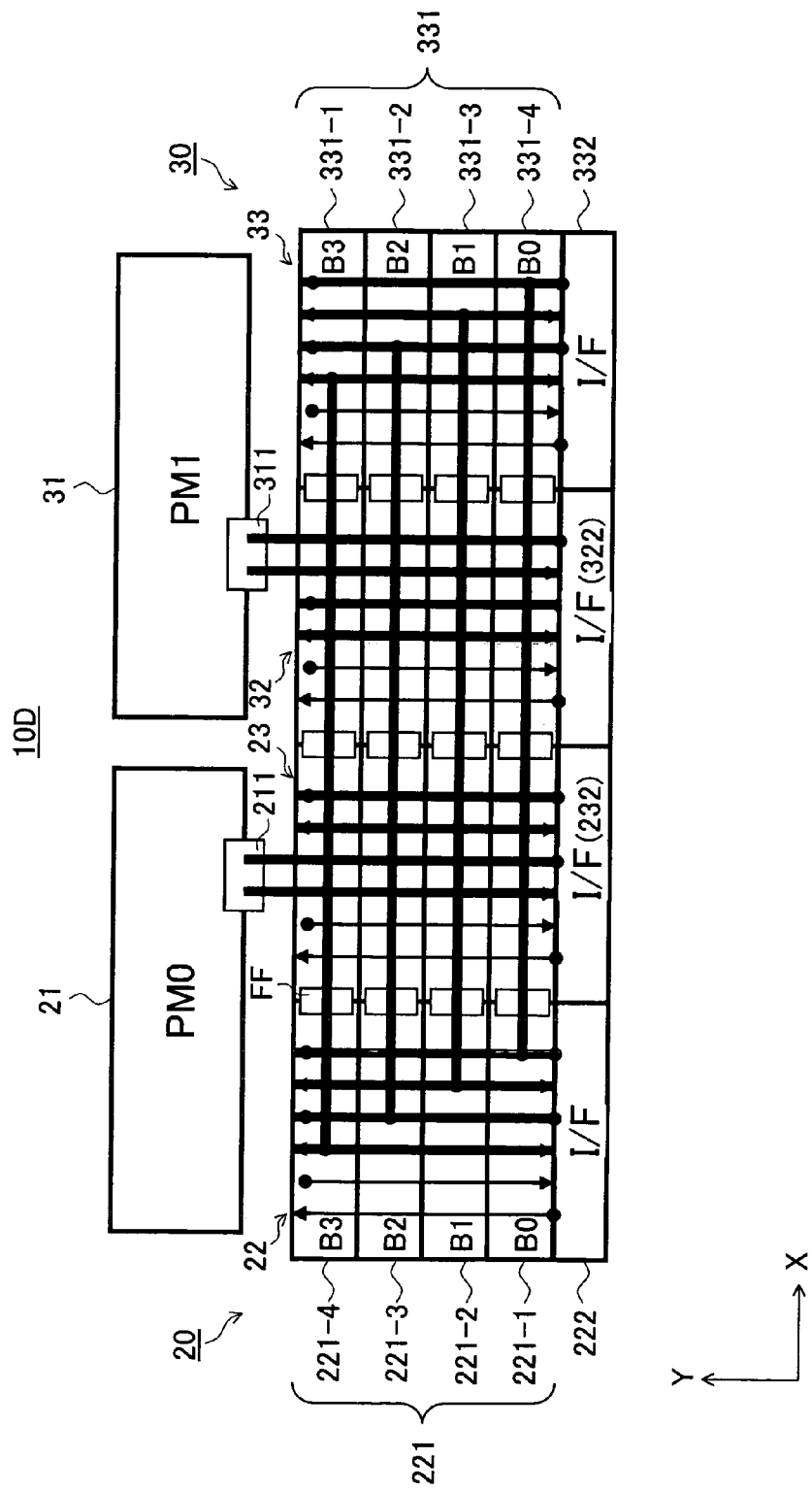
FIG. 15 is a diagram showing an example of the configuration of a shared memory device including two access clusters.
Figure 16:
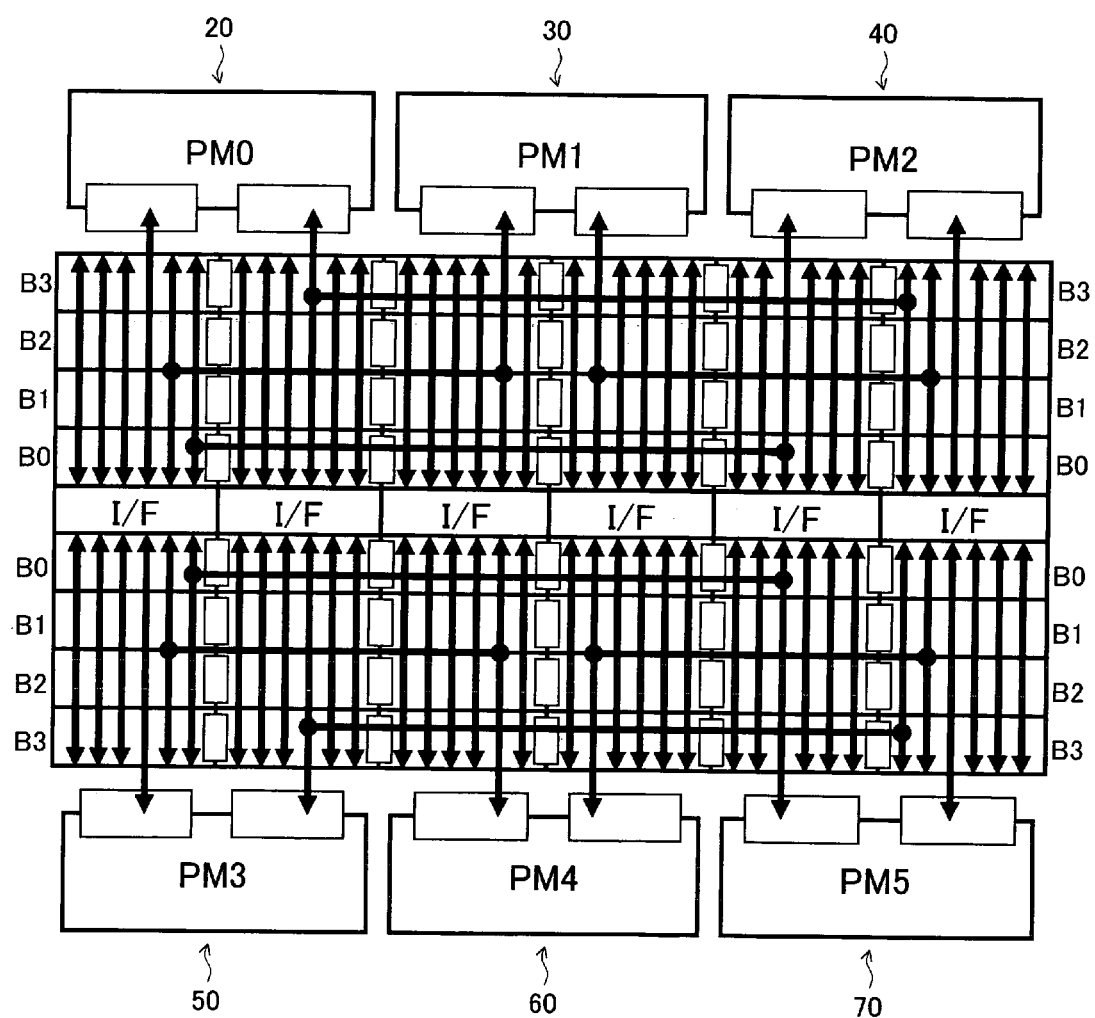
FIG. 16 is a diagram showing an example of the configuration of a shared memory device including six access clusters.
Figure 17:
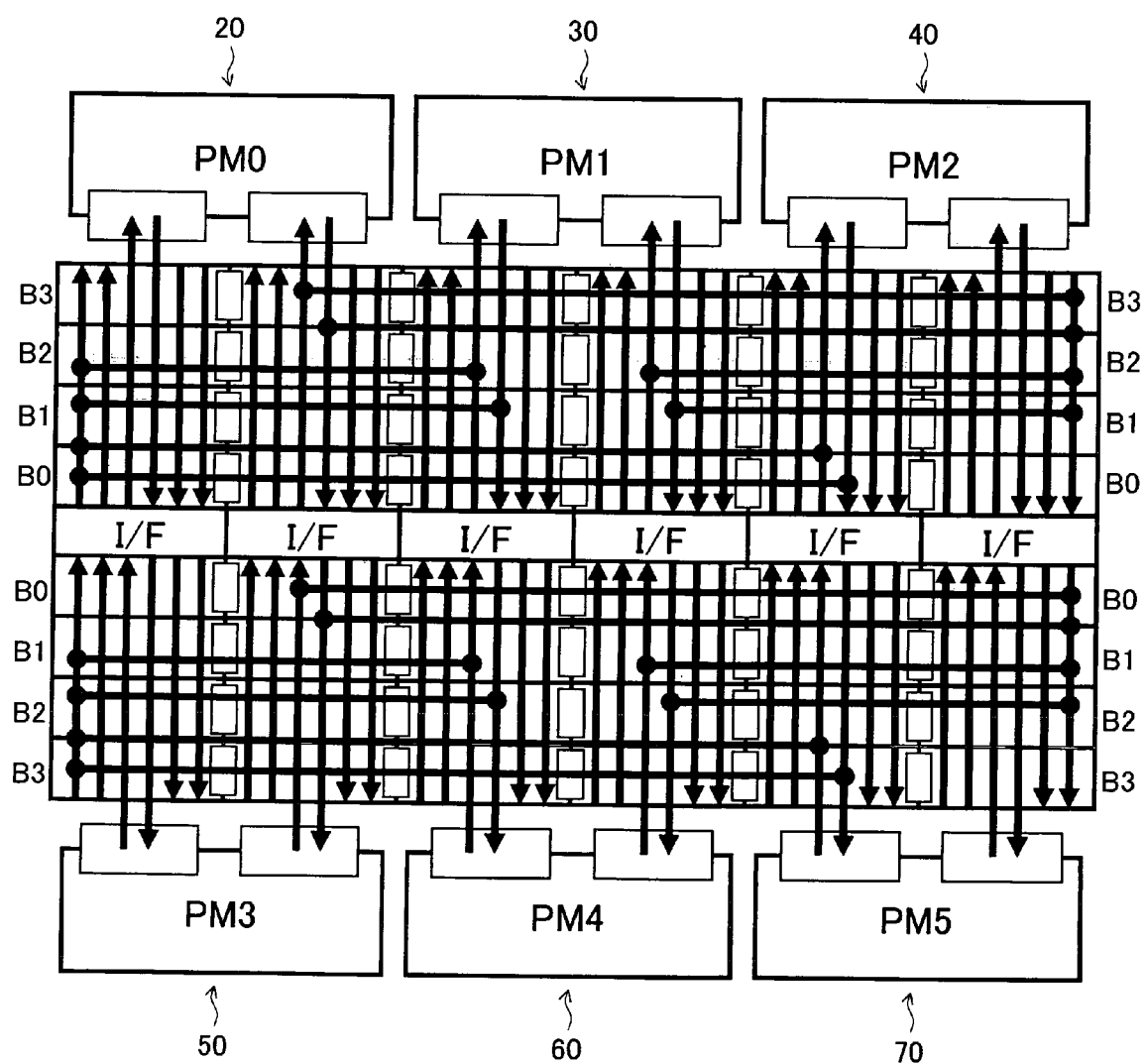
FIG. 17 is a diagram showing an example of the configuration of a shared memory device including six access clusters.

FIG. 13 is a diagram showing an example of the configuration of a shared memory device including one access cluster. FIG. 14 and FIG. 15 are diagrams showing examples of the configuration of a shared memory device including two access clusters. FIG. 16 and FIG. 17 are diagrams showing examples of the configuration of a shared memory device including six access clusters.

A shared memory device 10B of FIG. 13 includes one access cluster 20. A shared memory device 10C of FIG. 14 includes an access cluster 20 and an access cluster 40 sharing the memory interface I/F in the Y-direction (first direction). A shared memory device 10D of FIG. 15 includes an access cluster 20 and access cluster 30 arranged in parallel in the X-direction (second direction). Shared memory devices 10E and 10F of FIG. 16 and FIG. 17 are configured including six access clusters in which three access clusters 20, 30, and 40 are arranged in parallel in the X-direction (second direction) and three access clusters 50, 60, and 70 sharing the memory interface I/F together with these access clusters 20, 30, and 40 are arranged in the Y-direction (first direction). In this way, it is possible to configure the system in accordance with the number of access clusters, in other words, the number of processing modules PM.

Above, the system configuration of the shared memory device was focused on in the explanation. Below, while there will be overlapping parts, the bank configuration, connection interconnects, configuration of the memory interface, and functions will be further specifically explained.

Memory Macro Configuration

Figure 18:
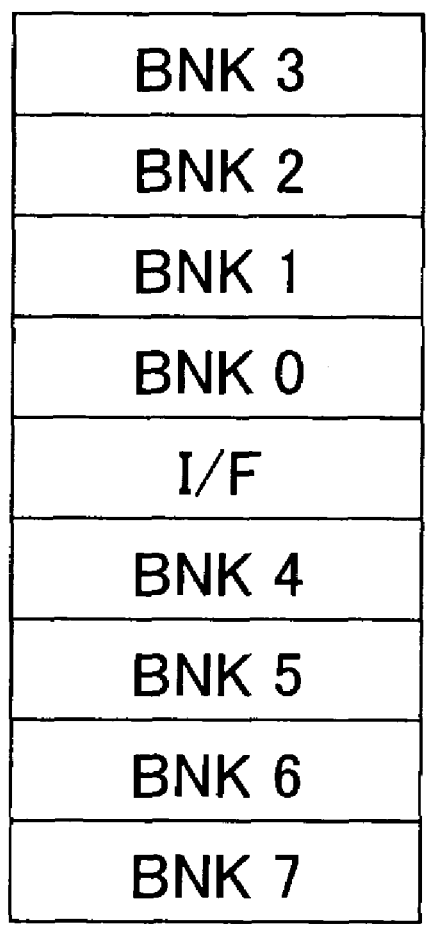
FIG. 18 is a diagram showing an example of the configuration of memory macros sharing a memory interface I/F in memory systems arranged in the Y-direction (first direction)

In the present embodiment, as shown in FIG. 18, a memory macro is configured by a plurality of memory banks BNK and one memory interface I/F. In the present embodiment, the memory interface I/F is shared by memory systems arranged in the Y-direction (first direction). As shown in FIG. 18, physically, in principle, the same numbers (half) of the banks are arranged before and after the memory interface I/F.

Bank Configuration

Figure 19:
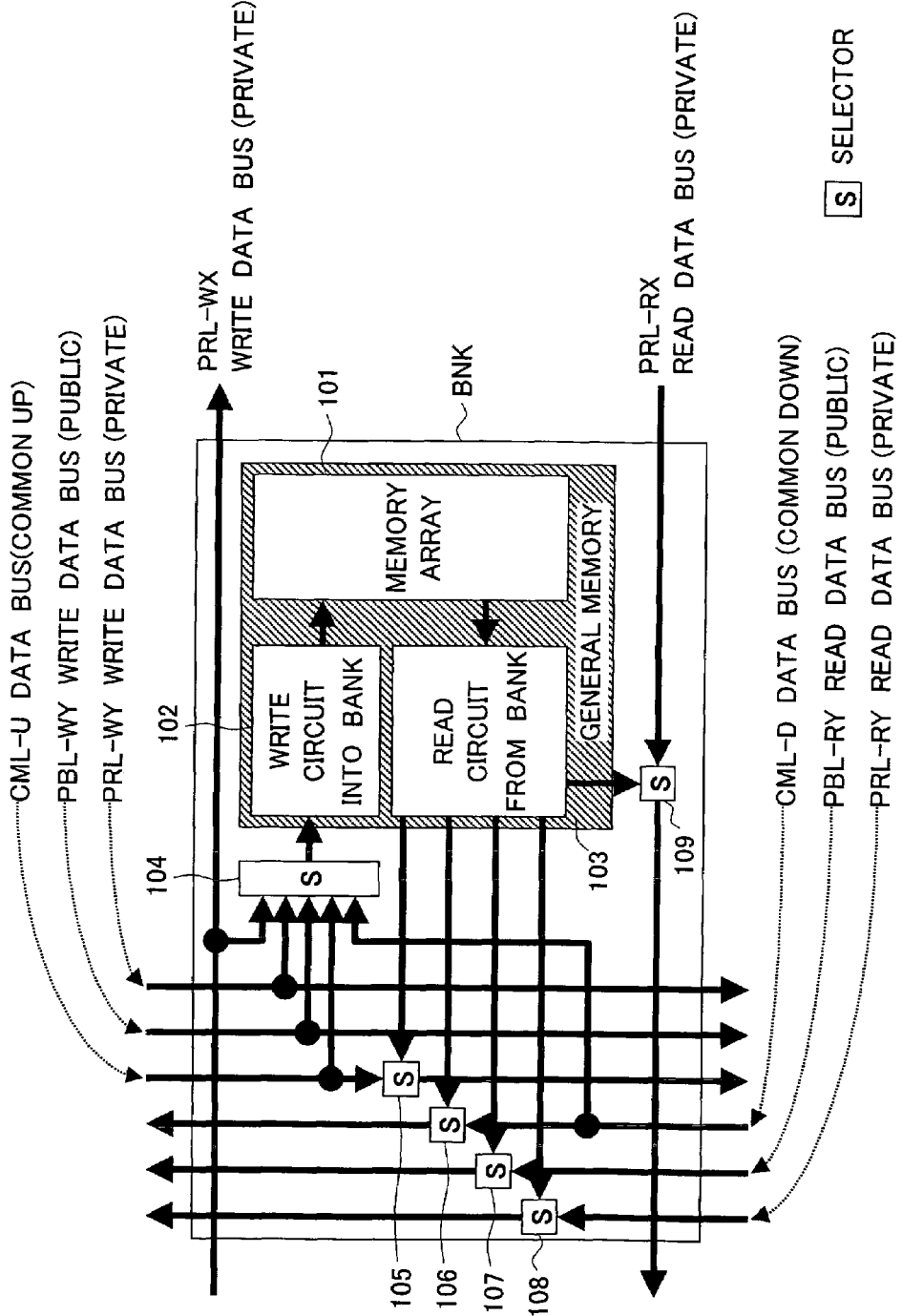
FIG. 19 is a diagram showing an example of the configuration of a memory bank according to the present embodiment.

FIG. 19 is a diagram showing an example of the configuration of a memory bank according to the present embodiment.

Each bank BNK is configured by a memory array 101, write circuit 102, read circuit 103, and selectors (S) 104 to 109.

Further, in FIG. 19, PRL-WX indicates a private write data bus (interconnect) in the X-direction (second direction or horizontal direction), PRL-RX indicates a private read data bus in the X-direction (second direction or horizontal direction), PRL-WY indicates a private write data bus in the Y-direction (first direction or vertical direction), PBL-WY indicates a public write data bus in the Y-direction (first direction or vertical direction), PRL-RY indicates a private read data bus in the Y-direction (first direction or vertical direction), PBL-RY indicates a public read data bus in the Y-direction (first direction or vertical direction), CML-U indicates a common command address bus in the up direction in the Y-direction (first direction or vertical direction), and CML-D indicates a common command address bus in the down direction in the Y-direction (first direction or vertical direction).

Figure 20:
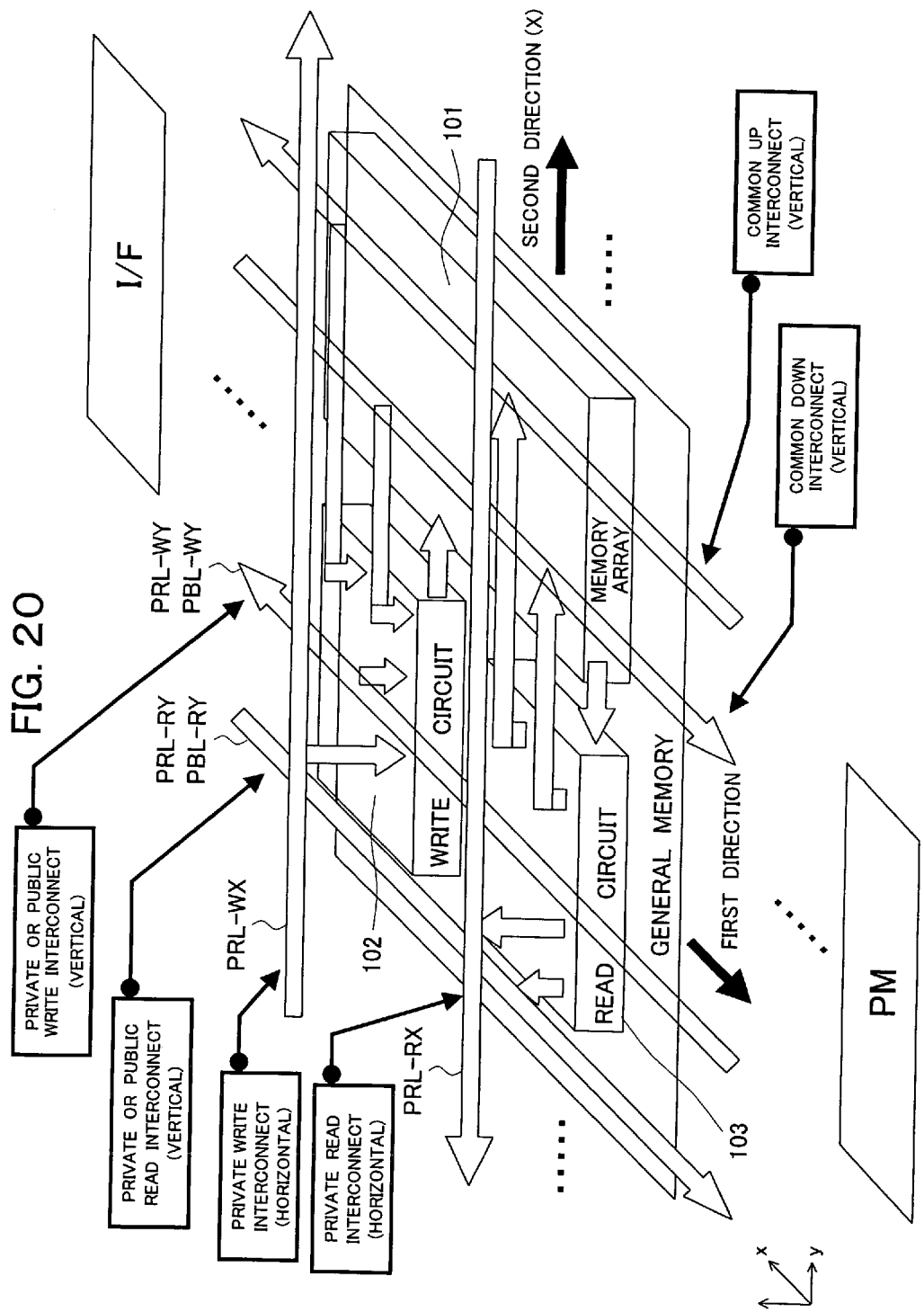
FIG. 20 is a diagram showing a 3D situation in which command information interconnects (command address interconnects) and data interconnects (write data interconnects and read data interconnects or common interconnects) are arranged on a bank in multiple layers in the present embodiment.

In the present embodiment, the command information interconnects (command address interconnects) and the data interconnects (write data interconnects and read data interconnects or common interconnects) are arranged in multiple layers. The state of the interconnects arranged in multiple layers on the bank BNK is shown in FIG. 20.

In each bank BNK, information concerning the write operation is selectively sent to the write circuit 102 through the selector 104 from the write data bus PRL-WX in the horizontal direction (X-direction), the write data buses (private, public) PRL-WY and PBL-WY in the vertical direction (Y-direction), and the common command address buses CML-U and CML-D (up, down) in the vertical direction. Further, the data is selectively transferred to the read bus PRL-RX in the horizontal direction (X-direction), the read data buses (private, public) PRL-RY and PBL-RY in the vertical direction (Y-direction), and the common command address buses CML-U and CML-D (up, down) in the vertical direction via the selectors 105 to 109.

Figure 21:
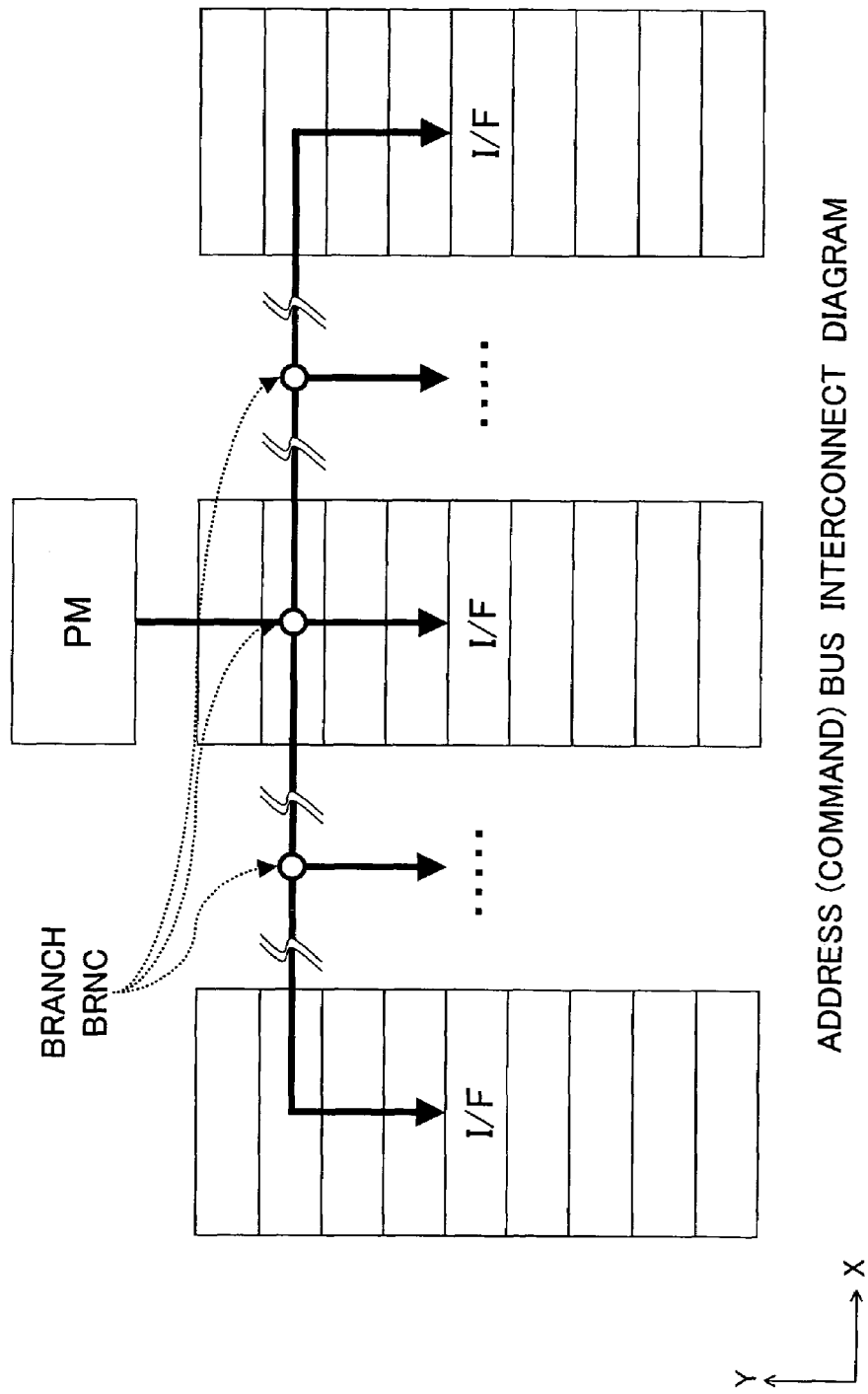
FIG. 21 is a diagram for explaining command address bus interconnects in a horizontal direction (X-direction, second direction)

Horizontal Direction (X-Direction, Second Direction) Command Address Bus Interconnects Command address buses CML-X include information such as the macro of the access destination, bank, address, read/write, write mask, ID, and burst length. The command address buses CML-X are connected to memory macros of all memory systems in the X-direction (second direction or horizontal direction) from the processing modules PM as shown in FIG. 21. The amount of interconnects would become huge between the processing modules PM and memory interfaces I/F with "Point to Point" (hereinafter abbreviated as "P2P") connection. Accordingly, the interconnects are commonly connected. The horizontal direction (X-direction) interconnects are dedicated (private) for specific processing modules PM. They are branched at the branches BRNC in accordance with the macros of the access destinations. After branching, the memory interfaces I/F are connected to by private bus interconnects.

Figure 22:
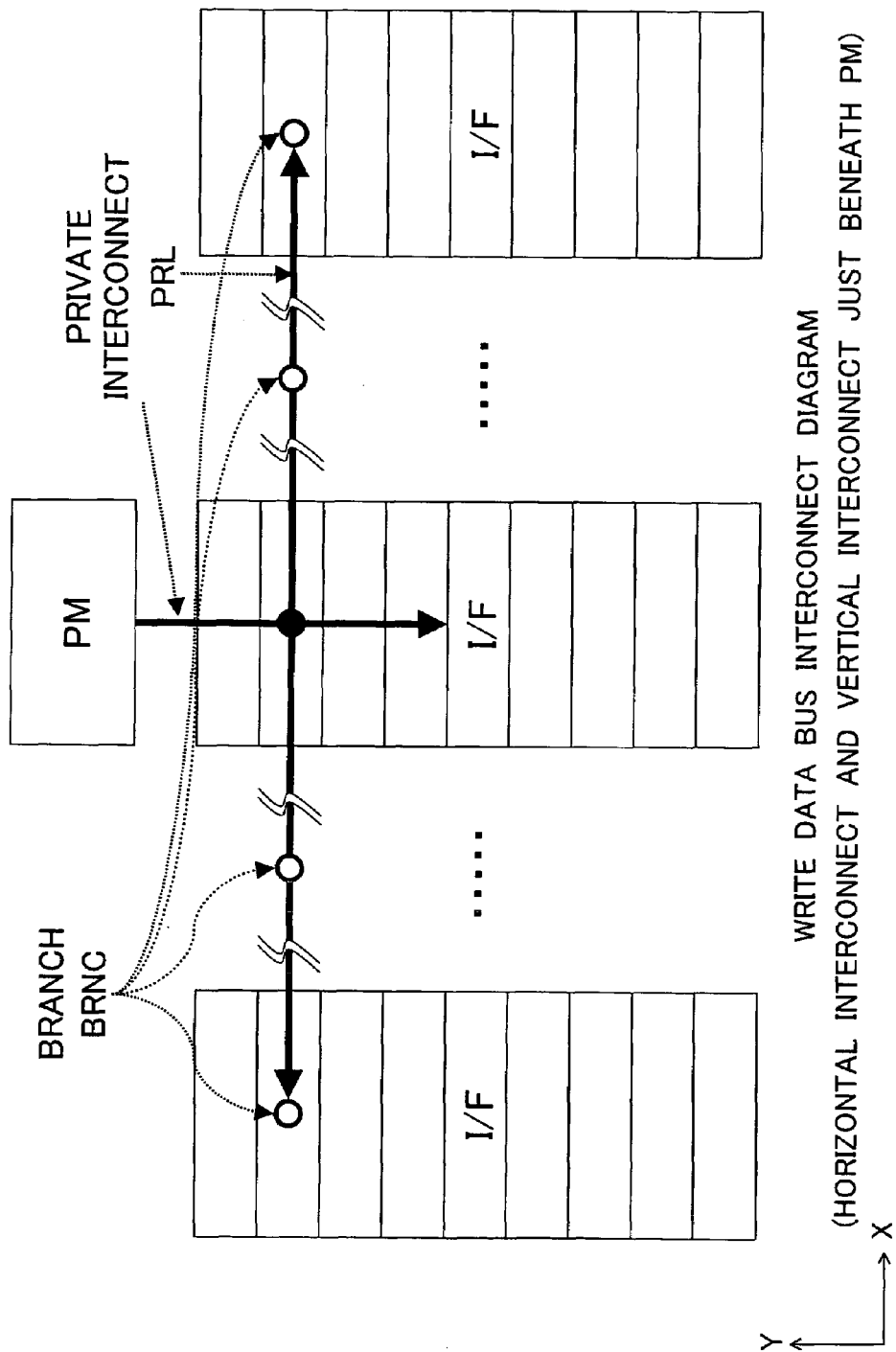
FIG. 22 is a diagram for explaining write data bus interconnects in the horizontal direction (X-direction, second direction)

Horizontal Direction (X-Direction, Second Direction) Write Data Bus Interconnects The write data buses PRL-WX in the horizontal direction are private interconnects, but as shown in FIG. 22, they are not connected by P2P for specific access destinations, but are shared. The vertical direction Y-direction, first direction) interconnects from the branches BRNC to the memory interfaces I/F are made private, public, or common bus interconnects in accordance with the useable interconnect resources.

Vertical Direction (Y-Direction, First Direction) Write Data Bus Interconnects

Figure 23:
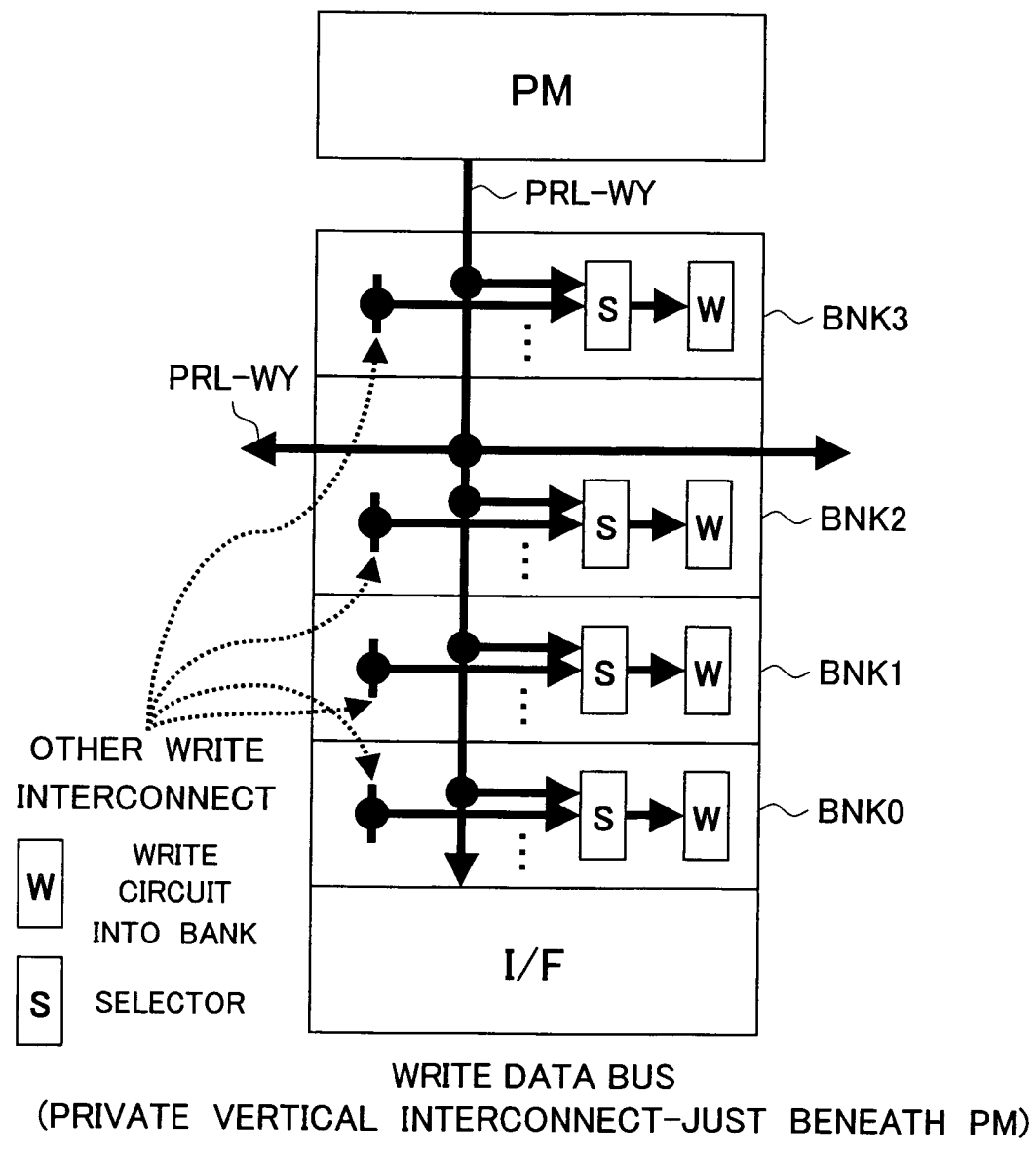
FIG. 23 is a diagram for explaining write data bus interconnects in a vertical direction (Y-direction, first direction) and explains write data buses in the vertical direction (Y-direction, first direction) from the processing modules up to the memory interface I/F just beneath the modules.
Figure 24:
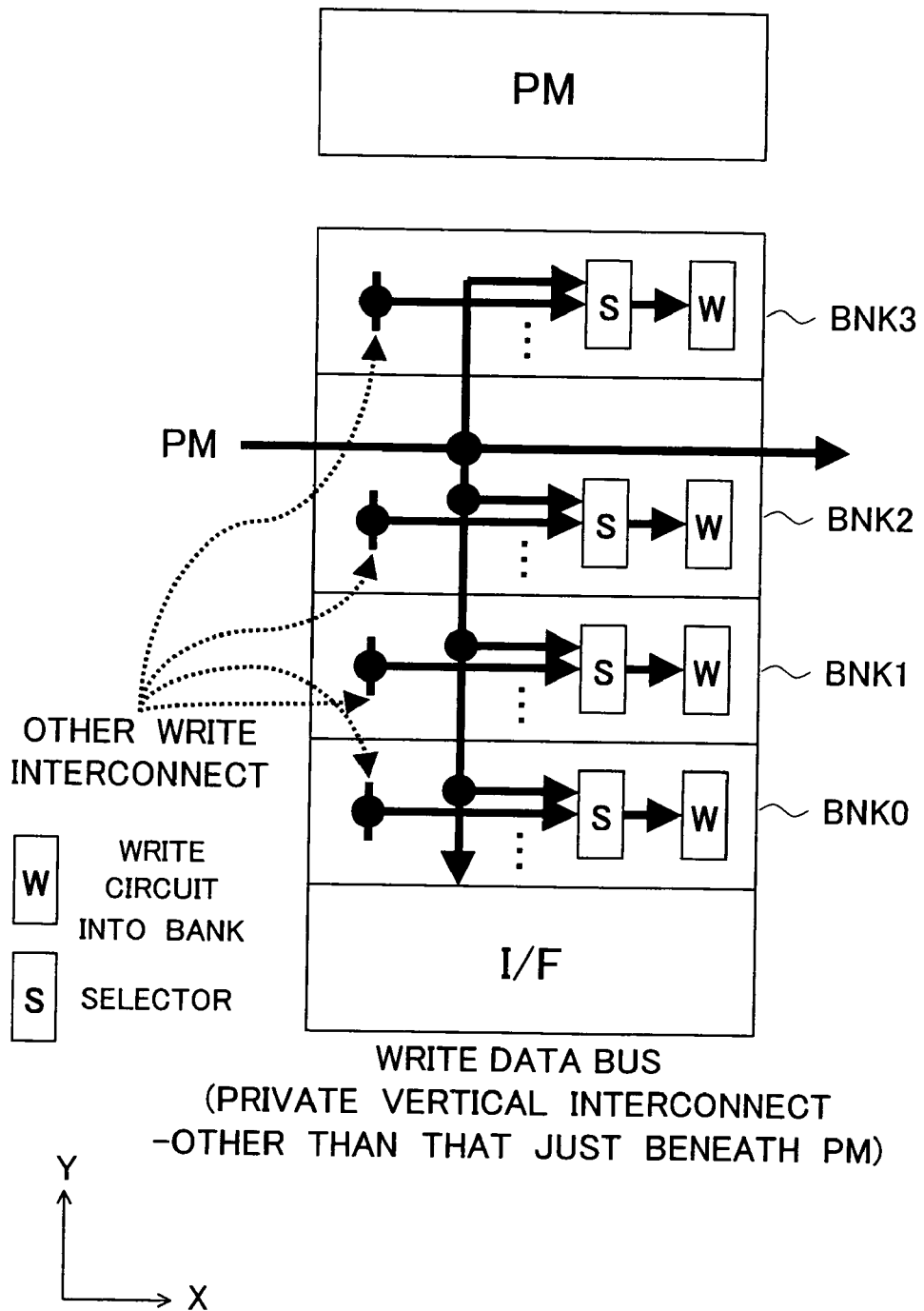
FIG. 24 is a diagram for explaining write data bus interconnects in the vertical direction (Y-direction, first direction) and explains the write data buses in the vertical direction (Y-direction, first direction) other than those just beneath the processing modules.
Figure 25:
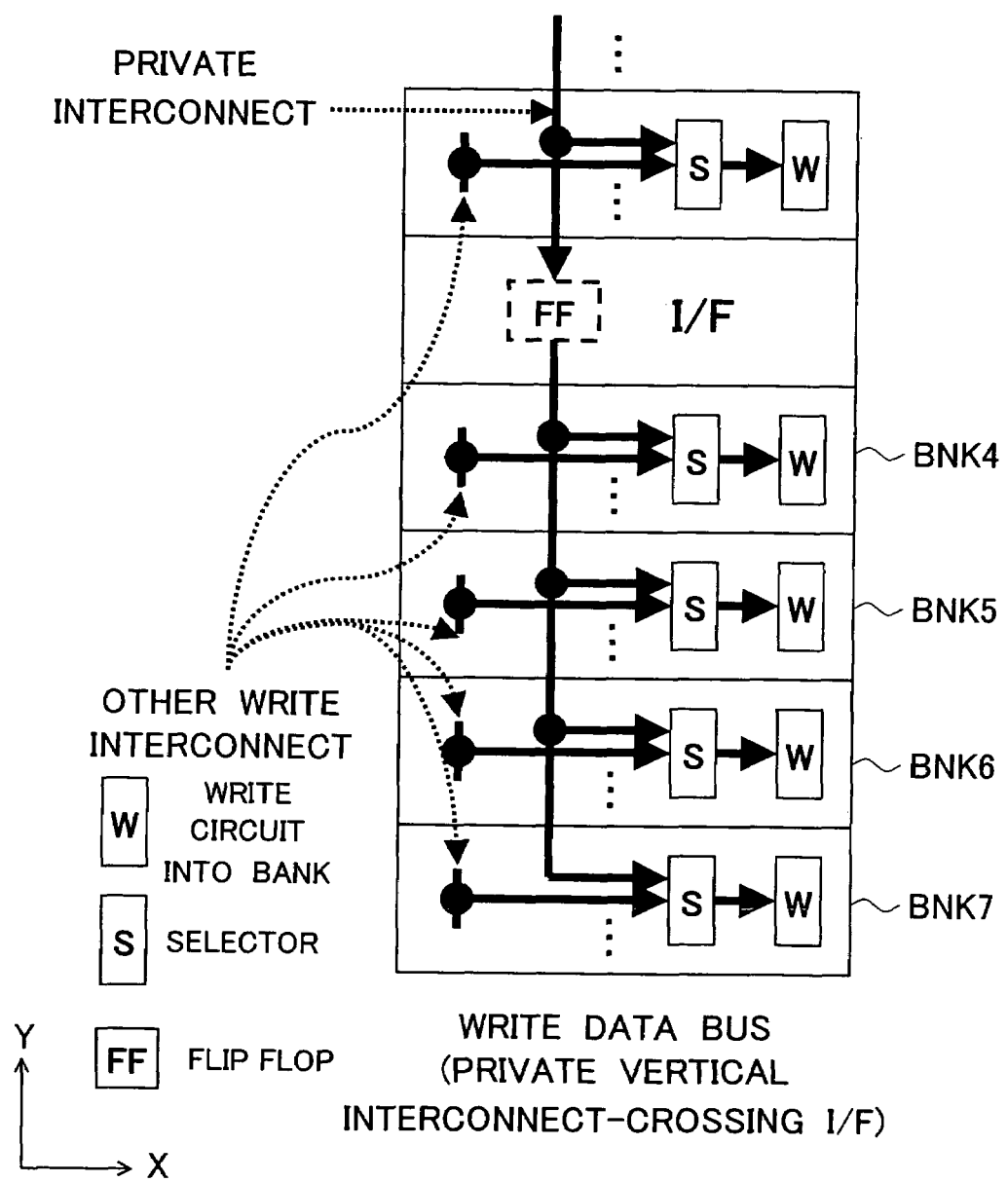
FIG. 25 is a diagram showing an example of providing a flip-flop FF in the memory interface I/F according to a level of delay.
Figure 26:
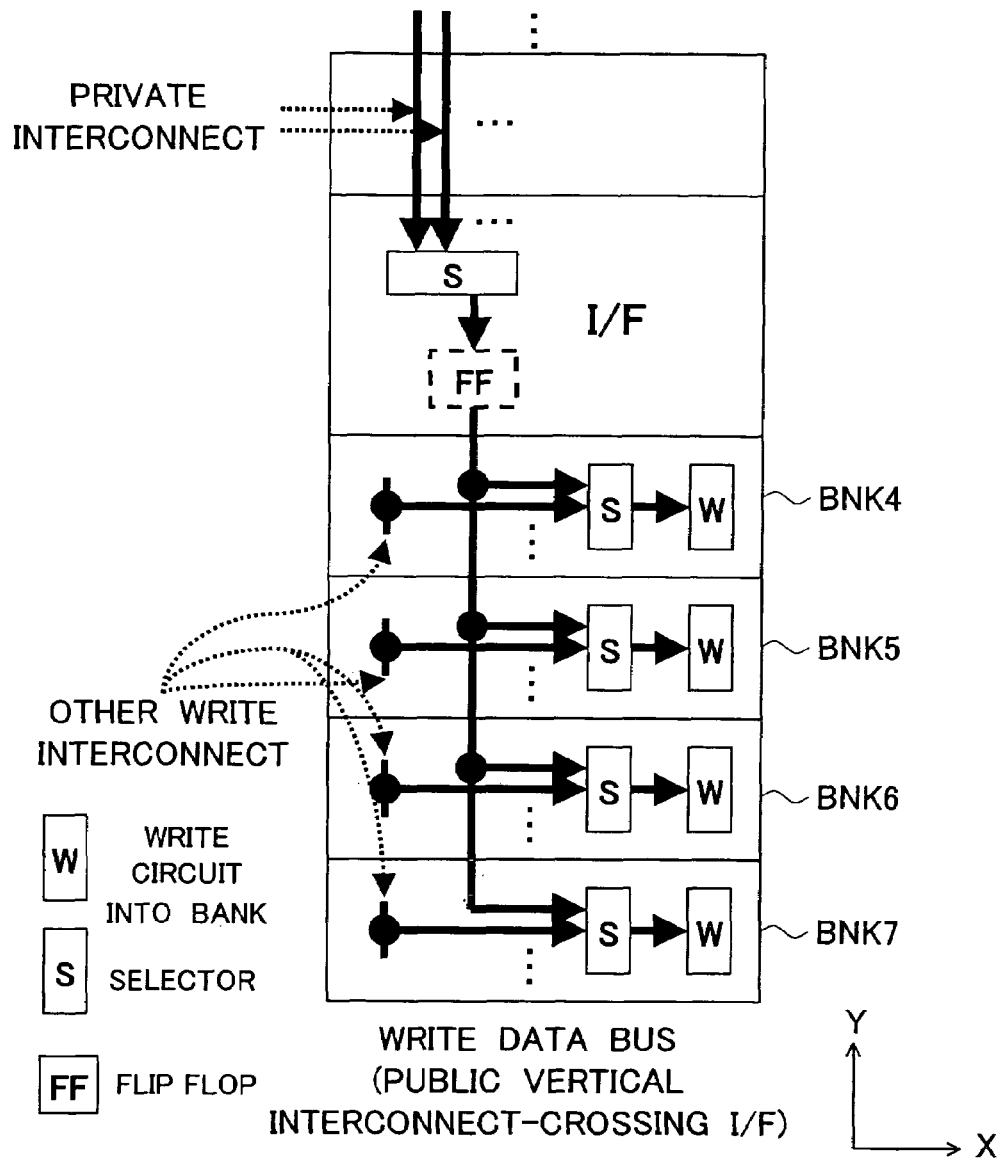
FIG. 26 is a diagram for explaining write data bus interconnects in the vertical direction (Y-direction, first direction) and shows an example of selecting a plurality of private interconnects before the memory interface I/F in accordance with the situation of interconnect resources and forming the same by public interconnects.

The write data buses in the vertical direction (Y-direction, first direction) from the processing modules PM to the memory interfaces I/F just beneath the modules are made private buses PRL-WY as shown in FIG. 23. The private write data buses PRL-WY are directly connected to write data buses PRL-WX arranged in the horizontal direction (X-direction, second direction) (second bank BNK2 from that of FIG. 23). The private vertical interconnects other than those just beneath the processing modules PM, as shown in FIG. 24, are directly connected to the write data buses for transferring the data from the horizontal direction (X-direction). The write data is transferred from there to the vertical direction (Y-direction). The vertical direction write buses crossing over the memory interfaces I/F are not connected with the horizontal direction interconnects. Further, as shown in FIG. 25, the write data is once latched by a flip-flop FF in each memory interface I/F and transferred according to the level of delay. When crossing over a memory interface I/F, as shown in FIG. 26, in accordance with the situation of the interconnect resources, a plurality of private interconnects before the memory interface I/F are selected by the selector S and formed by public interconnects. Private interconnects are dedicated interconnects for specific processing modules PM, therefore, when the number of processing modules PM increases, enormous interconnect resources become necessary when connecting all privately. In this case, the common connection format is employed for interconnects other than those just beneath the processing modules.

Figure 27:
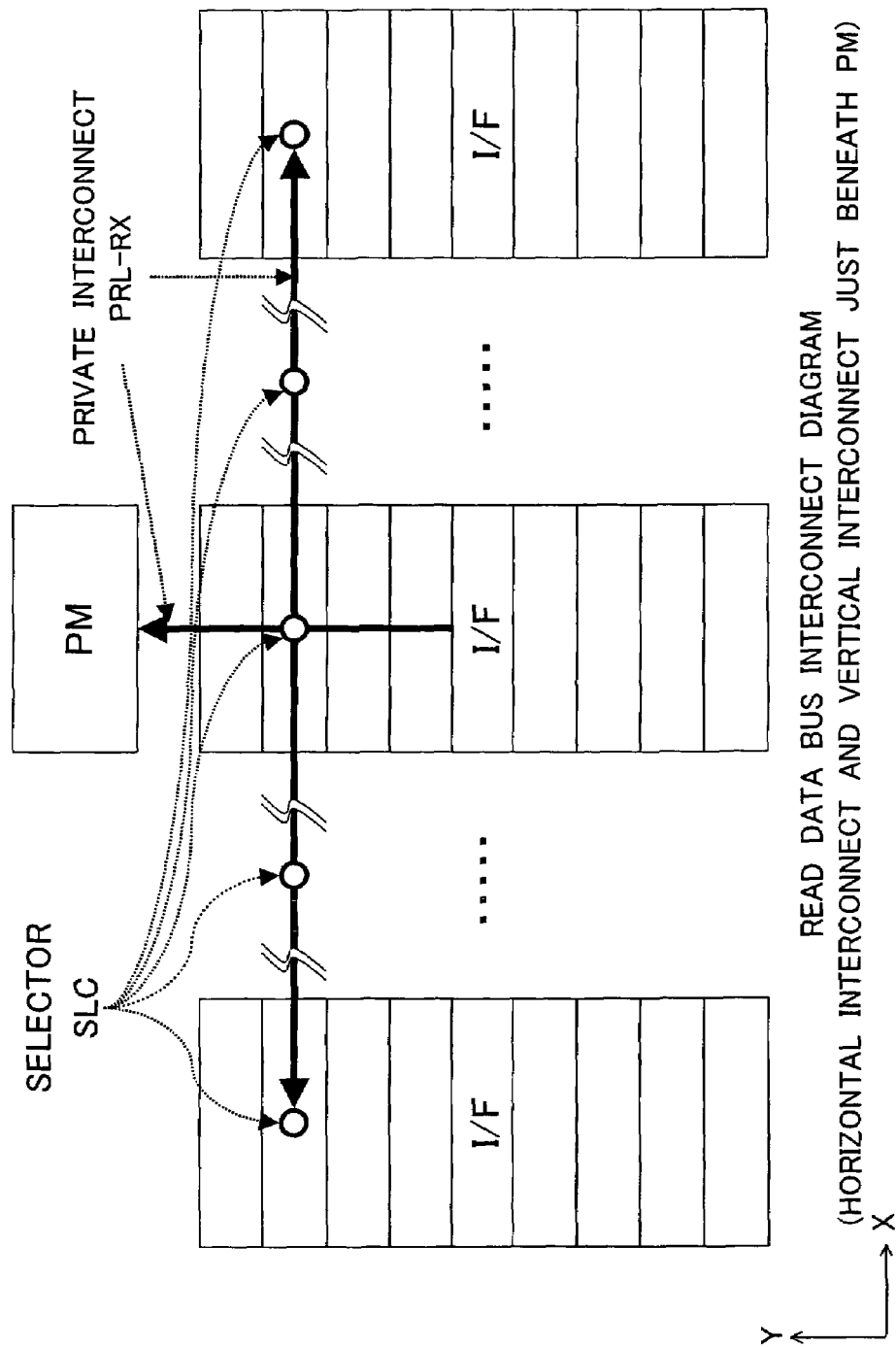
FIG. 27 is a diagram for explaining read data bus interconnects in the horizontal direction (X-direction, second direction).

Horizontal Direction (X-Direction, Second Direction) Read Data Bus Interconnects The read data buses to the memory interfaces I/F just beneath the processing modules PM, as shown in FIG. 27, are made private interconnects PRL-RX. The read data bus interconnects in the horizontal direction (X-direction) are private, but are not connected by P2P to specific access destinations, but are common. As shown in FIG. 27, the connection portions with the vertical direction (Y-direction, first direction) interconnects are configured by selectors SLC. These select the data transferred from the horizontal direction (X-direction) and the data transferred from the vertical direction (Y-direction).

Vertical Direction (Y-Direction, First Direction) Read Data Bus Interconnects

Figure 28:
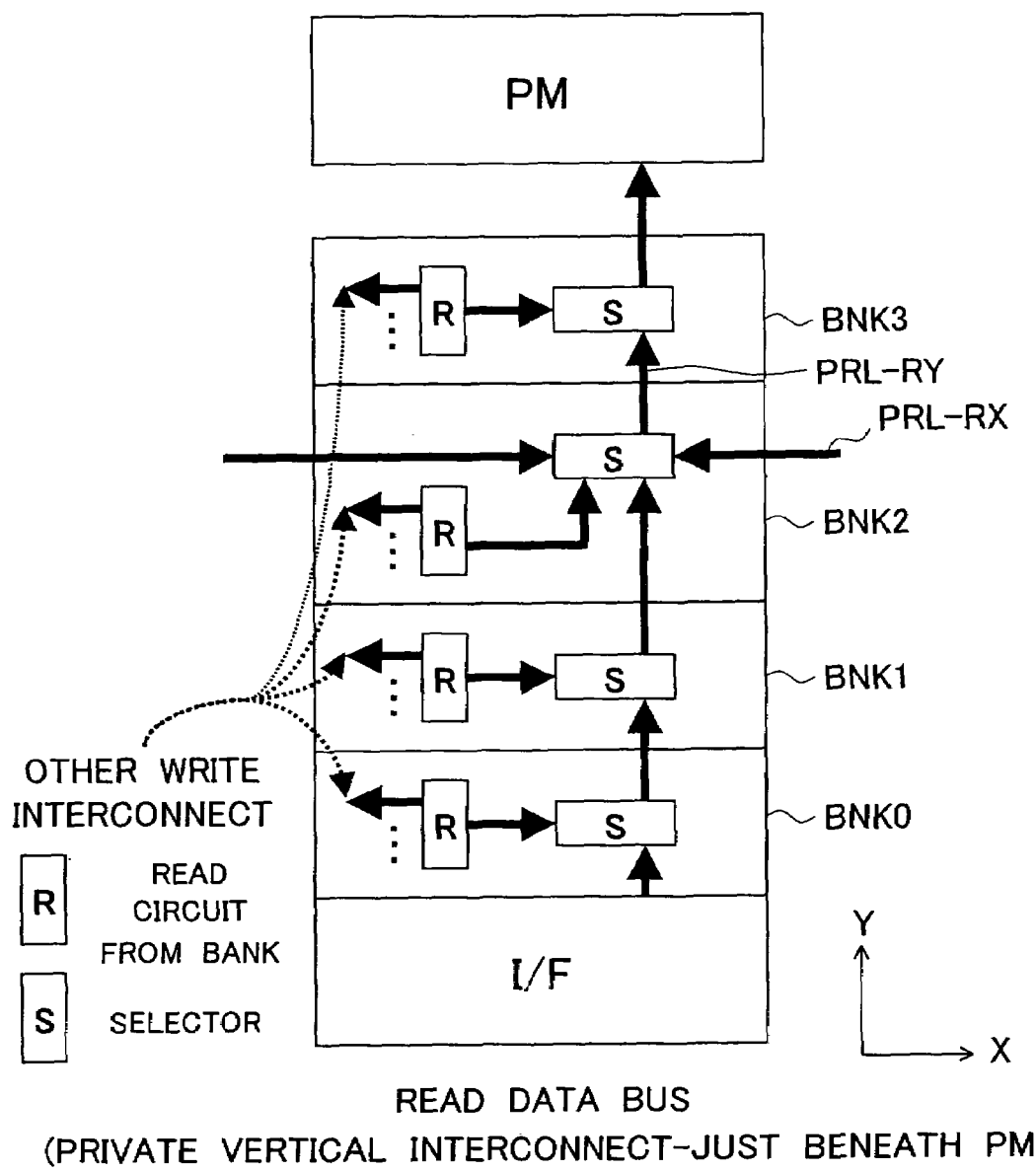
FIG. 28 is a diagram for explaining read data bus interconnects in the vertical direction (Y-direction, first direction) and explains the read data buses in the vertical direction (Y-direction, first direction) from the processing modules up to the memory interface I/F just beneath the modules.
Figure 29:
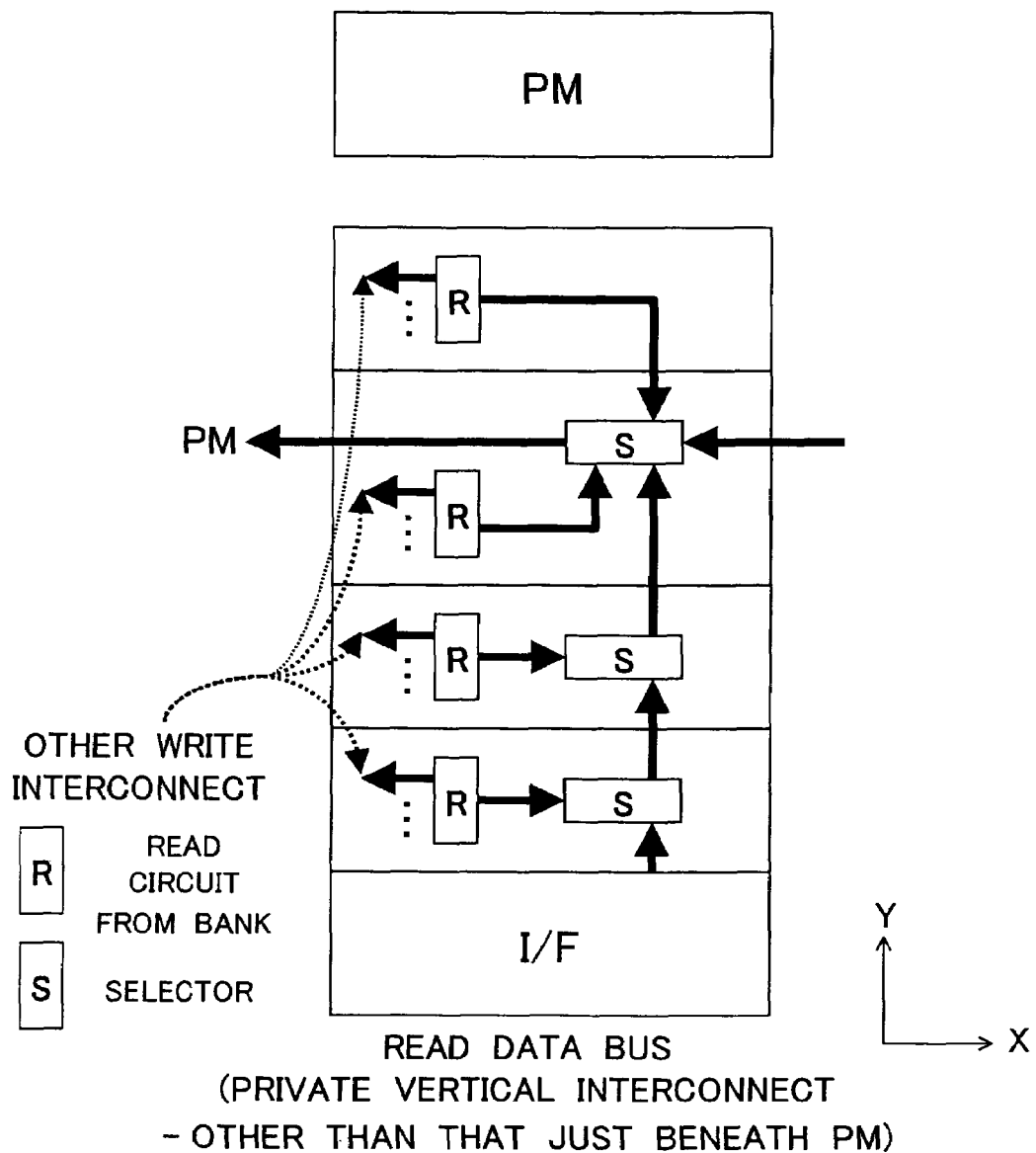
FIG. 29 is a diagram for explaining read data bus interconnects in the vertical direction (Y-direction, first direction) and explains the read data buses in the vertical direction (Y-direction, first direction) other than that just beneath the processing modules.
Figure 30:
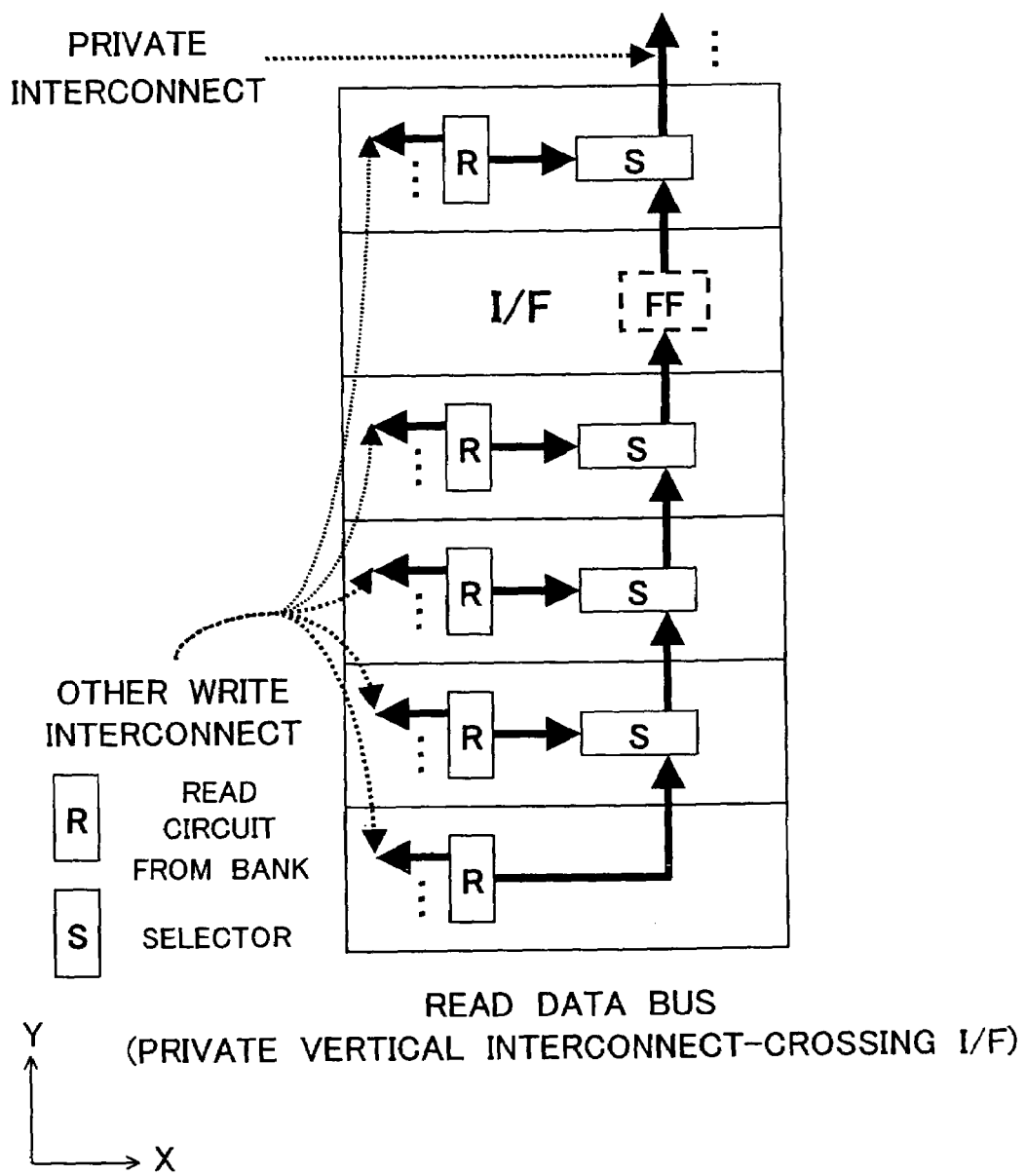
FIG. 30 is a diagram showing an example of providing a flip-flop FF in the memory interface I/F according to the level of delay.
Figure 31:
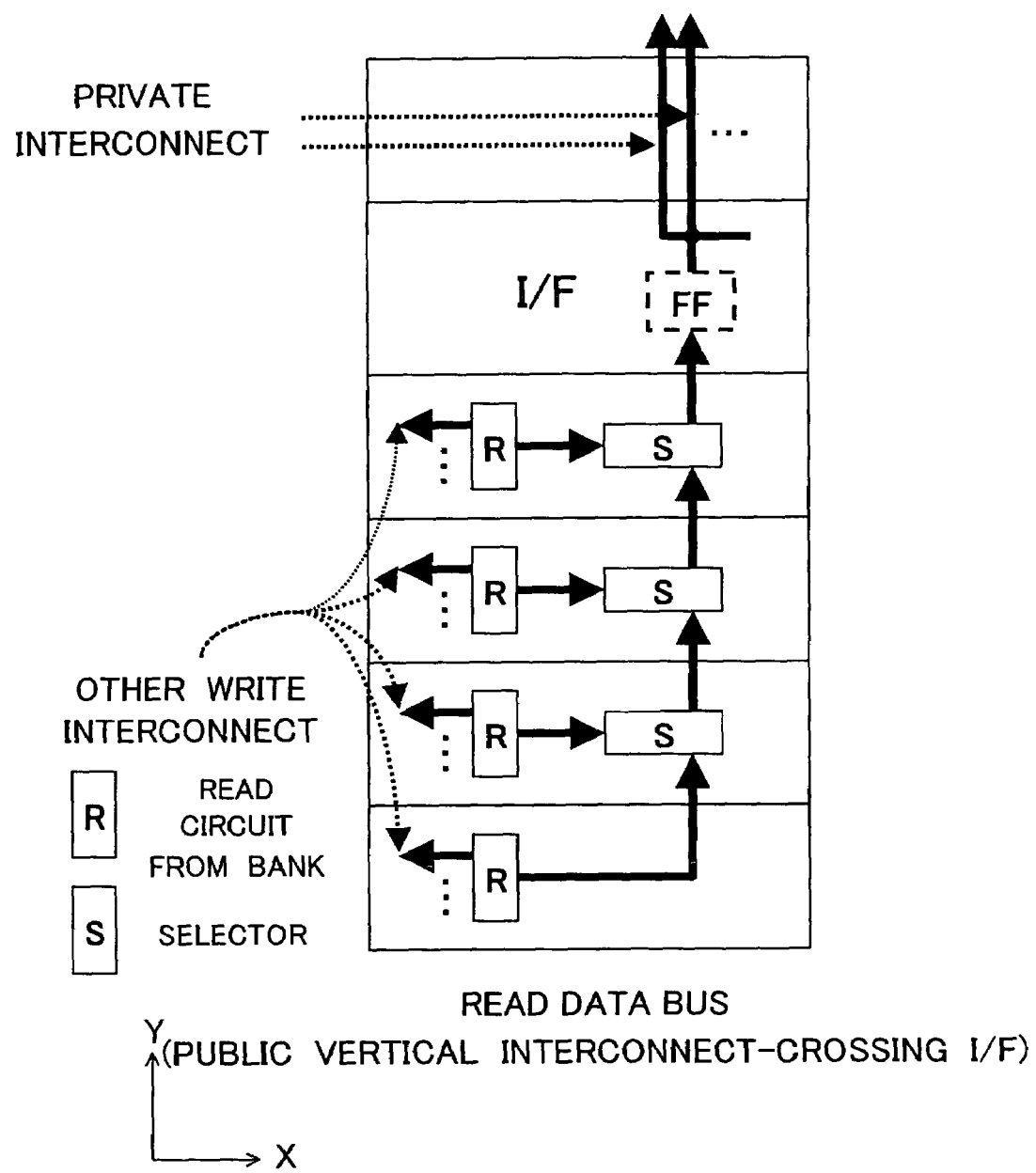
FIG. 31 is a diagram for explaining read data bus interconnects in the vertical direction (Y-direction, first direction) and shows an example of distributing interconnects to a plurality of private interconnects before the memory interface I/F in accordance with the situation of the interconnect resources and forming the same by public interconnects.

The vertical direction (Y-direction) read data buses from the processing modules PM to the memory interfaces I/F just beneath them are made private buses PRL-RY as shown in FIG. 28. The private read data buses PRL-RY are connected with the read data buses PRL-RX arranged in the horizontal direction (X-direction) by the selectors S (second bank BNK2 from the top of FIG. 28). The private vertical interconnects other than those just beneath the processing modules PM are, as shown in FIG. 29, connected with the read data buses PRL-RX through which the data is transferred from the horizontal direction (X-direction) by the selectors S. The read data is selectively transferred from there to the next horizontal direction (X-direction). The read data buses in the vertical direction (Y-direction) crossing over the memory interfaces I/F are not connected with the horizontal direction (X-direction) interconnects. Further, as shown in FIG. 30, data is once latched by a flip-flop FF in each memory interface I/F and transferred according to the level of delay. When crossing over a memory interface I/F, as shown in FIG. 31, in accordance with the situation of the interconnect resources, an interconnect is divided into a plurality of private interconnects before the memory interface I/F and formed by public interconnects. Private interconnects are dedicated interconnects for specific processing modules PM, therefore, when the number of processing modules PM increases, enormous interconnect resources become necessary when connecting all privately. In this case, the common connection format is employed for interconnects other than those just beneath the processing modules.

Vertical Direction (Y-Direction, First Direction) Data Bus Interconnects (Common)

Figure 32:
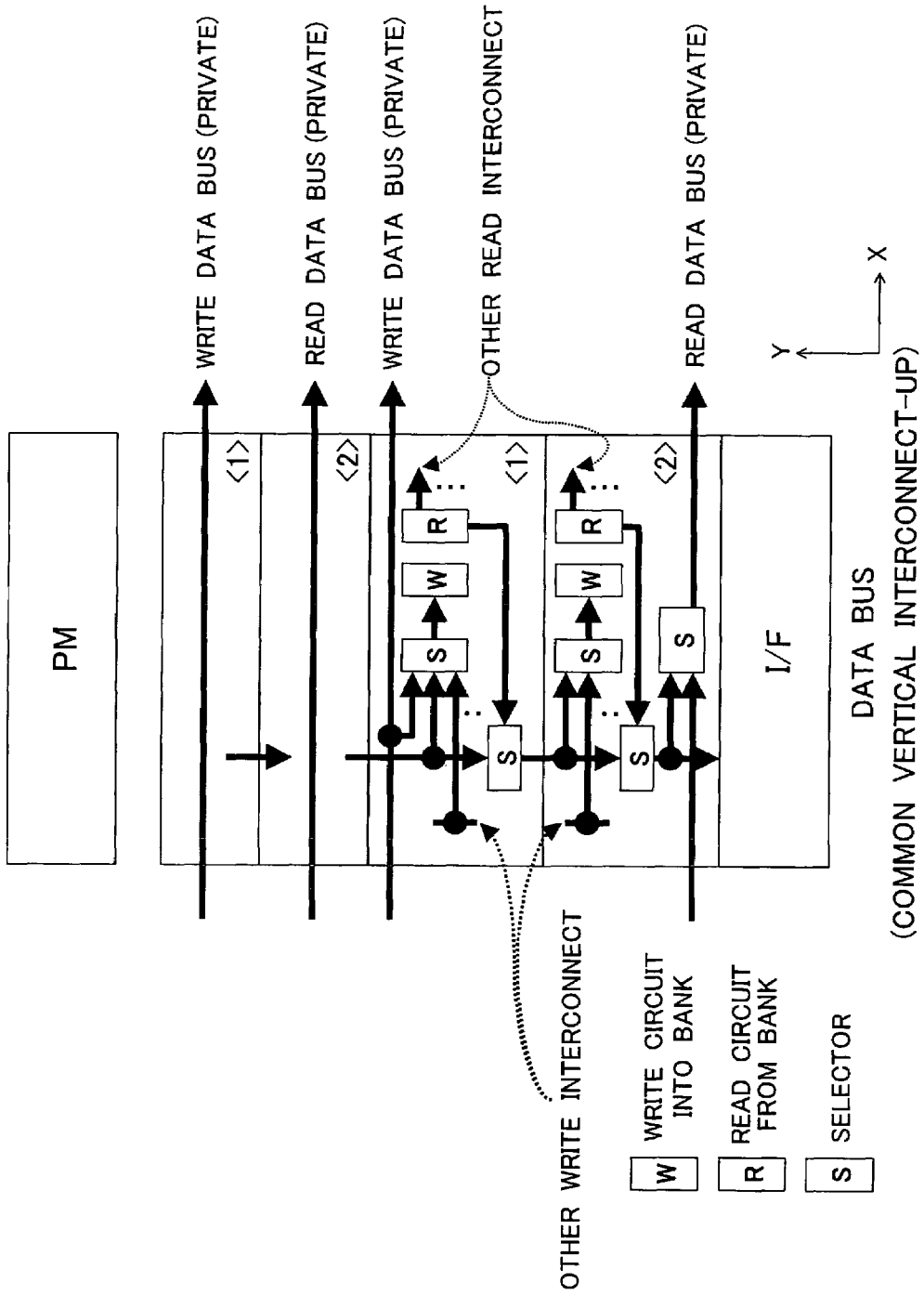
FIG. 32 is a diagram for explaining a data bus interconnect (common) in an up direction in the vertical direction (Y-direction, first direction)
Figure 33:
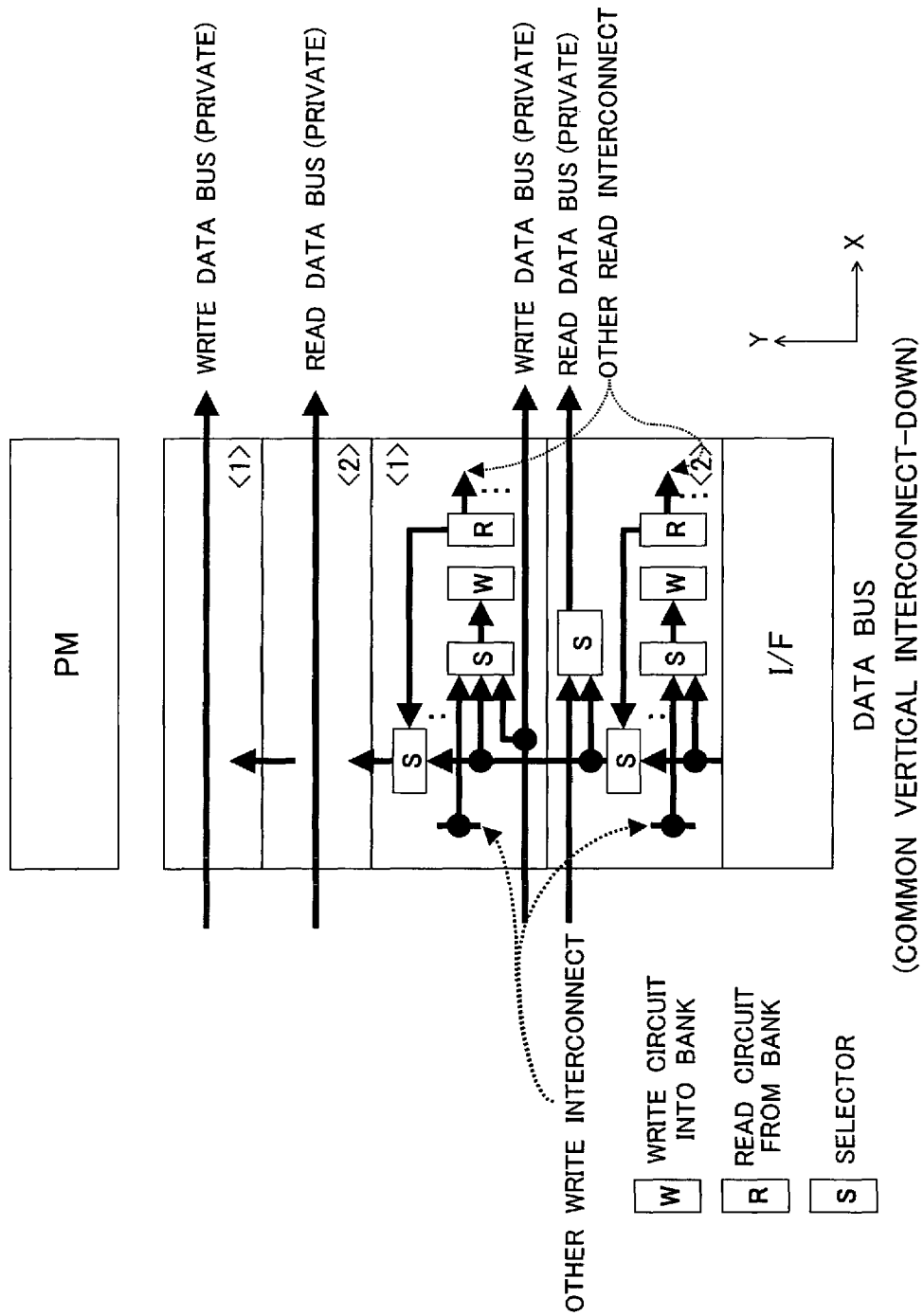
FIG. 33 is a diagram for explaining a data bus interconnect (common) in a down direction in the vertical direction (Y-direction, first direction)

When the interconnect resources are limited, it becomes possible to reduce the amounts of interconnects due to the data buses in the vertical direction (Y-direction) by common interconnects. Common interconnects are not differentiated as to read and write interconnects, but as shown in FIG. 32 and FIG. 33, the interconnects are formed in directions in which the data flows. For convenience, the direction toward a memory interface I/F will be referred to as "up", while the direction away from a memory interface I/F will be referred to as "down". The common interconnects are configured as shown in <1> of FIG. 32 and <1> of FIG. 33 when write data buses are arranged in the horizontal direction (X-direction). Further, the common interconnects are configured as shown in <2> of FIG. 32 and <2> of FIG. 33 when read data buses are arranged in the horizontal direction (X-direction).

I/F Configuration

Figure 34:
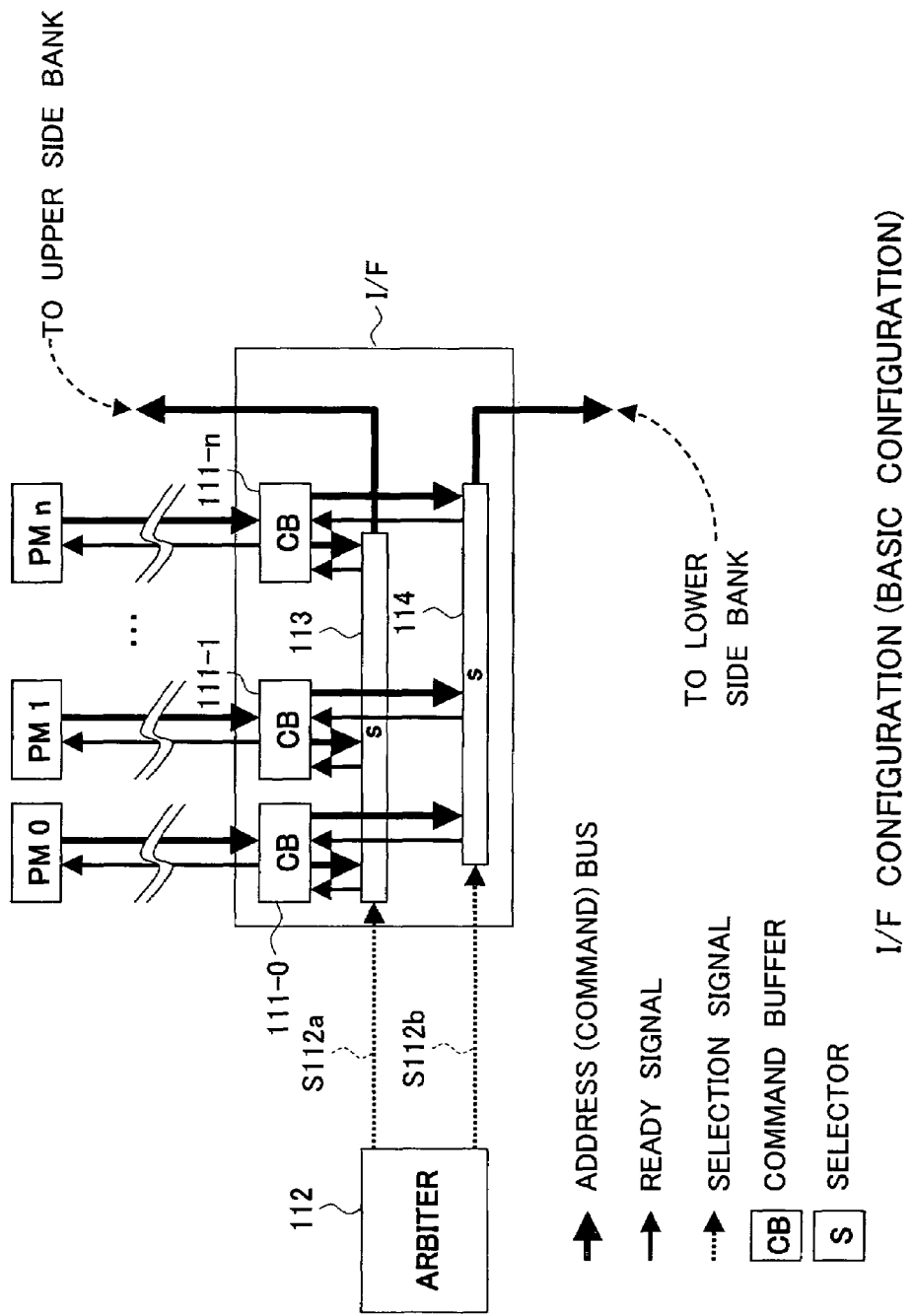
FIG. 34 is a diagram showing the basic configuration of the memory interface I/F according to the present embodiment.
Figure 35:
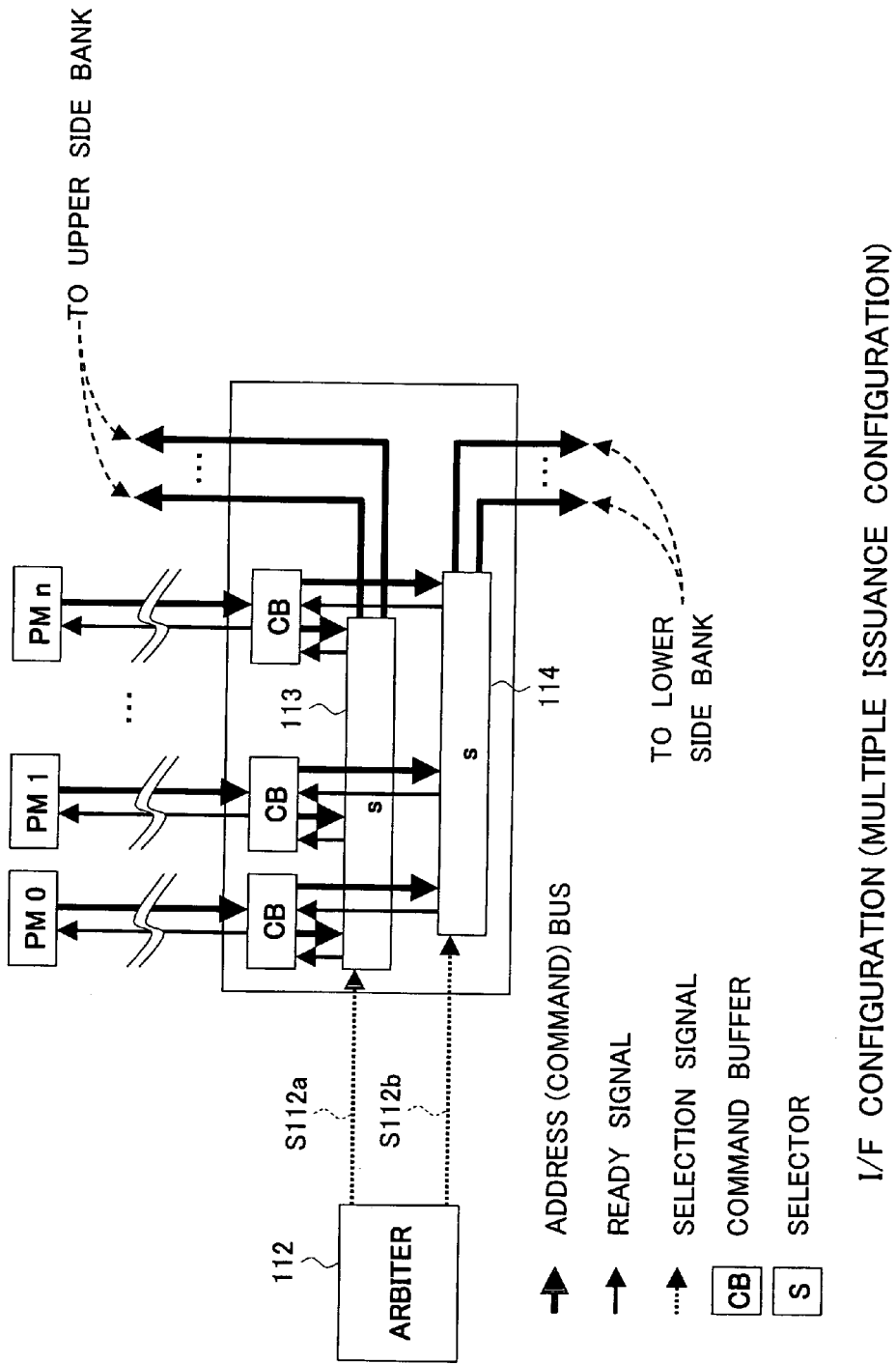
FIG. 35 is a diagram showing another example of the configuration of the memory interface I/F according to the present embodiment.
Figure 36:
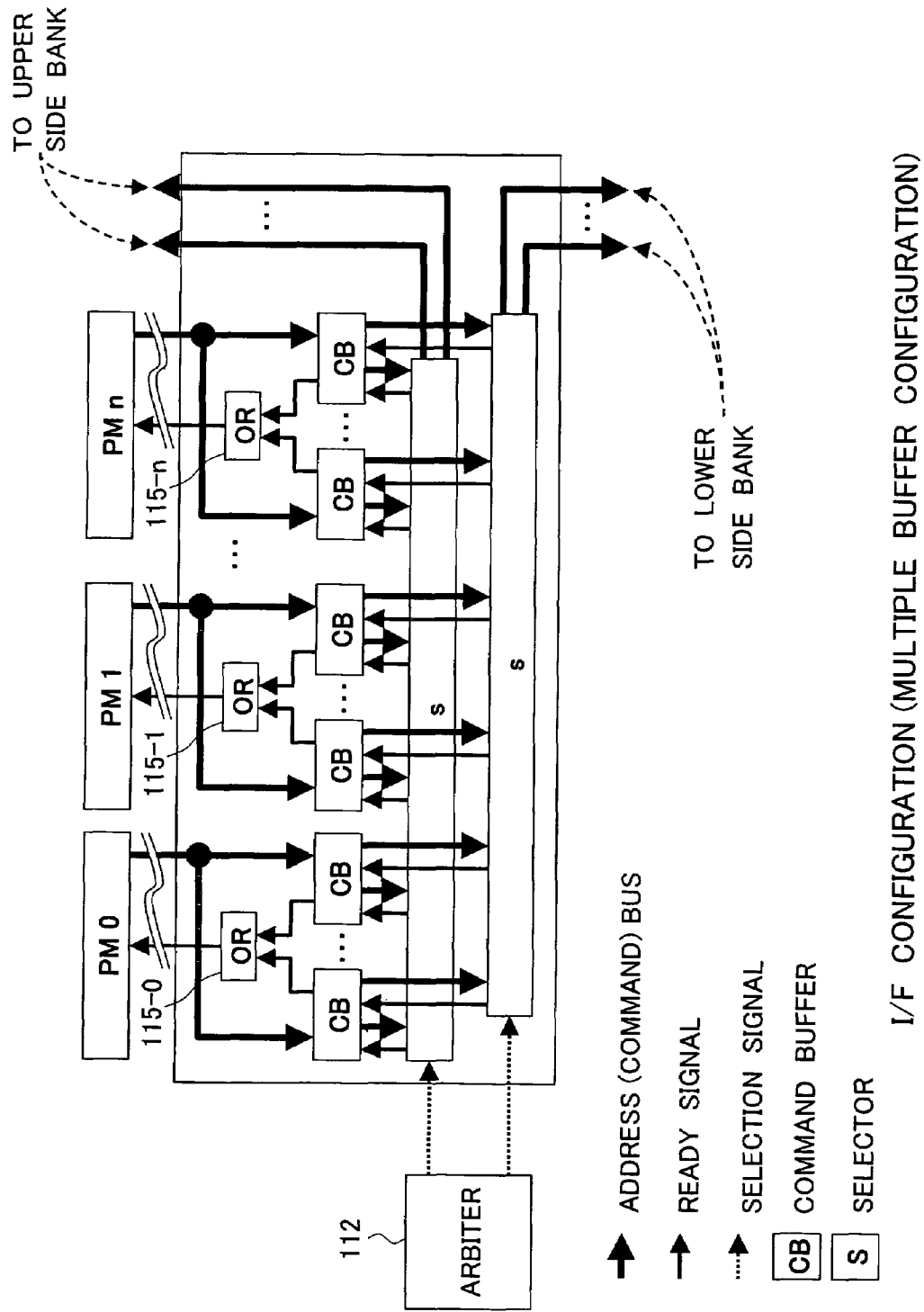
FIG. 36 is a diagram showing still another example of the configuration of the memory interface I/F according to the present embodiment.

The memory interface I/F performs processing for arbitrating commands sent from processing modules PM and issuing a command when resources of the banks in the macro are available. As the basic configuration, as shown in FIG. 34, the memory interface has at least each one command buffer (hereinafter abbreviated as "CB") 111-0 to 111-n corresponding to the processing modules PM, an arbiter 112, and selectors (S) 113 and 114. The arbiter 112 selects and issues commands which can be issued among commands in CB111-0 to CB111-n by selection signals S112a and S112b. The arbiter can simultaneously issue commands to the bank of the memory system on the upper side (first side) in the Y-direction (first direction) from the memory interface I/F and the bank of the memory system on the lower side (second side). Further, as shown in FIG. 35, where the interconnect resources permit it, a plurality of command interconnects can be laid to each of the upper side and lower side. Further, when the area permits it, as shown in FIG. 36, it is also possible to provide a plurality of CBs. In this case, OR gates 115-0 to 115-n are provided in the transfer route to for example the upper side processing modules PM.

Vertical Direction (Y-Direction, First Direction) Address Bus Interconnects

Figure 37:
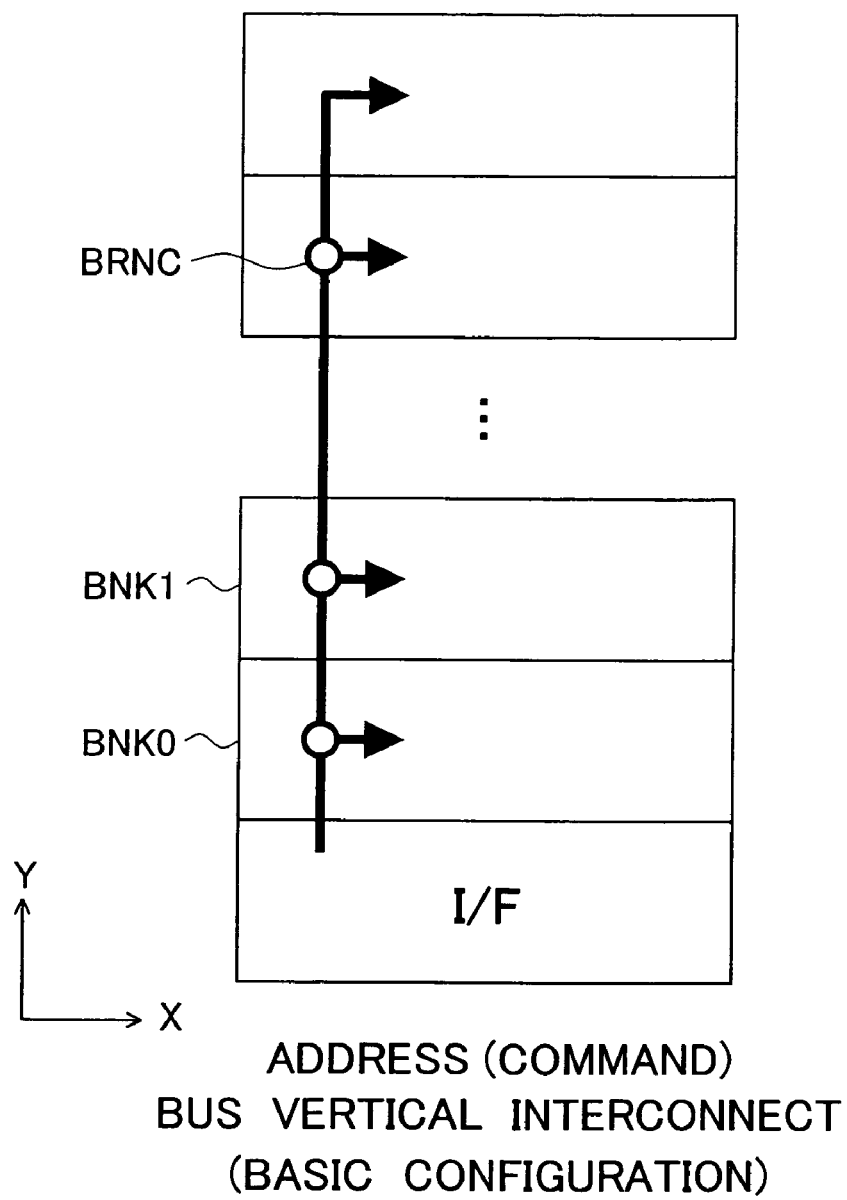
FIG. 37 is a diagram for explaining a basic command address bus interconnect in the vertical direction (Y-direction, first direction)
Figure 38:
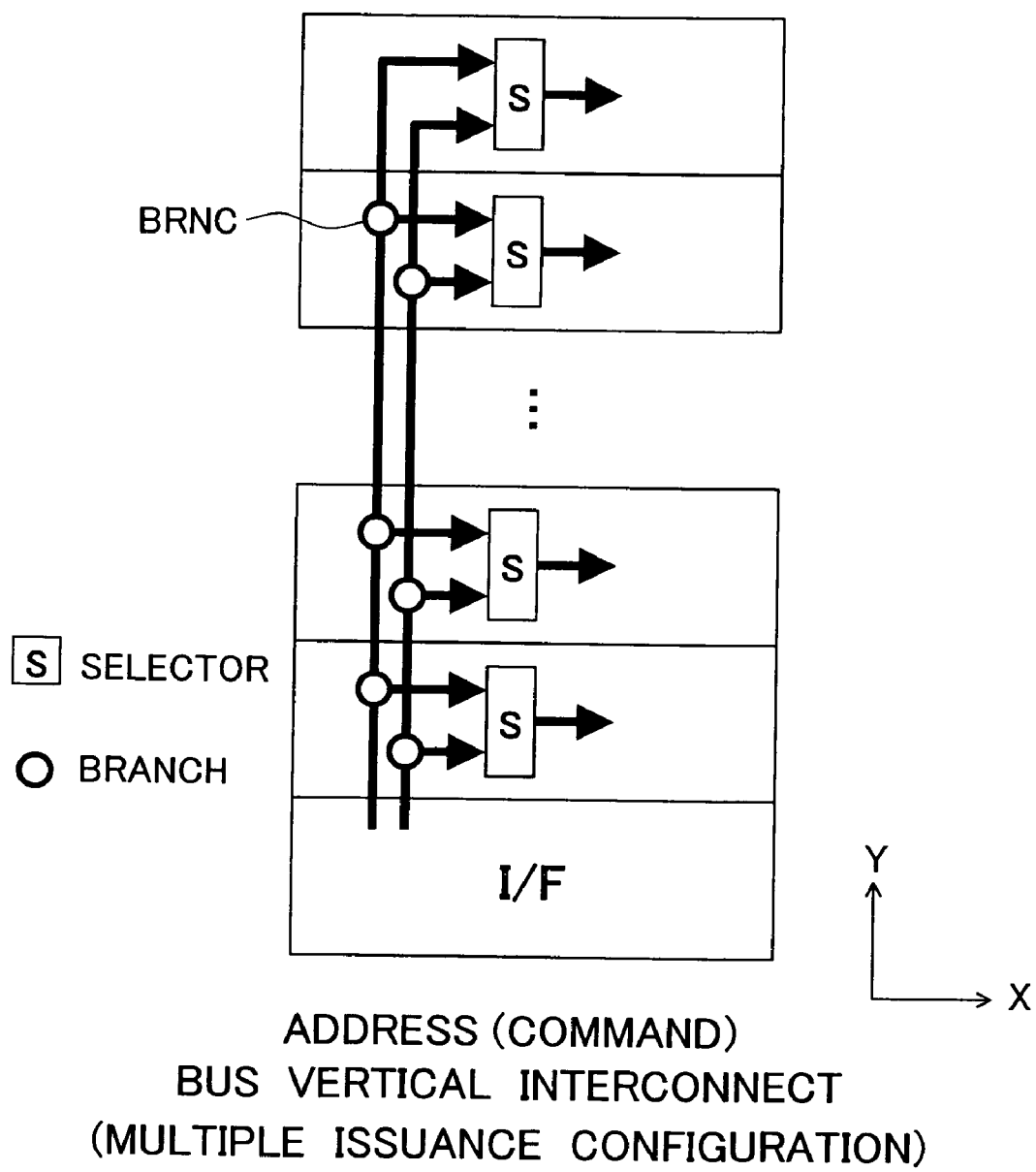
FIG. 38 is a diagram for explaining the command address bus interconnect of a multiple issuance configuration in the vertical direction (Y-direction, first direction).

As shown in FIG. 37, basically, an address (command) issued from a memory interface I/F is transferred in the vertical direction (Y-direction) and branched at the branch BRNC in accordance with the bank of the access destination. Further, as shown in FIG. 35 or FIG. 36, when the interconnect resources permit it and a plurality of address interconnects can be laid, as shown in FIG. 38, the command may be finally input to the bank through the selector (S).

Figure 39:
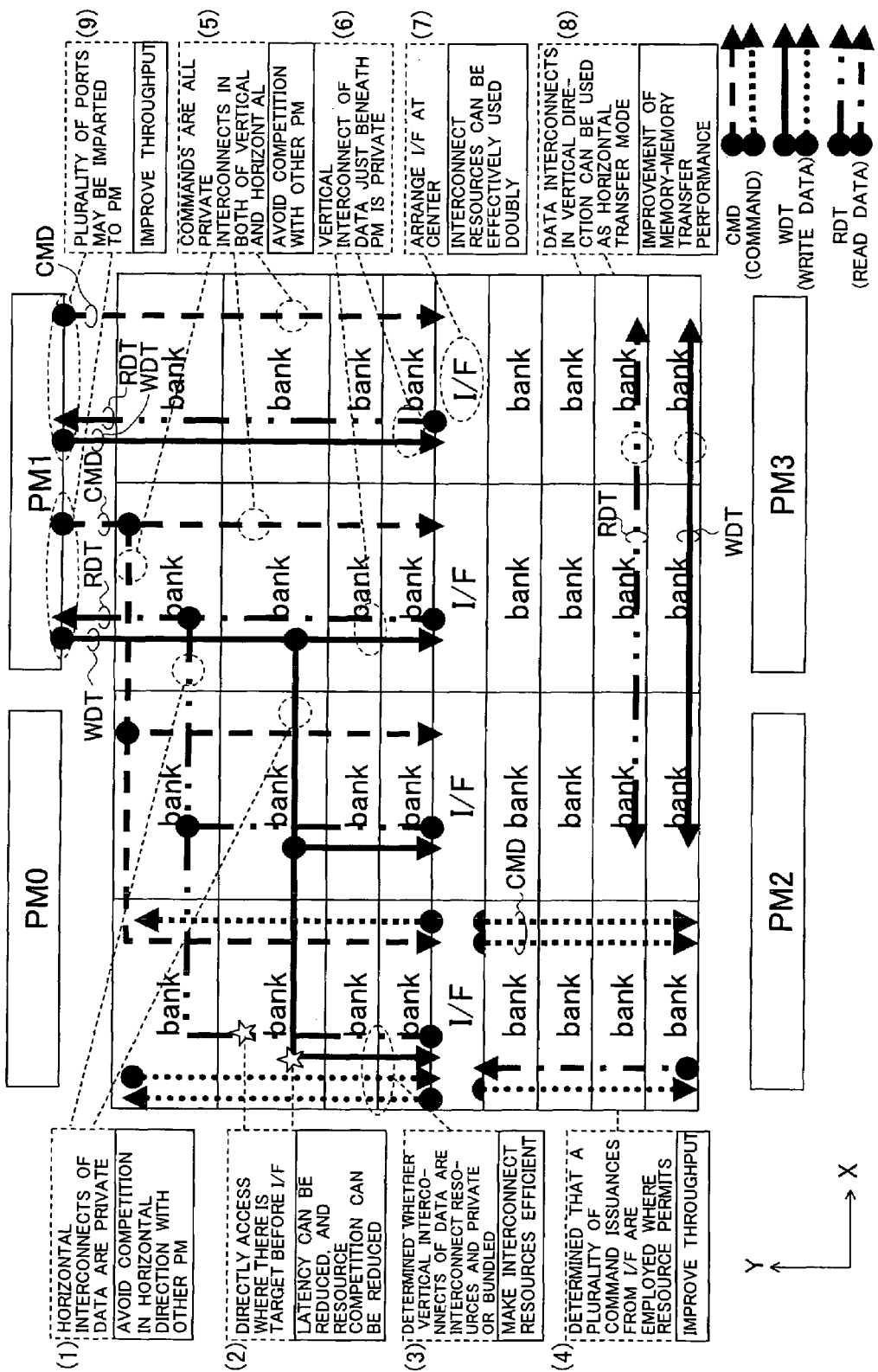
FIG. 39 is a diagram showing the basic configuration of a shared memory device and characteristic features of the connection interconnects according to the present embodiment all together.

FIG. 39 is a diagram showing the basic configuration of a shared memory device and characteristic features of connection interconnects according to the present embodiment explained above all together.

In FIG. 39, CMD indicates a command system interconnect, WDT indicates a write data interconnect, and RDT indicates a read data interconnect.

The basic configuration of the shared memory device and characteristic features (1) to (9) of the connection interconnects according to the present embodiment are as follows.

(1) The X-direction (horizontal) interconnects of the data are made private interconnects in order to avoid competition with other processing modules PM in the horizontal direction.

(2) When there is a target before the memory interface I/F, direct access is made. Due to this, the latency is shortened, and the resource competition can be reduced.

(3) The Y-direction (vertical) interconnects of the data are interconnect resources. Whether to make them private or bundled is determined. Due to this, a higher efficiency of interconnect resources can be achieved.

(4) A command is issued a plurality of times from the memory interface I/F when the resources permit it. Due to this, improvement of the throughput can be achieved.

(5) The commands in both of the Y-direction (vertical direction) and the X-direction (horizontal direction) are issued through private interconnects. Due to this, competition with the other processing modules PM can be avoided.

(6) The Y- (vertical) direction interconnects just beneath the processing modules PM of the data are made private interconnects. Due to this, competition with other processing modules PM can be avoided.

(7) The memory interfaces I/F are arranged at the center in the Y-direction (first direction). Due to this, the interconnect resources can be effectively utilized doubly.

(8) The data interconnects in the X-(horizontal) direction can be used for the horizontal transfer mode. Due to this, an improvement of the memory-memory transfer performance can be achieved.

(9) A plurality of ports may be given to the processing modules PM. Due to this, an improvement of the throughput can be achieved.

As explained above, according to the first embodiment, there is provided a memory system mounting a plurality of memory banks wherein bus systems are constructed above (or on) the memory macros so as to enable higher speed (higher throughput) memory access than a shared memory system using usual X-bars etc. Further, by constructing buses between memory banks by utilizing the interconnects of the bus system configured as in FIG. 4 etc., high speed memory-memory data transfer can be achieved with almost no increase of the circuit size. Further, the interconnects are laid on the memory macros, therefore direct access is possible when an interconnect passes over the bank of the access destination, therefore access with a low latency can be achieved. Further, a system changing the method of laying the interconnects by tradeoff of the needed performance and interconnectability can be constructed, that is, a system can be constructed in accordance with the number of processing modules PM, the interconnect resources, and the needed performance. Further, by providing a plurality of ports with the memory system in one processing module PM, a system offering further higher performance can be achieved without consuming the resources (area). Further, when the number of processing modules PM increases, the number of interconnects also increase, but a system can be constructed changing the bus configuration in accordance with the bus width.

Figure 40:
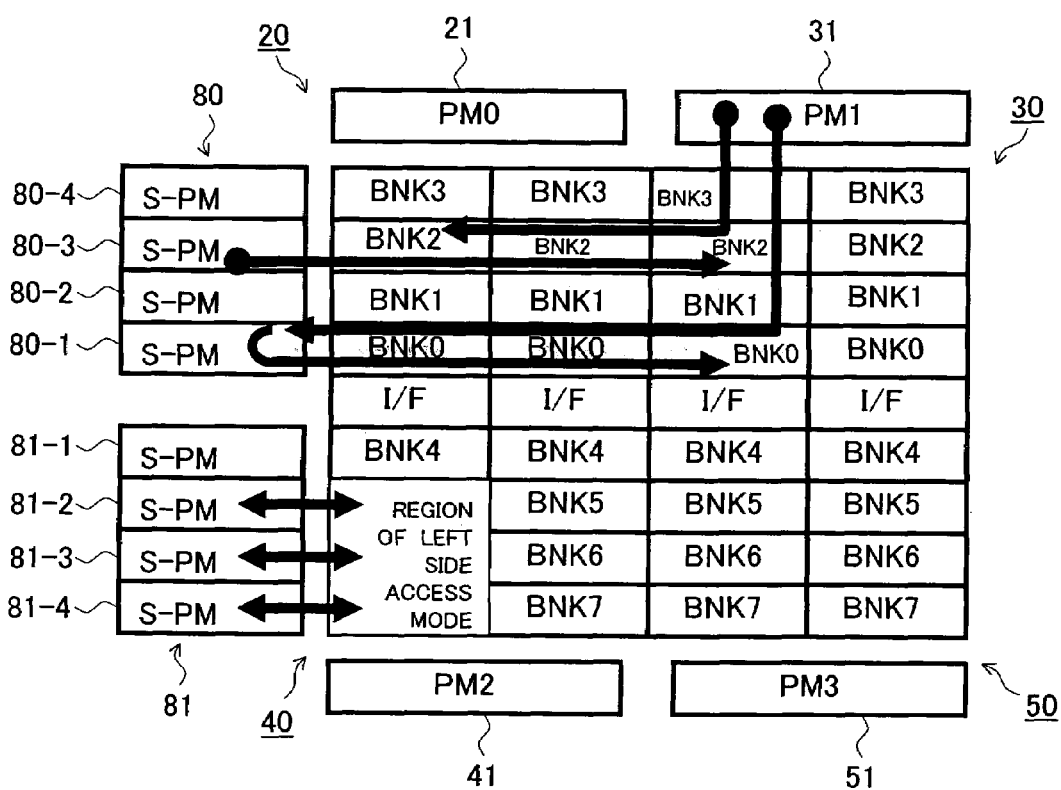
FIG. 40 is a diagram of the system configuration of a shared memory device according to a second embodiment of the present invention.

FIG. 40 is a diagram of the system configuration of a shared memory device according to a second embodiment of the present invention.

The second embodiment differs from the above first embodiment on the point that at least one side (left side in FIG. 40) of the arrangement region of the memory macros of the access clusters 20 and 40 in the X-direction (second direction) is provided with sub processing module groups 80 and 81 able to selectively access a predetermined at least one memory bank of the plurality of memory macros in the X-direction (second direction).

The sub processing module group 80 is configured by four sub processing modules 80-1 to 80-4 arranged in accordance with the number of banks of the memory macros of the access clusters 20 and 30. The sub processing module group 81 is configured by four sub processing modules 81-1 to 81-4 arranged in accordance with the number of banks of the memory macros of the access clusters 40 and 50.

In FIG. 40, among the group of memory banks on the left side, the banks 421-2, 421-3, and 421-4 of the memory macro 421 of the access cluster 40 are regions accessed in the horizontal transfer mode (hereinafter abbreviated as "MST"), and the remaining memory banks are normal access regions. The processing modules 21, 31, 41, and 51 can switch the data of memories without suspending the processing by accessing the normal access regions, inputting/outputting data from the horizontal direction, and sequentially switching the modes for each bank. In this way, when using the horizontal transfer mode, sub processing modules are arranged in the horizontal (X) direction. In this case, a sub processing module may uniquely access a region (bank) switched in transfer mode or may access a region by receiving a request from a processing module PM.

Figure 41:
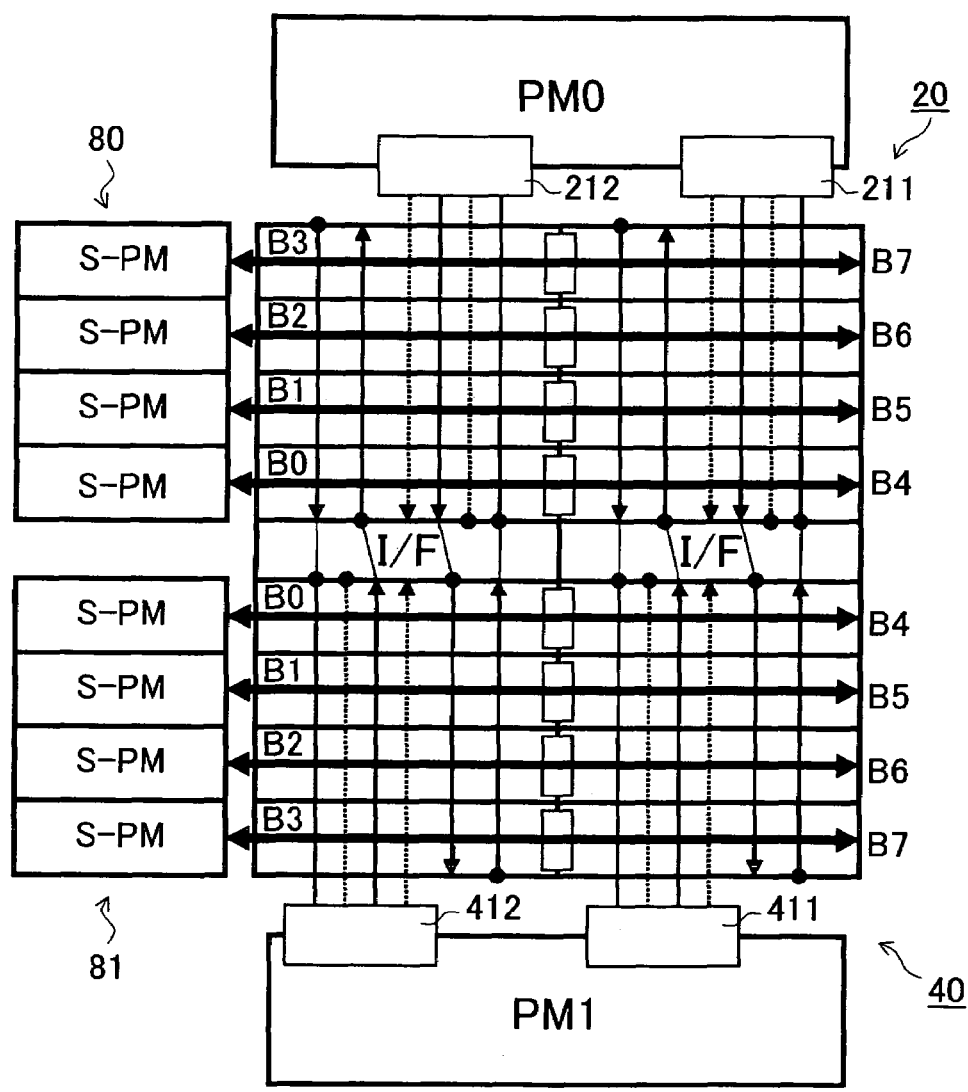
FIG. 41 is a diagram of the system configuration of a shared memory device according to a second embodiment of the present invention and shows an example of a configuration further improving performance by arranging a plurality of private interconnects.

When the number of processing modules PM is small, for example two, the number of needed vertical direction interconnects is also decreased, therefore room is formed in the interconnect region on the memory in many cases. In this case, as shown in FIG. 41, it is also possible to improve the performance more by laying a plurality of private interconnects. Conversely, when the number of the processing modules PM is large, for example six, the number of needed vertical (Y) direction interconnects increases, therefore the interconnect region on the memory becomes pinched. In this case, for example as shown in FIG. 16, it is also possible to reduce the bus width to increase the number of systems of the private interconnects. Further, as shown in FIG. 17, it is also possible to reduce the number of private interconnects to the minimum to increase the common interconnects without reducing the bus width. Any of these options may be selected according to the system requirements.

Below, an explanation will be given of the switching of the transfer mode in the second embodiment.

Switching of Transfer Mode

Figure 42:
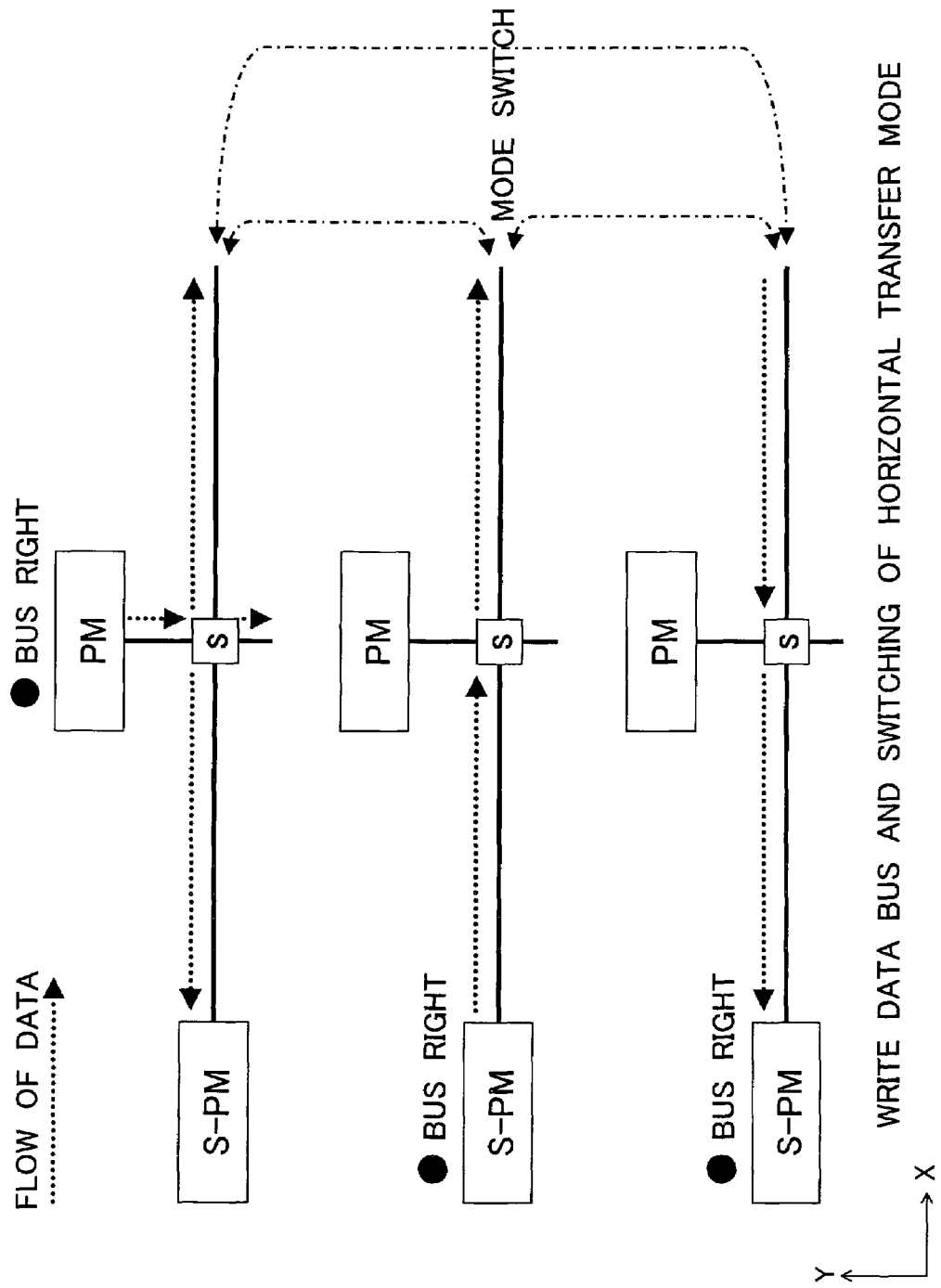
FIG. 42 is a diagram showing write data buses and switching of a horizontal transfer mode in the second embodiment.
Figure 43:
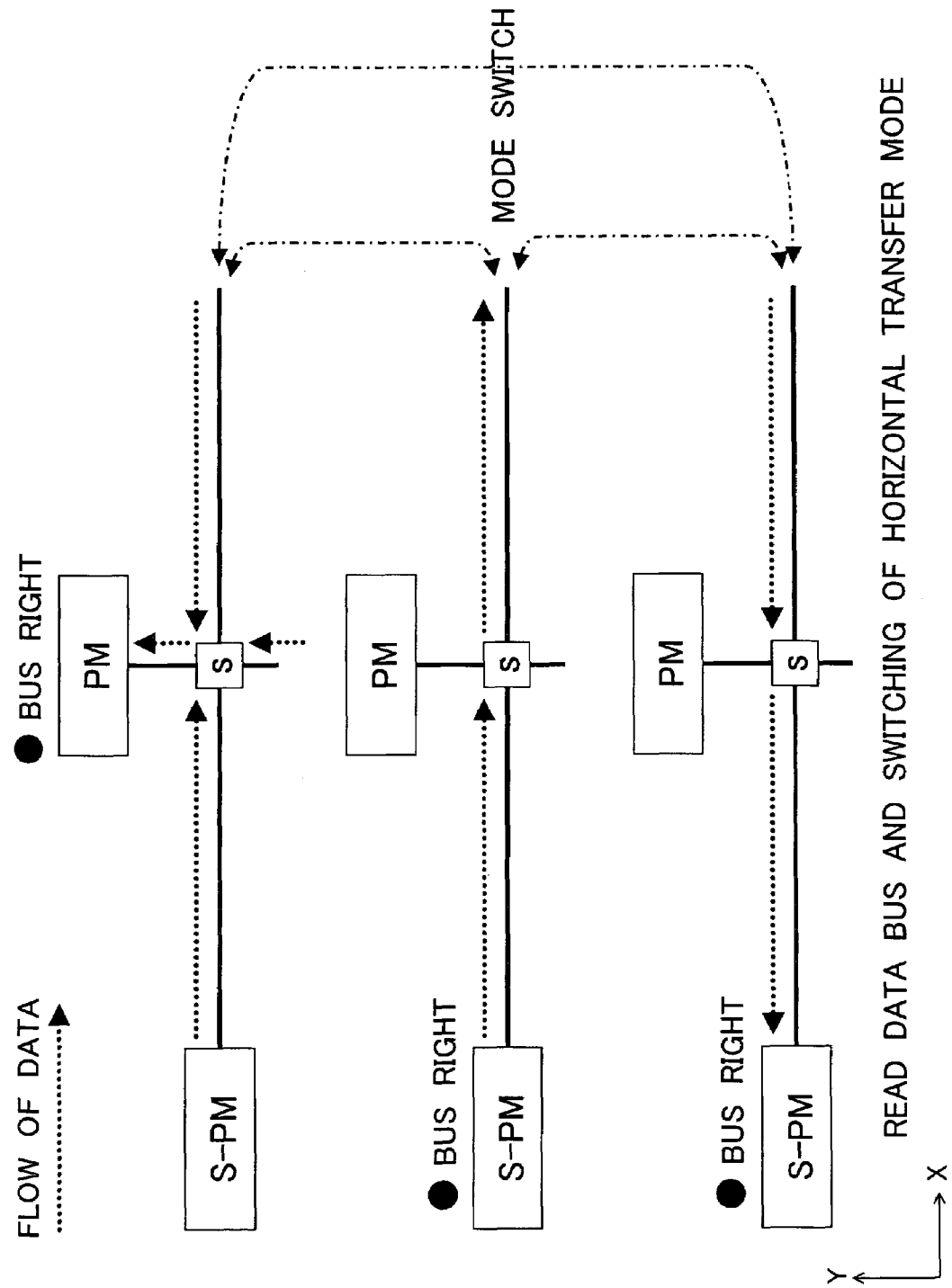
FIG. 43 is a diagram showing read data buses and switching of a horizontal transfer mode in the second embodiment.
Figure 44:
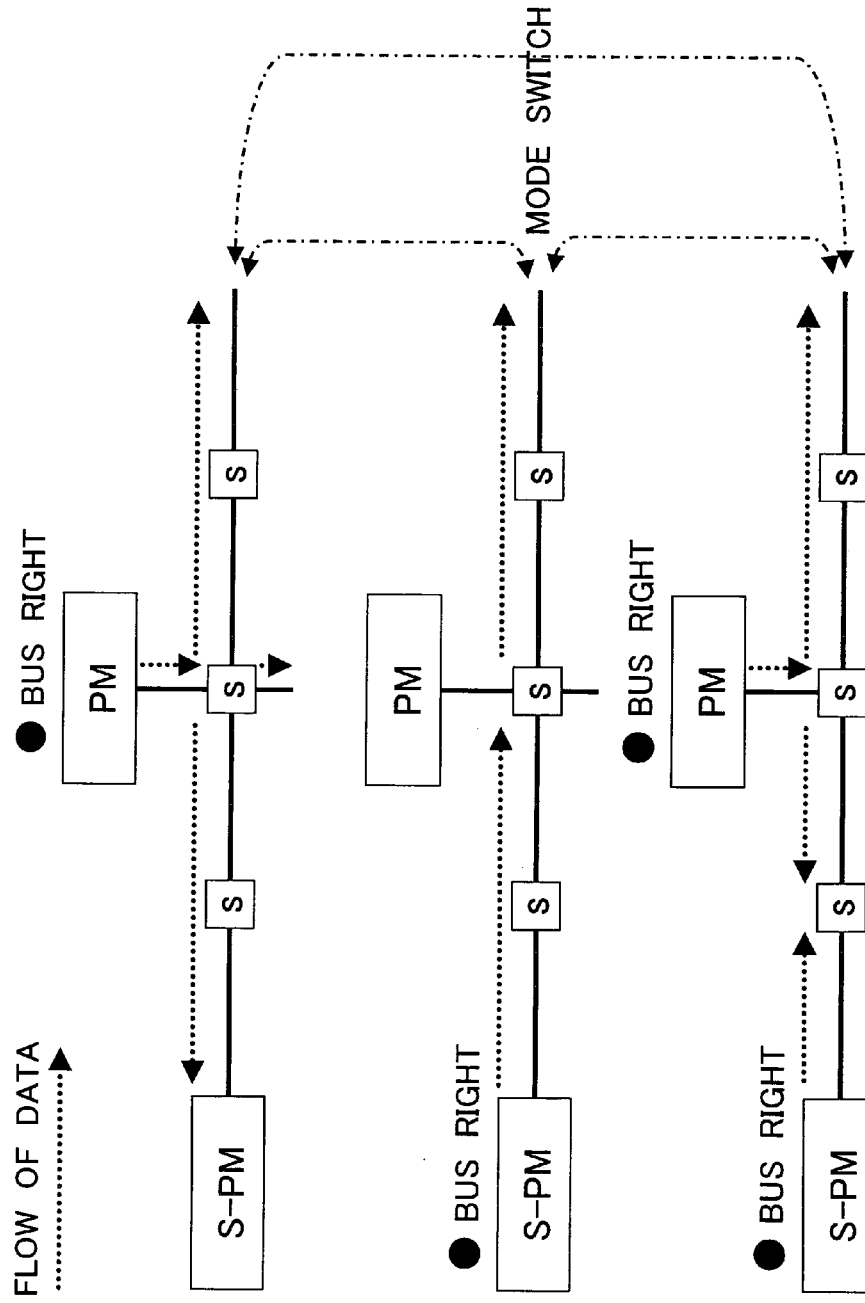
FIG. 44 is a diagram showing write data buses and partial switching of the horizontal transfer mode in the second embodiment.
Figure 45:
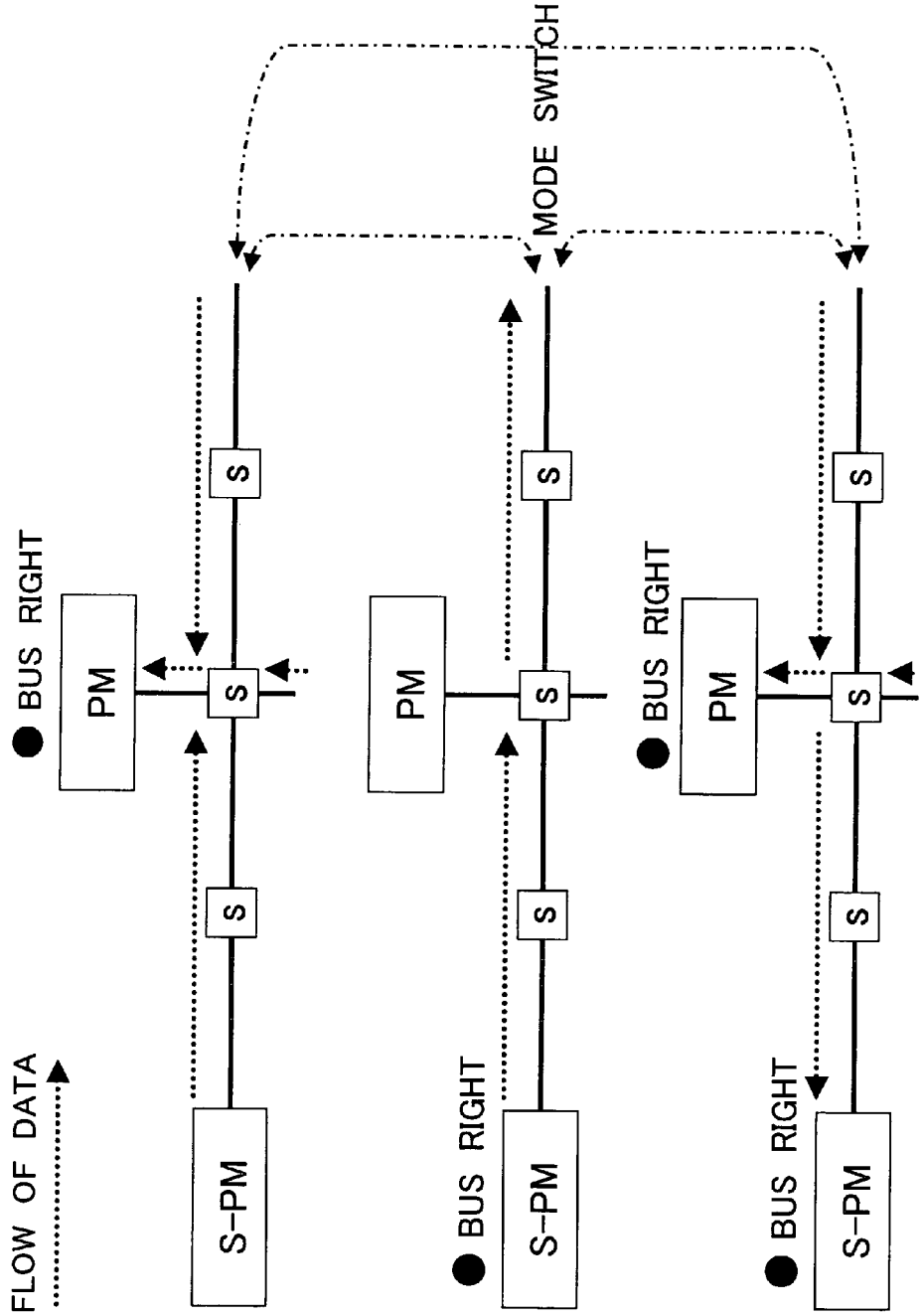
FIG. 45 is a diagram showing read data buses and partial switching of the horizontal transfer mode in the second embodiment.
Figure 46:
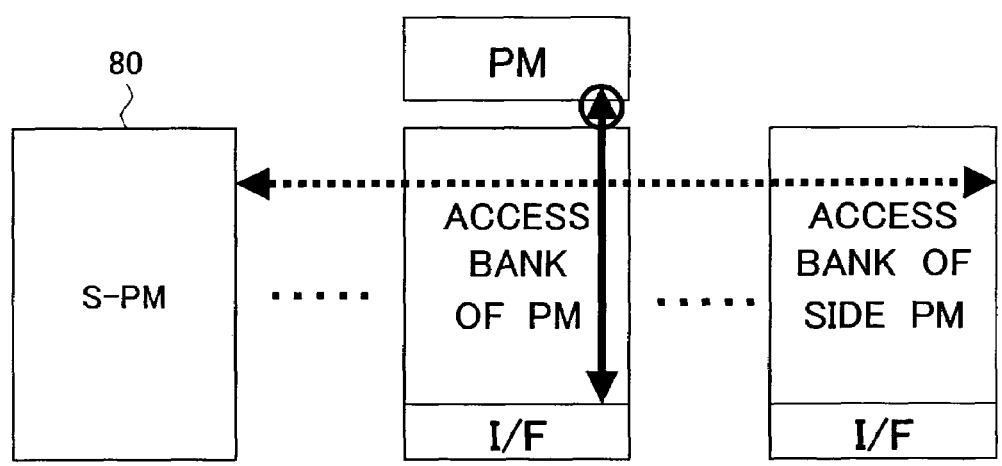
FIG. 46 is a diagram showing that the access is always possible with respect to a bank just beneath a processing module even in a case where the processing modules PM cannot use a horizontal direction data bus since they are placed under a management of a sub processing module S-PM.
Figure 47:
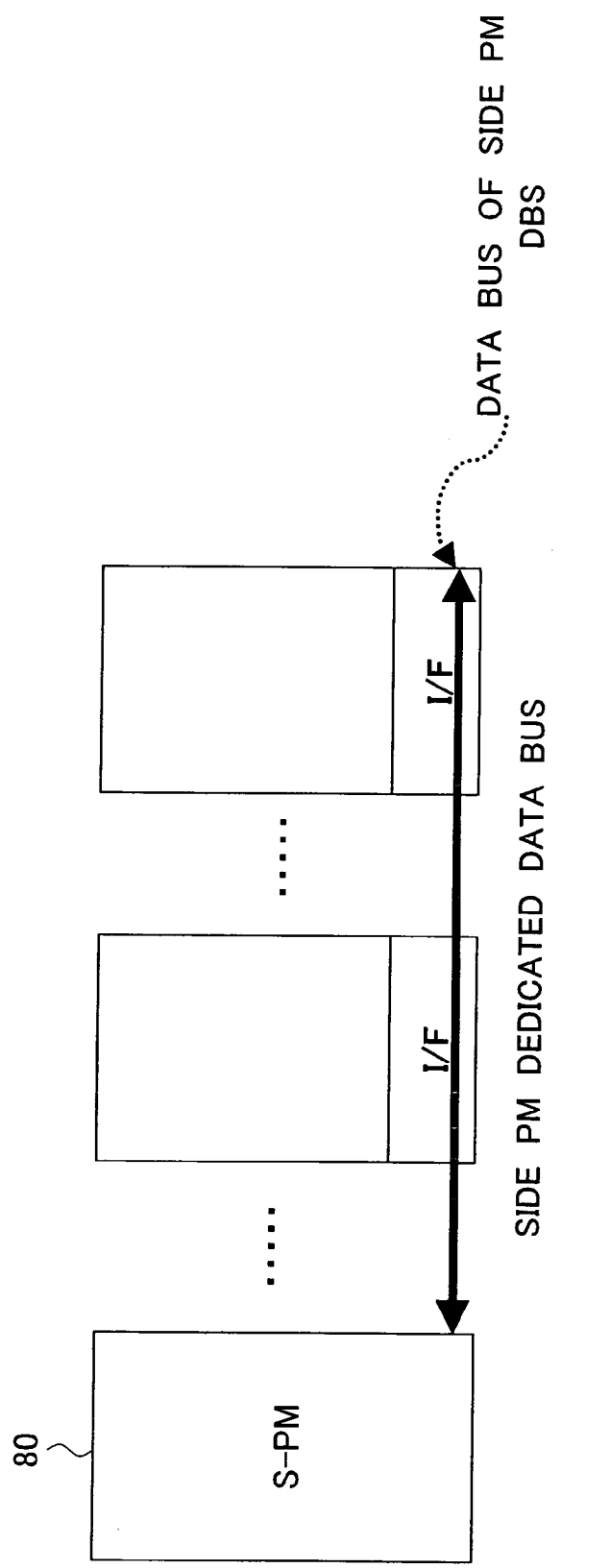
FIG. 47 is a diagram showing an example of arranging a data bus DBS dedicated to the horizontal direction on the memory interface I/F.

The read data buses and the write data buses in the horizontal (X) direction can be utilized for transfer to the horizontal direction by the switching of the mode as explained above. The mode can be switched, as shown in FIG. 42 and FIG. 43, for all interconnects in the horizontal (X) direction. Further, it is also possible to partially switch the mode as shown in FIG. 44 and FIG. 45. When switching to transfer in the horizontal direction, the interconnects are placed under the control of the sub processing module S-PM, therefore the processing modules PM cannot use the horizontal direction data buses. However, as shown in FIG. 46, it is possible to access the banks just beneath the modules. When there is little demand for horizontal direction transfer, as shown in FIG. 47, it is also possible to lay the data buses DBS dedicated to the horizontal direction on the memory interfaces I/F. In this case, switching of the transfer mode may be provided or not provided.

Figure 48:
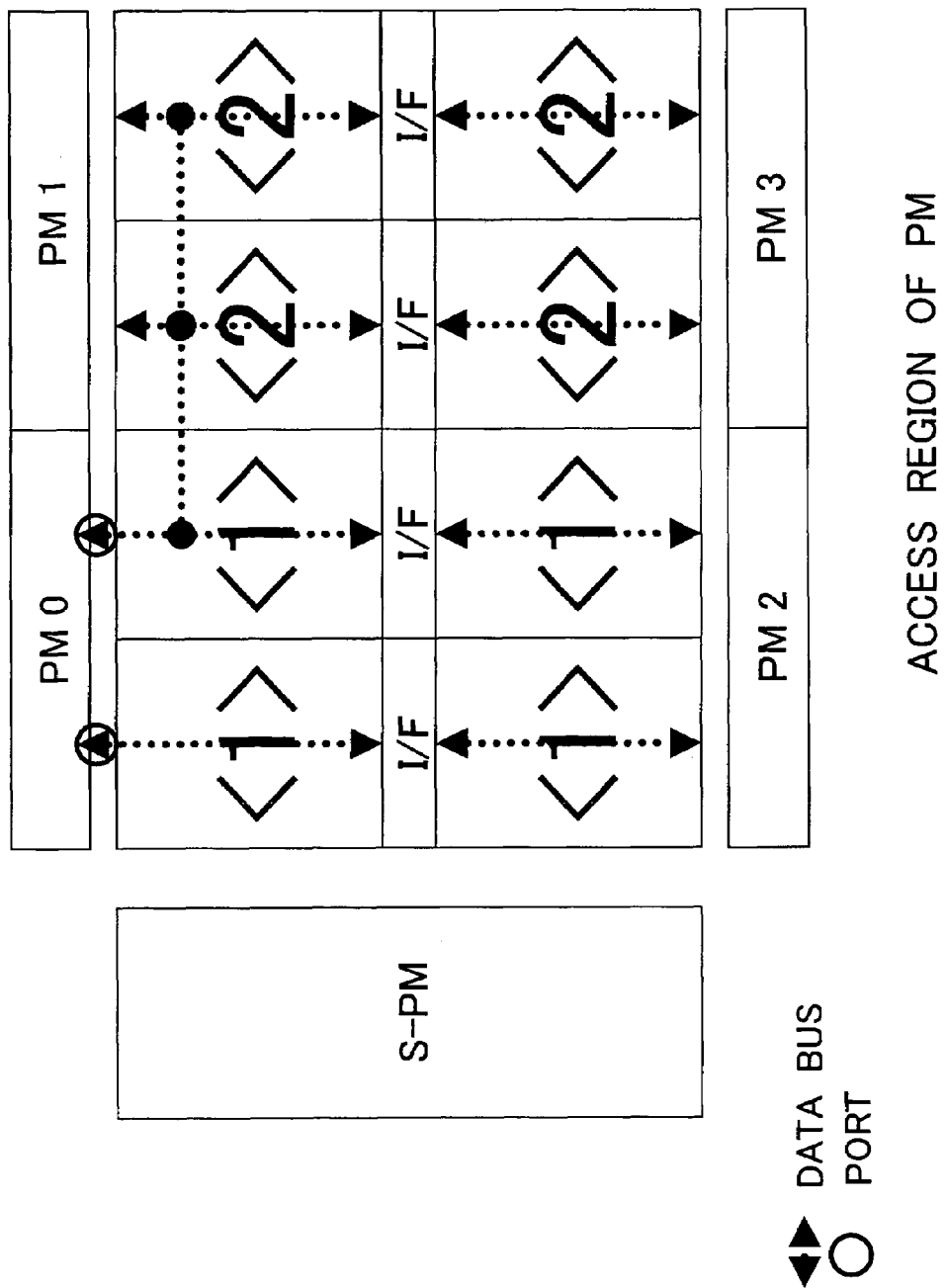
FIG. 48 is a diagram showing an example of a case of a four processing module PM configuration where each processing module PM has two ports as shown in FIG. 40.

FIG. 48 is a diagram showing an example of a case of a four processing module PM configuration where each processing module PM has two ports as shown in FIG. 40. In this example, the processing module 21 (PM0) uses only the vertical (Y) direction buses for regions indicated by <1> in the figure, therefore access is possible even when the horizontal (X) direction buses are released to the sub processing module S-PM, but for regions indicated by <2>, it is necessary to place the corresponding horizontal direction buses under the control of the processing module PM side.

Figure 49:
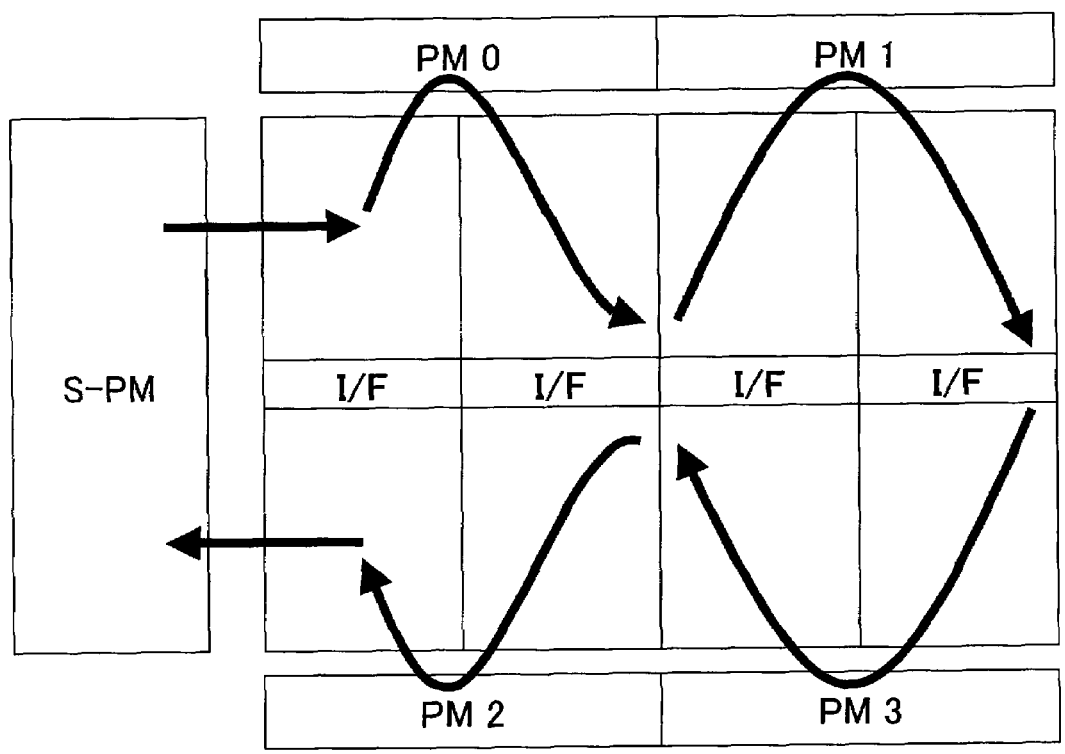
FIG. 49 is a diagram showing an example of processing in a case where the horizontal transfer mode is partially employed (partial MST)

When partially using the horizontal transfer mode (partial MST), if processing by the data flow as shown in FIG. 49, data can be processed without suspending the processing in the processing modules PM.

Connection Among Groups of Access Clusters

When the number of access clusters, in other words, the processing modules PM, increases, the interconnect resources become enormous. Accordingly, in practice, the amount of interconnects is suppressed by forming groups of a certain number of access clusters (processing modules PM), that is, access cluster groups 90, and, as shown in FIG. 50 to FIG. 53, connecting the access cluster groups 90 through a sub processing module 80 (S-PM).

Figure 50:
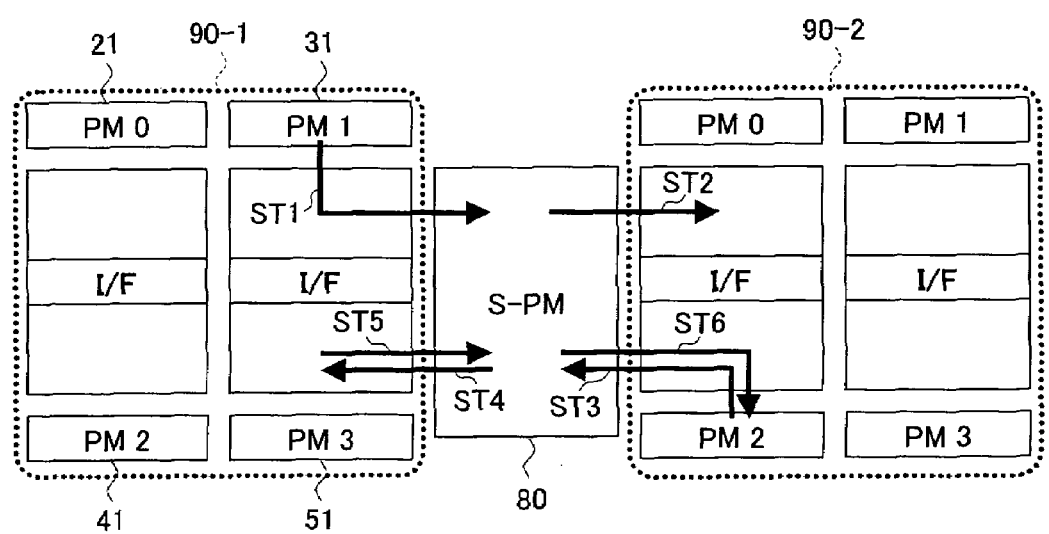
FIG. 50 is a diagram showing a first example of transfer between two access cluster groups through a sub processing module S-PM.
Figure 51:
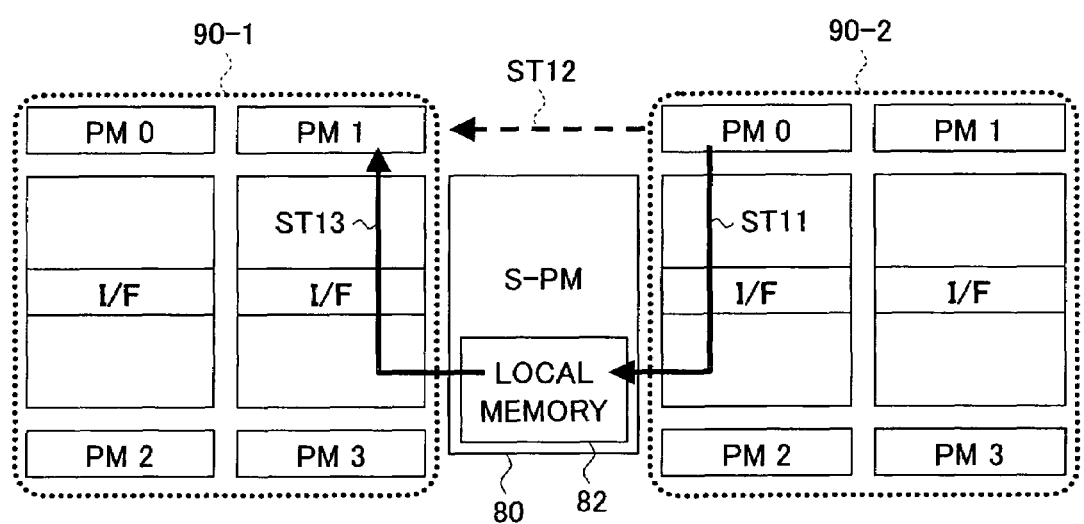
FIG. 51 is a diagram showing a second example of transfer between two access cluster groups through a sub processing module S-PM.

FIG. 50 and FIG. 51 are diagrams showing examples of transfer between two access cluster groups through a sub processing module S-PM. In this example, the access cluster groups 90-1 and 90-2 have the same configuration as the shared memory device of FIG. 4 etc.

In the example of FIG. 50, the processing module PM1 of the access cluster group 90-1 writes data into the region of the access cluster group 90-2. In this case, it issues a write request to the sub processing module S-PM first (ST1), whereupon the sub processing module S-PM writes the data (ST2). Further, the processing module PM2 of the access cluster group 90-2 in the same diagram reads out the data from the region of the access cluster group 90-1. In this case, it issues a read request to the sub processing module S-PM first (ST3), whereupon the sub processing module S-PM issues the read command to the corresponding region (ST4). The data is read out from the corresponding region (ST5), then the sub processing module S-PM returns the data to the processing module PM2 of the access cluster group 90-2 (ST6).

FIG. 51 shows an example of arranging a local memory 82 in a sub processing module 80 (S-PM) as a transferring means among access cluster groups.

In the example of FIG. 51, the processing module PM0 of the access cluster group 90-2 writes the data into the local memory 82 of the sub processing module 80 (S-PM) (ST11), the same processing module PM0 notifies it to the processing module PM1 of the access cluster group 90-1 (ST12), and the same processing module PM1 receiving the notification reads out the data from the local memory 82 of the sub processing module 80 (S-PM) (ST13).

Figure 52:
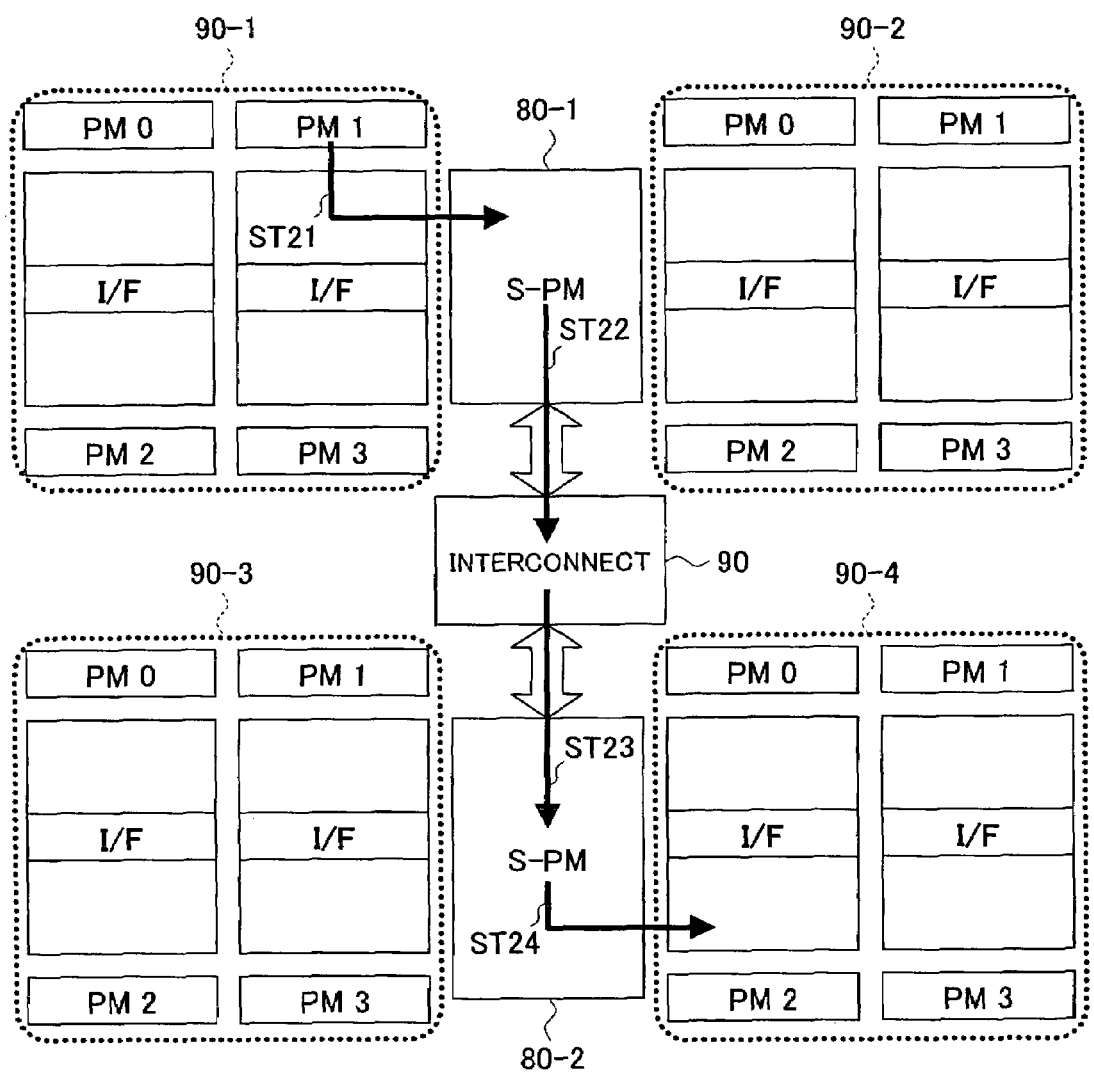
FIG. 52 is a diagram showing a configuration of network connection and an example of transfer among four access cluster groups through sub processing modules S-PM.

When the number of access cluster groups further increases, as shown in FIG. 52, it is also possible to connecting sub processing modules 80-1 and 80-2 to each other by the network interconnect portion 91.

In the example of FIG. 52, the processing module PM0 of the access cluster group 90-1 requests writing to the sub processing module 80-1 (ST21), the sub processing module 80-1 requests the writing to the network interconnect portion 91 (ST22), the network interconnect portion 91 requests the writing to the sub processing module 80-2 (ST23), and the sub processing module 80-2 performs the writing in the predetermined region of the access cluster group 90-4 (ST24).

In this way, when the number of access cluster groups is increased, the interconnect region increases. However, it is not always necessary to equivalently share all memories among all processing modules PM. For example, when one series of processing is carried out among some access cluster groups, the frequency of memory access is remarkably low with respect to a memory existing outside of these access cluster groups. In such case, as in the example of FIG. 52, when the access is made by a network connecting the access cluster groups 90-1 to 90-4 through the sub processing module S-PM, the increase of the interconnect region can be suppressed.

Figure 53:
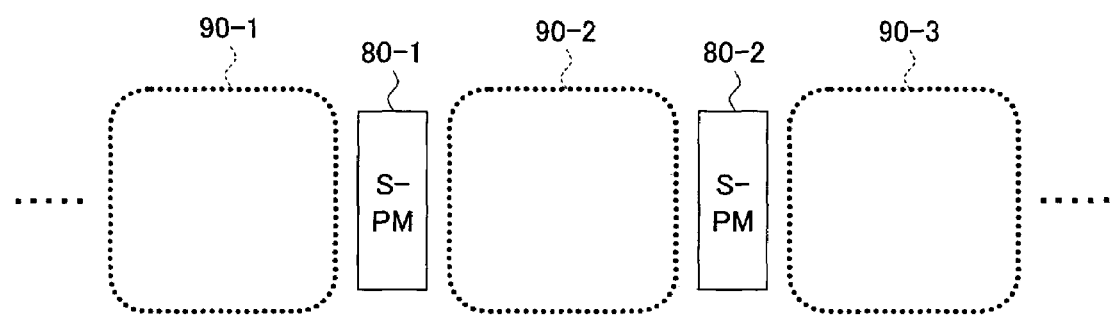
FIG. 53 is a diagram showing another example of a connection configuration among a plurality of access cluster groups through sub processing modules S-PM.

Further, as shown in FIG. 53, it is also possible to further connect access cluster groups by linking the access cluster groups 90-1, 90-2, and the sub processing modules 80-1 and 80-2 together in the case of the horizontal (X) direction (second direction).

Figure 54:
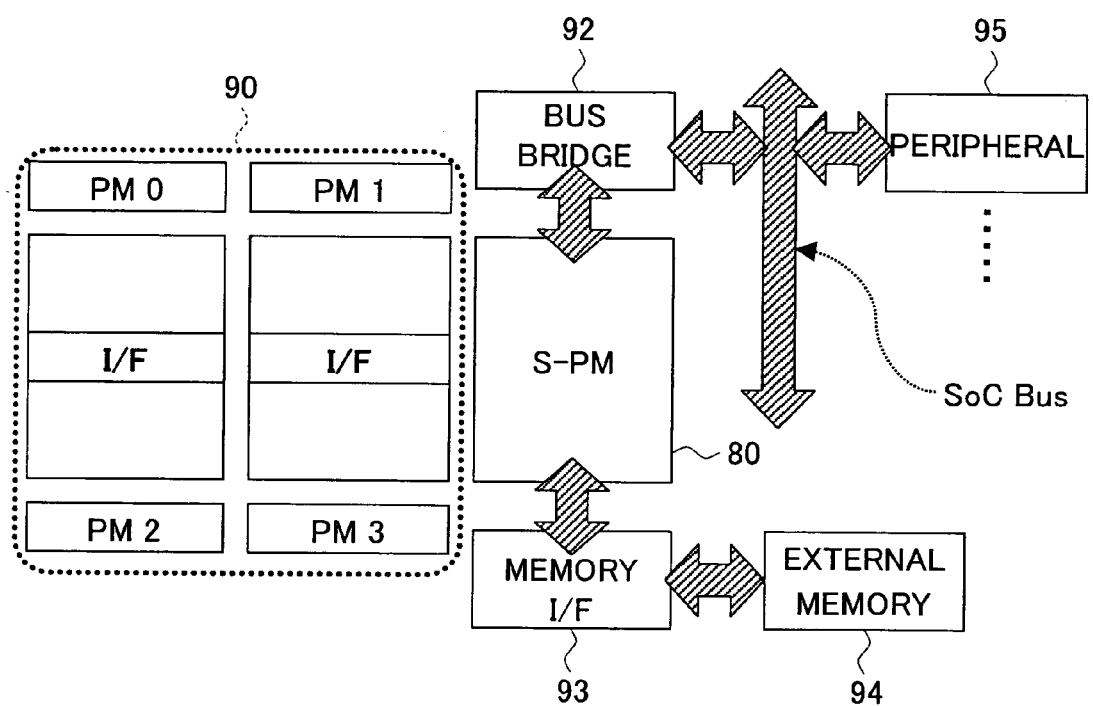
FIG. 54 is a diagram showing an example of the connection configuration between access cluster groups and an external memory or peripheral circuit through a sub processing module S-PM.

Further, as shown in FIG. 54, the sub processing module 80 (S-PM) can connect not only the access cluster groups 90, but can also connect with other buses through a bus bridge 92 and can also connect with an external memory I/F 93 to access an external memory 94. In this case, the memories in the access cluster groups, the peripheral circuit 95 linked with the bus bridge 92, and the external memory 94 can be arranged in one combined address space.

According to the second embodiment, in addition to the effects of the first embodiment, the transfer mode can be switched not only in the whole memory system, but also partially. By utilizing this, the data transfer between the system and the outside becomes possible without suspending the operation of the system. Further, when increasing the number of the access cluster groups, the interconnects increase, but by network connecting these with for sets of several access cluster groups, the increase of interconnects can be suppressed.

The shared memory device of the present embodiment can realize a high speed shared memory by connecting a plurality of memory macros mounted on an SOC by data lines peculiar to memories. Further, it can realize memory-memory transfer without going through a bus master.

Summarizing the effects of embodiments of the invention, according to embodiments of the present invention, the interconnects up to memories can be simplified, a reduction of performance due to increase in area and longer interconnects can be prevented, and an increase in the speed of memory access can be achieved.

It should be understood by those skilled in the art that various modifications, combinations, sub-combinations, and alterations may occur depending on design requirements and other factors insofar as they are within the scope of the appended claims or the equivalents thereof.

What we claim is:

1. A shared memory device comprising:
   at least one processing module including at least one input/output part;
   a first connected interconnect arranged in a first direction;
   a second connection interconnect arranged in a second direction substantially perpendicularly intersecting the first direction;
   at least two memory systems arranged in both sides of the first connection interconnect, and accessible by the processing module; wherein
   each memory system includes
   a memory macro including a plurality of memory banks arranged in the first direction,
   a memory interface arranged in the second direction, and wherein;
   the input/output part of the processing module, each memory interface and each memory bank in each memory macro are connected by the first and second connection interconnects, so as to shape in a matrix form above the plurality of memory macros.

2. A shared memory device as set forth in claim 1, wherein memory banks corresponding to the matrix arrangement of the plurality of memory macros are connected to each other by buses arranged in the second direction.

3. A shared memory device as set forth in claim 1, wherein the connection interconnects include command information interconnects and data interconnects laid in multiple layers.

4. A shared memory device as set forth in claim 3, wherein the data interconnects include write data interconnects and read data interconnects laid in multiple layers.

5. A shared memory device as set forth in claim 1, further comprising: a sub processing module arranged at least one side of the region of the plurality of memory macros in the second direction, the sub processing module being able to selectively access at least one of predetermined memory bank of the plurality of memory macros in the second direction.

6. A shared memory device comprising:
   a plurality of access clusters, wherein each access cluster includes at least one processing module including at least one input/output port;
   a plurality of memory systems accessible by the processing module;
   each memory system includes a memory macro including a plurality of memory banks, and a memory interface connected to the processing module and each memory bank; the memory interface is arranged at a position facing a position of arrangement of the processing module while sandwiching an arrangement region of the memory macro therebetween;
   memory macros of the plurality of memory systems are connected in parallel in a second direction, the second direction substantially perpendicularly intersecting a first direction, the first direction being a direction connecting the processing module and the memory interface; and
   the input/output port of the processing module, each memory interface, and each memory bank are connected by connection interconnects, the interconnect being arranged in the first direction and the second direction so as to shape in a matrix form above the arrangement region of the plurality of memory macros,
   the plurality of access clusters are arranged in parallel in the second direction, and
   memory banks corresponding to the matrix arrangement of the plurality of memory macros are connected to each other by buses arranged in the second direction.

7. A shared memory device as set forth in claim 6, wherein the connection interconnects include command information interconnects and data interconnects laid in multiple layers.

8. A shared memory device as set forth in claim 7, wherein the data interconnects include write data interconnects and read data interconnects laid in multiple layers.

9. A shared memory device as set forth in claim 6, further comprising: a sub processing module arranged at least one side of the region of the plurality of memory macros in the second direction, the sub processing module being able to selectively access at least one of predetermined memory bank of the plurality of memory macros in the second direction.

10. A shared memory device comprising:
a plurality of access clusters, wherein each access cluster includes at least one processing module including at least one input/output port;
a plurality of memory systems accessible by the processing module;
each memory system includes a memory macro including a plurality of memory banks, and a memory interface connected to the processing module and each memory bank;
the memory interface is arranged at a position facing a position of arrangement of the processing module while sandwiching an arrangement region of the memory macro therebetween;
memory macros of the plurality of memory systems are connected in parallel in a second direction, the second direction substantially perpendicularly intersecting a first direction, the first direction being a direction connecting the processing module and the memory interface; and
the input/output port of the processing module, each memory interface, and each memory bank are connected by connection interconnects, the interconnect being arranged in the first direction and the second direction so as to shape in a matrix form above the arrangement region of the plurality of memory macros,
the plurality of access clusters are symmetrically arranged in the first direction via the interface, and
memory interfaces arranged at corresponding positions are connected to each other.

11. A shared memory device as set forth in claim 10, wherein the memory systems of the plurality of access clusters share the memory interfaces.

12. A shared memory device as set forth in claim 11, wherein the shared memory interfaces include an arbitration portion for arbitrating access to another memory system.

13. A shared memory device as set forth in claim 11, wherein the connection interconnects include command information interconnects and data interconnects laid in multiple layers.

14. A shared memory device as set forth in claim 13, wherein the data interconnects include of write data interconnects and read data interconnects laid in multiple layers.

15. A shared memory device as set forth in claim 11, further comprising: a sub processing module arranged at least one side of the region of the plurality of memory macros in the second direction, the sub processing module being able to selectively
access at least one of predetermined memory bank of the plurality of memory macros in the second direction.

16. A shared memory device comprising:
a plurality of access clusters, wherein each access cluster includes at least one processing module including at least one input/output port;
a plurality of memory systems accessible by the processing module;
each memory system includes a memory macro including a plurality of memory banks, and the memory interface is arranged at a position facing a position of arrangement of the processing module while sandwiching arrangement region of the memory macro therebetween;
memory macros of the plurality of memory systems are connected in parallel in a second direction, the second direction substantially perpendicularly intersecting a first direction, the first direction being a direction connecting the processing module and the memory interface; and
the input/output port of the processing module, each memory interface, and each memory bank are connected by connection interconnects, the interconnect being arranged in the first direction and the second direction so as to shape in a matrix form above the arrangement region of the plurality of memory macros,
the plurality of access clusters are symmetrically arranged in the first direction via the interfaces,
memory interfaces arranged at corresponding positions are connected to each other,
remaining access clusters are arranged in parallel in the second direction, and
memory banks corresponding to the matrix arrangement of the plurality of memory macros are connected to each other by buses arranged in the second direction.

17. A shared memory device as set forth in claim 16, wherein memory systems of the plurality of symmetrically arranged access clusters share the memory interfaces.

18. A shared memory device as set forth in claim 17, wherein the shared memory interfaces include an arbitration portion for arbitrating access to another memory system.

19. A shared memory device as set forth in claim 17, wherein the connection interconnects include command information interconnects and data interconnects laid in multiple layers.

20. A shared memory device as set forth in claim 19, wherein the data interconnects include write data interconnects and read data interconnects laid in multiple layers.

21. A shared memory device as set forth in claim 17, further comprising: a sub processing module arranged at least one side of the region of the plurality of memory macros in the second direction, the sub processing module being able to selectively access at least one of predetermined memory bank of the plurality of memory macros in the second direction.

22. A shared memory device comprising:
a plurality of access cluster groups each including a plurality of access clusters, wherein the plurality of access cluster groups are connected via network interconnects, each access cluster of the plurality of access cluster groups includes at least one processing module including at least one input/output port;
a plurality of memory systems accessible by the processing module; each memory system includes a memory macro including a plurality of memory banks and a memory interface connected to the processing module and each memory bank;
the memory interface is arranged at a position facing a position of arrangement of the processing module while sandwiching an arrangement region of the memory macro therebetween;
memory macros of the plurality of memory systems are connected in parallel in a second direction, the second direction substantially perpendicularly intersecting a first direction, the first direction being a direction connecting the processing module and the memory interface; and
the input/output port of the processing module, each memory interface, and each memory bank are connected by connection interconnects, the interconnect being arranged in the first direction and the second direction so as to shape in a matrix form above the arrangement region of the plurality of memory macros, the plurality of access clusters are arranged in parallel in the second direction, and memory banks corresponding to the matrix arrangement of the plurality of memory macros are connected to each other by buses arranged in the second direction.

23. A shared memory device as set forth in claim 22, wherein each access cluster group comprises: a sub processing module arranged at least one side of the region of the plurality of memory macros in the second direction, the sub processing module being able to selectively access at least one of predetermined memory bank of the plurality of memory macros in the second direction, the sub processing modules of each access cluster group are connected by network connecting.

24. A shared memory device comprising:

a plurality of access cluster groups each including a plurality of access clusters, wherein the plurality of access cluster groups are connected via network interconnects, each access cluster of the plurality of access cluster groups includes at least one processing module including at least one input/output port;

a plurality of memory systems accessible by the processing module, each memory system includes a memory macro including a plurality of memory banks, and a memory interface connected to the processing module and each memory bank;

the memory interface is arranged at a position facing a position of arrangement of the processing module while sandwiching an arrangement region of the memory macro therebetween;

memory macros of the plurality of memory systems are connected in parallel in a second direction, the second direction substantially perpendicularly intersecting a first direction, the first direction being a direction connecting the processing module and the memory interface; and the input/output port of the processing module, each memory interface, and each memory bank are connected by connection interconnects, the interconnect being arranged in the first direction and the second direction so as to shape in a matrix form above the arrangement region of the plurality of memory macros, the plurality of access clusters are symmetrically arranged in the first direction via the interface, and memory interfaces arranged at corresponding positions are connected to each other.

25. A shared memory device as set forth in claim 24, wherein each access cluster group comprises: a sub processing module arranged at least one side of the region of the plurality of memory macros in the second direction, the sub processing module being able to selectively access at lease one of predetermined memory bank of the plurality of memory macros in the second direction, the sub processing modules of each access cluster group are connected by network connection.

26. A shared memory device comprising:

a plurality of access cluster groups each including a plurality of access clusters, wherein the plurality of access cluster groups are connected via network interconnects, each access cluster of the plurality of access cluster groups includes at least one processing module including at least one input/output port;

a plurality of memory systems accessible by the processing module; each memory system includes a memory macro including a plurality of memory banks, and a memory interface connected to the processing module and each memory bank;

the memory interface is arranged at a position facing a position of arrangement of the processing module while sandwiching an arrangement region of the memory macro therebetween;

memory macros of the plurality of memory systems are connected in parallel in a second direction, the second direction substantially perpendicularly intersecting a first direction, the first direction being a direction connecting the processing module and the memory interface; and the input/output port of the processing module, each memory interface, and each memory bank are connected by connection interconnects, the interconnect being arranged in the first direction and the second direction so as to shape in a matrix form above the arrangement region of the plurality of memory macros, the plurality of access clusters are symmetrically arranged in the first direction via the interface, memory interfaces arranged at corresponding positions are connected to each other, remaining access clusters are arranged in parallel in the second direction, and memory banks corresponding to the matrix arrangement of the plurality of memory macros are connected to each other by buses arranged in the second direction.

27. A shared memory device as set forth in claim 26, wherein each access cluster group comprises: a sub processing module arranged at least one side of the region of the plurality of memory macros in the second direction, the sub processing module being able to selectively access at lease one of predetermined memory bank of the plurality of memory macros in the second direction, the sub processing modules of each access cluster group are connected by network connection.

* * * * *